United States Patent
Yahagi et al.

(10) Patent No.: US 9,776,208 B2
(45) Date of Patent: Oct. 3, 2017

(54) BRUSH COMPOSITION, AND METHOD OF PRODUCING STRUCTURE CONTAINING PHASE-SEPARATED STRUCTURE

(71) Applicant: TOKYO OHKA KOGYO CO., LTD., Kawasaki-shi (JP)

(72) Inventors: Masahito Yahagi, Kawasaki (JP); Takaya Maehashi, Kawasaki (JP); Akiya Kawaue, Kawasaki (JP); Issei Suzuki, Kawasaki (JP); Tasuku Matsumiya, Kawasaki (JP); Tsuyoshi Kurosawa, Kawasaki (JP); Hitoshi Yamano, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/957,922

(22) Filed: Dec. 3, 2015

(65) Prior Publication Data
US 2016/0194751 A1 Jul. 7, 2016

(30) Foreign Application Priority Data

| Dec. 5, 2014 | (JP) | 2014-246812 |
| Dec. 5, 2014 | (JP) | 2014-247109 |
| Dec. 5, 2014 | (JP) | 2014-247174 |

(51) Int. Cl.
  *B05D 1/38* (2006.01)
  *B05D 7/00* (2006.01)
  (Continued)

(52) U.S. Cl.
  CPC ............. *B05D 1/38* (2013.01); *B05D 3/0254* (2013.01); *B05D 7/52* (2013.01); *C09D 153/00* (2013.01); *G03F 7/0002* (2013.01)

(58) Field of Classification Search
  CPC .......... B05D 1/38; B05D 3/0254; B05D 7/52; C09D 133/00; C09D 125/14;
  (Continued)

(56) References Cited

U.S. PATENT DOCUMENTS

| 5,945,517 A | 8/1999 | Nitta et al. |
| 6,153,733 A | 11/2000 | Yukawa et al. |

(Continued)

FOREIGN PATENT DOCUMENTS

| JP | A-09-208554 | 8/1997 |
| JP | A-11-035551 | 2/1999 |

(Continued)

OTHER PUBLICATIONS

Spatz et al., "Substrate-Induced Lateral Micro-Phase Separation of Diblock Copolymer," Adv. Mater. 1996, 8, No. 6, 513-517.*

(Continued)

*Primary Examiner* — William Phillip Fletcher, III
(74) *Attorney, Agent, or Firm* — Knobbe Martens Olson & Bear LLP

(57) ABSTRACT

A brush composition used for phase-separation of a layer containing a block copolymer having plural kinds of blocks bonded formed on a substrate, the brush composition including a resin component, the resin component having a structural unit (u1) represented by genera formula (u1-1), and having a hydroxy group on at least one terminal portion of the main chain thereof: in formula (u1-1), R represents a hydrogen atom, an alkyl group of 1 to 5 carbon atoms or a halogenated alkyl group of 1 to 5 carbon atoms; $R^1$ represents a halogen atom, or a linear, branched or cyclic hydrocarbon group of 1 to 20 carbon atoms optionally containing an oxygen atom, a halogen atom or a silicon atom, or a combination of the linear, branched or cyclic hydrocarbon group; and p represents an integer of 1 to 5.

(Continued)

[Chemical Formula 1]

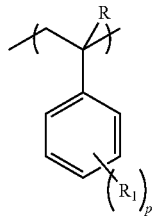

(u1-1)

16 Claims, 1 Drawing Sheet

(51) Int. Cl.
*C09D 153/00* (2006.01)
*B05D 3/02* (2006.01)
*G03F 7/00* (2006.01)

(58) Field of Classification Search
CPC .............. C09D 151/00; C09D 153/00; C23C 14/5806; G03F 7/0002
USPC ...................................................... 427/372.2
See application file for complete search history.

(56) References Cited

U.S. PATENT DOCUMENTS

| | | | | |
|---|---|---|---|---|
| 2010/0323096 | A1* | 12/2010 | Sills ................... | B81C 1/00031 427/58 |
| 2011/0272381 | A1* | 11/2011 | Millward ............ | B81C 1/00031 216/37 |
| 2016/0155743 | A1* | 6/2016 | Kim .................. | H01L 21/76816 438/702 |

FOREIGN PATENT DOCUMENTS

| | | |
|---|---|---|
| JP | A-11-035552 | 2/1999 |
| JP | A-11-035573 | 2/1999 |
| JP | A-11-322707 | 11/1999 |
| JP | A-2008-036491 | 2/2008 |
| WO | WO 2004/074242 A2 | 9/2004 |

OTHER PUBLICATIONS

Dockenmuller et al., "Covalent Stabilization of Nanostructures: Robust Block Copolymer Templates from Novel Thermoreactive Systems," Journal of Polymer Science: Part A: Polymer Chemsitry, vol. 43, 1028-1037 (2005).*
Ji et al., "Preparation of Neutral Wetting Brushes for Block Copolymer Films from Homopolymer Blends," Adv. Mater. 2008, 20, 3054-3060.*
Hinsberg, et al.; "Self-Assembling Materials for Lithographic Patterning: Overview, Status and Moving Forward" Proceedings of SPIE, vol. 7637, pp. 76370G-1-76370G-11 (2010).

* cited by examiner

BRUSH COMPOSITION, AND METHOD OF PRODUCING STRUCTURE CONTAINING PHASE-SEPARATED STRUCTURE

TECHNICAL FIELD

The present invention relates to a brush composition, and a method of producing a structure containing a phase-separated structure.

Priority is claimed on Japanese Patent Application Nos. 2014-246812, 2014-247109 and 2014-247174, filed Dec. 5, 2014, the contents of which are incorporated herein by reference.

DESCRIPTION OF RELATED ART

Recently, as further miniaturization of large scale integrated circuits (LSI) proceeds, a technology for processing a more delicate structure is demanded. In response to such demand, technical developments have been conducted on forming a fine structure using a phase-separated structure formed by self-assembly of block polymers having mutually incompatible blocks bonded together.

For using a phase separation of a block copolymer, it is necessary to form a self-organized nano structure by a microphase separation only in specific regions, and arrange the nano structure in a desired direction.

For realizing position control and orientational control of such self-assembled structure, methods such as graphoepitaxy to control phase-separated pattern by a guide pattern and chemical epitaxy to control phase-separated pattern by difference in the chemical state of the substrate are proposed (see, for example, Non-Patent Document 1).

As a method of phase-separating a block copolymer to form a fine pattern, for example, there is disclosed a method in which an intermediate layer having a surface free energy of a mean value of the surface free energy of 2 block chains is formed on a substrate, such that the face of the substrate contacting the block copolymer has a surface free energy of a mean value of the surface free energy of 2 block chains (for example, see Patent Literature 1). By forming such an intermediate layer on the substrate, the face of the substrate contacting the block copolymer has a surface free energy of a mean value of the surface free energy of 2 block chains.

In this manner, patterns of various shapes with smaller sizes can be formed as compared to conventional lithography properties.

DOCUMENTS OF RELATED ART

Patent Literature

[Patent Document 1] Japanese Unexamined Patent Application, First Publication No. 2008-36491

Non-Patent Documents

[Non-Patent Document 1] Proceedings of SPIE (U.S.), vol. 7637, pp. 76370G-1 (2010)

SUMMARY OF THE INVENTION

However, in the method disclosed in Patent Literature 1, it was necessary to select a neutralization layer material which exhibit a surface free energy of predetermined value, depending on the kind of block copolymer used, so as to control the surface free energy of the neutralization layer. Therefore, there were demands for brush composition which can be used conveniently.

Further, conventional neutralization layer materials (brush compositions) had problems that it was difficult to control the surface state of the neutralization layer formed, and the phase separation of the block copolymer is likely to become poor.

The present invention takes the above circumstances into consideration, with an object of providing a brush composition which can improve the phase-separation performance of a block copolymer and can be conveniently used; and a method of producing a structure containing a phase-separated structure using the brush composition.

As a result of the studies of the present inventors, the present inventors have found that, when a fine structure is formed by directed self-assembly (DSA) of a block copolymer, by improving the adhesion of the substrate and the layer containing a block copolymer formed on the substrate, the phase-separation of the block copolymer is promoted. As a result of further studies, the present inventors have found that, by adopting a specific resin component in the brush composition, the surface of the brush layer can be controlled to be at a highly hydrophobic state, so as to improve the adhesiveness. The present invention has been completed based on this finding.

Specifically, a first aspect of the present invention is a brush composition used for phase-separation of a layer containing a block copolymer having plural kinds of blocks bonded formed on a substrate, the brush composition including a resin component, the resin component having a structural unit (u1) represented by general formula (u1-1) shown below, and having a hydroxy group on at least one terminal portion of the main chain thereof.

[Chemical Formula 1]

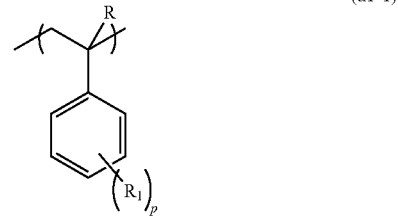

(u1-1)

In the formula, R represents a hydrogen atom, an alkyl group of 1 to 5 carbon atoms or a halogenated alkyl group of 1 to 5 carbon atoms; $R^1$ represents a halogen atom, or a linear, branched or cyclic hydrocarbon group of 1 to 20 carbon atoms optionally containing an oxygen atom, a halogen atom or a silicon atom, or a combination of the linear, branched or cyclic hydrocarbon group; and p represents an integer of 1 to 5.

In the first aspect of the present invention, in general formula (u1-1), $R^1$ preferably represents an alkyl group of 1 to 6 carbon atoms, a halogenated alkyl group of 1 to 6 carbon atoms or an alkoxy group of 1 to 6 carbon atoms.

In the first aspect of the present invention, the resin component preferably contains a polymeric compound having the structural unit (u1), and having a hydroxy group on at least one terminal portion of the main chain thereof.

A second aspect of the present invention is a method of producing a structure containing a phase-separated structure, the method including: a step of applying the brush composition of the first aspect to form a brush layer; a step of forming a layer containing a block copolymer on the brush layer, the block copolymer having a plural kinds of blocks bonded together; and a step of phase-separating the layer containing the block copolymer.

A third aspect of the present invention is a brush composition used for phase-separation of a layer containing a block copolymer formed on a substrate, the block copolymer having a hydrophobic polymer block (b11) and a hydrophilic polymer block (b21) bonded together, the brush composition including a resin component, the resin component having a structural unit of a hydrophobic polymer block (b12) or a structural unit of a hydrophilic polymer block (b22), and having a carboxy group on at least one terminal portion of the main chain thereof.

A fourth aspect of the present invention is a method of producing a structure containing a phase-separated structure, the method including: a step of applying the brush composition of the third aspect to form a brush layer; a step of forming a layer containing a block copolymer on the brush layer, the block copolymer having a hydrophobic polymer block (b11) and a hydrophilic polymer block (b21) bonded together; and a step of phase-separating the layer containing the block copolymer.

A fifth aspect of the present invention is a brush composition used for phase-separation of a layer containing a block copolymer formed on a substrate, the block copolymer having a hydrophobic polymer block (b11) and a hydrophilic polymer block (b21) bonded together, the brush composition including a resin component, the resin component having a structural unit of a hydrophobic polymer block (b12) or a structural unit of a hydrophilic polymer (b22), and having at least 2 hydroxy groups on at least one terminal portion of the main chain thereof.

A sixth aspect of the present invention is a method of producing a structure containing a phase-separated structure, the method including: a step of applying the brush composition of the third aspect to form a brush layer; a step of forming a layer containing a block copolymer on the brush layer, the block copolymer having a hydrophobic polymer block (b11) and a hydrophilic polymer block (b21) bonded together; and a step of phase-separating the layer containing the block copolymer.

In the present description and claims, the term "aliphatic" is a relative concept used in relation to the term "aromatic", and defines a group or compound that has no aromaticity.

The ter "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A halogenated alkyl group is an alkyl group in which part or all of the hydrogen atoms thereof have been substituted with halogen atom. Examples of the halogen atom include a fluorine atom, a chlorine atom, a bromine atom and an iodine atom.

A "fluorinated alkyl group" is a group in which part or all of the hydrogen atoms within an alkyl group have been substituted with a fluorine atom.

The term "structural unit" refers to a monomer unit that contributes to the formation of a polymeric compound (resin, polymer, copolymer).

The term "exposure" is used as a general concept that includes irradiation with any form of radiation.

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, a acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from styrene or a styrene derivative" refers to a structural unit that is formed by the cleavage of the ethylenic double bond of styrene or a styrene derivative.

The term "styrene derivative" includes compounds in which the hydrogen atom at the α-position of styrene has been substituted with another substituent such as an alkyl group or a halogenated alkyl group; and derivatives thereof. Examples of the derivatives thereof include styrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

The alkyl group which substitutes the hydrogen atom bonded to the carbon atom on the α-position is preferably a linear or branched alkyl group, and specific examples include a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

A "period of a block copolymer" refers to a period of a phase structure observed when a phase-separated structure is formed, and is a sum of the lengths of the phases which are mutually incompatible. Specifically, in the case of forming a cylinder structure which has a phase-separated structure perpendicular to a surface of a substrate, the period of the block copolymer is the center distance (pitch) of two mutually adjacent cylinder structures.

The period of a block polymer is determined by intrinsic polymerization properties such as the polymerization degree N and the Flory-Huggins interaction parameter $\chi$. Specifically, the repulsive interaction between different block components of the block copolymer becomes larger as the $\chi N$ becomes larger. Therefore, when $\chi N>10$ (hereafter, referred to as "strong segregation limit"), there is a strong tendency for the phase separation to occur between different blocks in the block copolymer. At the strong segregation limit, the period of the block copolymer is approximately $N^{2/3}\chi^{1/6}$. That is, the period of the block copolymer is in proportion to the polymerization degree N which correlates with the molecular weight Mn and molecular weight ratio between different blocks. Therefore, by adjusting the composition and the total molecular weight of the block copolymer to be used, the period of the block copolymer can be adjusted.

By the brush composition of the present invention, the phase-separation performance of the block copolymer can be enhanced, and the brush composition can be conveniently used.

By the method of producing a structure containing a phase-separated structure according to the present invention, the phase-separation performance of the block copolymer can be enhanced, and a fine structure with a good shape can be formed, as compared to conventional lithography techniques.

DETAILED DESCRIPTION OF THE INVENTION

First Aspect: Brush Composition

Figure 1:
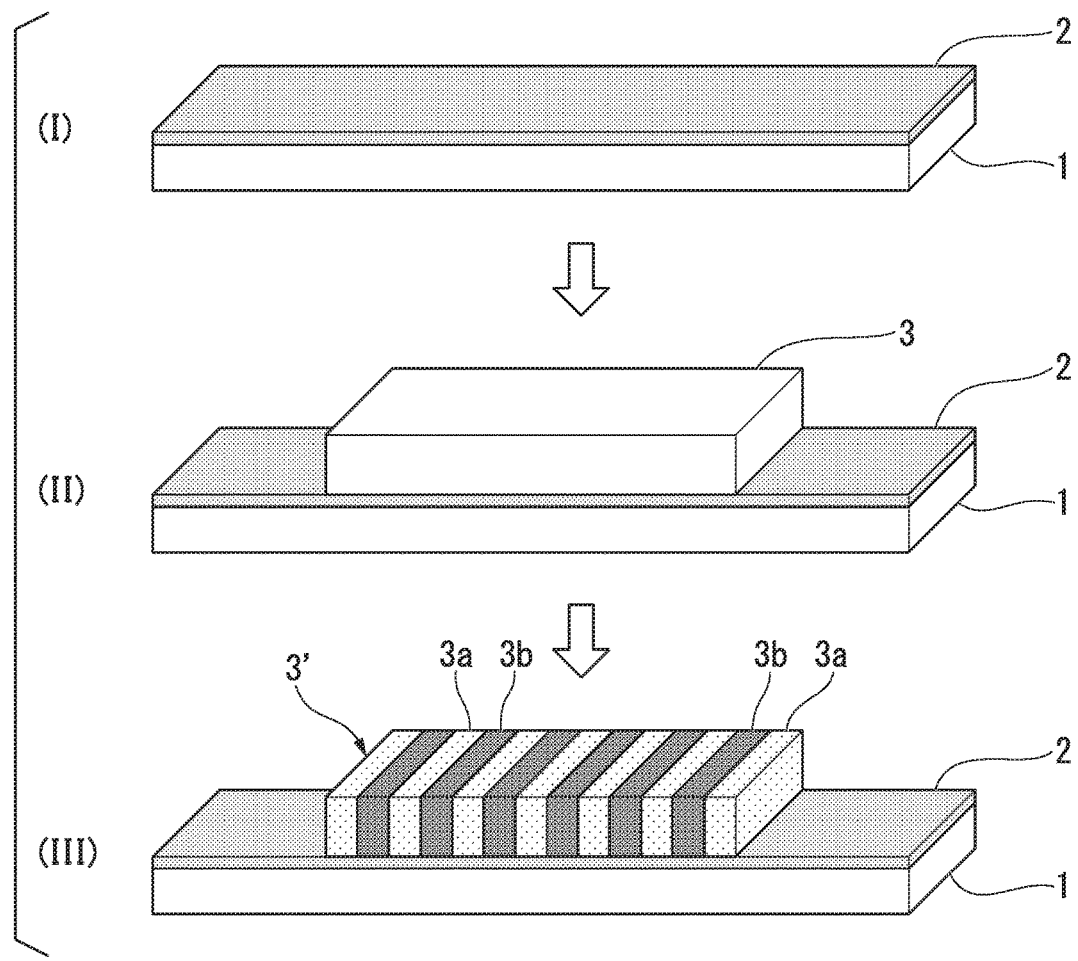
FIG. 1 is a schematic diagram showing an example of one embodiment of the method of forming a structure containing a phase-separated structure according to the present invention.

The brush composition according to a first aspect of the present invention is usable in phase separation of a layer formed on a substrate, the layer containing a block copolymer having a plurality of blocks bonded together.

The brush composition is useful as a surface modifier for a substrate in the formation of a fine structure by directed self-assembly (DSA) of a block copolymer. By applying the brush composition on the substrate to form a brush layer, the substrate surface exhibits a high affinity for one of the blocks constituting block copolymer.

The brush composition contains a resin component (hereafter, referred to as "resin component (A)" or "component (A)").

<<Resin Component (A)>>

The resin component (A) has a structural unit (u1) represented by general formula (u1-1) shown below, and having a hydroxy group on at least one terminal portion of the main chain thereof.

[Chemical Formula 2]

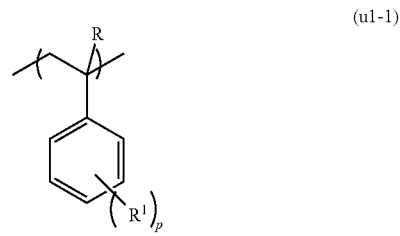

(u1-1)

In the formula, R represents a hydrogen atom, an alkyl group of 1 to 5 carbon atoms or a halogenated alkyl group of 1 to 5 carbon atoms; $R^1$ represents a halogen atom, or a linear, branched or cyclic hydrocarbon group of 1 to 20 carbon atoms optionally containing an oxygen atom, a halogen atom or a silicon atom, or a combination of the linear, branched or cyclic hydrocarbon group; and p represents an integer of 1 to 5.

In general formula (u1-1), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group of 1 to 5 carbon atoms is preferable, and specific examples thereof include a methyl group, an ethyl group, an n-propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable, a hydrogen atom or a methyl group is still more preferable, and a hydrogen atom is most preferable.

In formula (u1-1), $R^1$ represents a halogen atom, or a linear, branched or cyclic hydrocarbon group of 1 to 20 carbon atoms optionally containing an oxygen atom, a halogen atom or a silicon atom, or a combination of the linear, branched or cyclic hydrocarbon group.

In the structural unit (u1), by virtue of the benzene ring having $R^1$ bonded thereto as a substituent, the surface free energy of the brush layer is adjusted, and the layer containing a block copolymer to be formed on the brush layer can be satisfactorily phase-separated into a perpendicular cylinder pattern or the like.

Examples of the halogen atom for $R^1$ include a fluorine atom, chlorine atom, bromine atom and iodine atom, and a fluorine atom, a chlorine atom or a bromine atom is preferable.

The hydrocarbon group for $R^1$ has 1 to 20 carbon atoms. In addition, the hydrocarbon group for $R^1$ is a linear, branched or cyclic hydrocarbon group optionally containing an oxygen atom, a halogen atom or a silicon atom, or a combination of the linear, branched or cyclic hydrocarbon group.

Examples of the hydrocarbon group for $R^1$ include a linear, branched or cyclic alkyl group, or an aryl group.

The alkyl group as the hydrocarbon group for $R^1$ preferably has 1 to 10 carbon atoms, more preferably 1 to 8 carbon atoms, and still more preferably 1 to 6 carbon atoms.

The alkyl group for $R^1$ may be a partially or fully halogenated alkyl group (halogenated alkyl group), or an alkyl group in which a carbon atom constituting the alkyl group has been replaced by a silicon atom or an oxygen atom, such as an alkylsilyl group, an alkylsilyloxy group or an alkoxy group.

The "partially halogenated alkyl group" refers to an alkyl group in which part of the hydrogen atoms bonded to the alkyl group are substituted with halogen atom(s) and the "fully halogenated alkyl group" refers to an alkyl group in which all of the hydrogen atoms bonded the alkyl group are substituted with halogen atoms. Examples of the halogen atom include a fluorine atom, chlorine atom bromine atom and iodine atom, a fluorine atom, a chlorine atom or a bromine atom is preferable, and a fluorine atom is more preferable (that is, a fluorinated alkyl group is preferable).

As the alkylsilyl group for $R^1$, a trialkylsilyl group or a trialkylsilylalkyl group is preferable, and preferable examples thereof include a trimethylsilyl group, a trimethylsilylmethyl group, a trimethylsilylethyl group and a trimethylsilyl-n-propyl group.

As the alkylsilyloxy group for $R^1$, a trialkylsilyloxy group or a trialkylsilyloxyalkyl group is preferable, and preferable examples thereof include a trimethylsilyloxy group, a trimethylsilyloxymethyl group, a trimethylsilyloxyethyl group and a trimethylsilyloxy-n-propyl group.

The alkoxy group for $R^1$ preferably has 1 to 10 carbon atoms, more preferably 1 to 8 carbon atoms, and still more preferably 1 to 6 carbon atoms.

The aryl group as the hydrocarbon group for $R^1$ has 4 to 20 carbon atoms, preferably 4 to 10 carbon atom, and more preferably 6 to 10 carbon atoms.

Among these examples, as $R^1$, a linear, branched or cyclic hydrocarbon group of 1 to 20 carbon atoms optionally containing an oxygen atom, a halogen atom or a silicon atom, or a combination of the linear, branched or cyclic hydrocarbon group is preferable in that a layer containing a block copolymer to be formed on the brush layer can be satisfactorily phase-separated.

Among these, an alkyl group of 1 to 20 carbon atoms optionally containing an oxygen atom or a halogen atom is preferable, an alkyl group of 1 to 6 carbon atoms, a halogenated alkyl group of 1 to 6 carbon atoms or an alkoxy group of 1 to 6 carbon atoms is more preferable, and an alkyl group of 1 to 6 carbon atoms is most preferable.

The alkyl group for $R^1$ preferably has 1 to 6 carbon atoms, more preferably 3 to 6 carbon atoms, still more preferably 3 or 4 carbon atoms, and most preferably 4 carbon atoms. As the alkyl group for $R^1$, a linear alkyl group or a branched alkyl group is preferable, and preferable examples thereof include a methyl group, an ethyl group, an n-propyl group, an isopropyl group, an n-butyl group, an isobutyl group and a tert-butyl group, more preferably an n-propyl group, an isopropyl group, an n-butyl group, an isobutyl group or a tert-butyl group, still more preferably an n-butyl group, an isobutyl group or a tert-butyl group, and most preferably a tert-butyl group.

Examples of the halogenated alkyl group for $R^1$ include a group in which part or all of the hydrogen atoms of the alkyl group for $R^1$ have been substituted with halogen. As the halogen atom, a fluorine atom is most preferable. The halogenated alkyl group for $R^1$ preferably has 1 to 6 carbon atoms, more preferably 3 to 6 carbon atoms, and still more preferably 3 or 4 carbon atoms.

The alkoxy group for $R^1$ preferably has 1 to 6 carbon atoms, more preferably 1 to 4 carbon atoms, and most preferably 2 carbon atoms. As the alkoxy group for $R^1$, a linear alkoxy group or a branched alkoxy group is preferable, and preferable examples thereof include a methoxy group, an ethoxy group, an isopropoxy group and a t-butoxy group, and an ethoxy group is most preferable.

In formula (u1-1), p is an integer of 1 to 5, preferably an integer of 1 to 3, more preferably 1 or 2, and most preferably 1.

In formula (u1-1), the bonding position of $R^1$ on the benzene ring is preferably the para position in that the phase-separation performance of the layer containing a block copolymer is further enhanced.

Specific examples of the structural unit (u1) are shown below. In the formula, $R^\alpha$ represents a hydrogen atom or a methyl group.

[Chemical Formula 3]

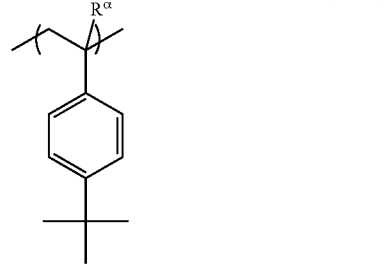

(u1-1-1)

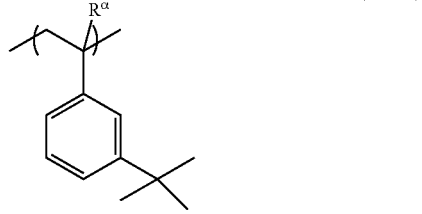

(u1-1-2)

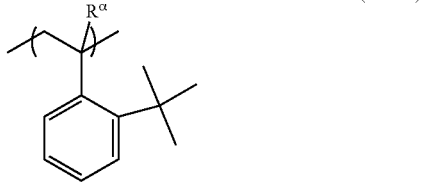

(u1-1-3)

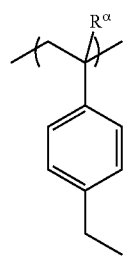 (u1-1-4)
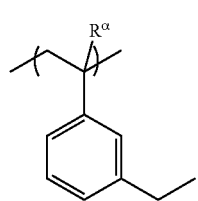 (u1-1-5)
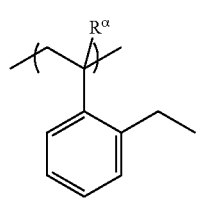 (u1-1-6)
[Chemical Formula 4]
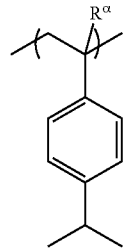 (u1-1-7)
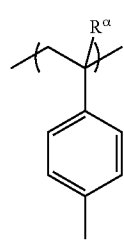 (u1-1-8)
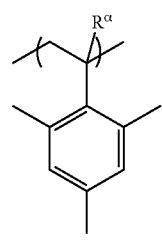 (u1-1-9)
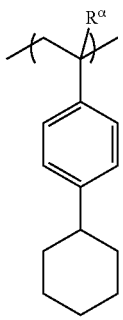 (u1-1-10)
[Chemical Formula 5]
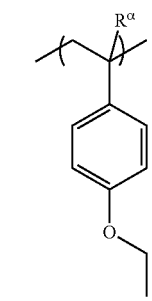 (u1-1-11)
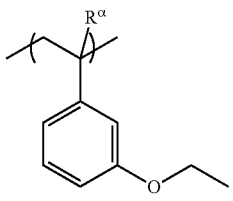 (u1-1-12)
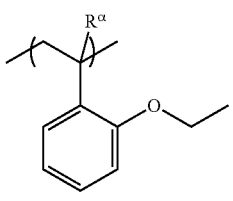 (u1-1-13)
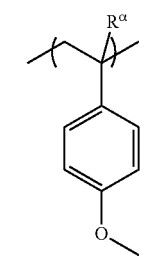 (u1-1-14)
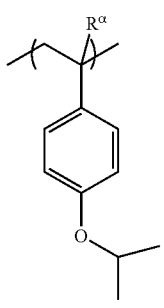 (u1-1-15)

(u1-1-16)

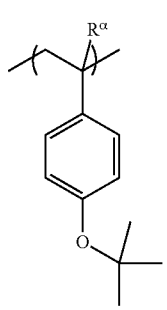

[Chemical Formula 6]

(u1-1-17)

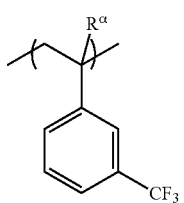

(u1-1-18)

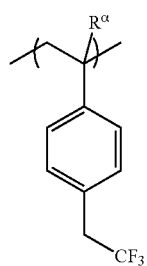

(u1-1-19)

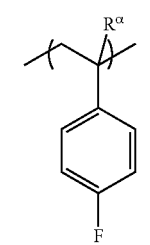

(u1-1-20)

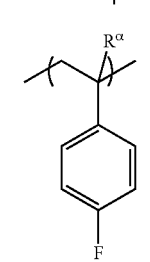

(u1-1-21)

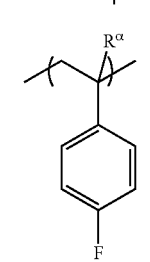

Among the above, examples, as the structural unit (u1), at least one member selected from the group consisting of structural units represented by chemical formulae (u1-1-1) to (u1-1-21) is preferable, at least one member selected from the group consisting of structural units represented by chemical formulae (u1-1-1) to (u1-1-13) is more preferable, at least one member selected from the group consisting of structural units represented by chemical formulae (u1-1-1) to (u1-1-10) is still more preferable, at least one member selected from the group consisting of structural units represented by chemical formulae (u1-1-1) to (u1-1-6) is still more preferable, and at least one member selected from the group consisting of structural units represented by chemical formulae (u1-1-1) to (u1-1-3) is most preferable.

As the structural unit (u1) contained in the component (A), 1 kind of structural unit may be used, or 2 or more kinds of structural units may be used in combination.

In the component (A), the amount of the structural unit (u1) based on the combined total of all structural units constituting the component (A) is preferably 25 mol % or more, more preferably 50 mol % or more, and still more preferably 75 to 100 mol %.

When the amount of the structural unit (u1) is at least as large as the lower limit of the above-mentioned range, the surface of the brush layer becomes more stable, and the layer containing a block copolymer to be formed on the brush layer can be satisfactorily phase-separated.

The hydroxy group contained in the component (A) is bonded to at least one terminal portion of a main chain of at least one polymeric compound contained in the component (A).

Preferable examples of the component (A) include a polymeric compound (hereafter, referred to as "component (A1)") having a structural unit (u1) and a hydroxy group on at least one terminal portion of the main chain thereof.

[Component (A1)]

The component (A1) is a polymeric compound having a structural unit (u1) and a hydroxy group on at least one terminal portion of the main chain thereof (main-chain terminal portion).

In the component (A1), the amount of the structural unit (u1) based on the combined total of all structural units constituting the component (A1) is preferably 25 mol % or more, more preferably 50 mol % or more, and still more preferably 75 to 100 mol %.

When the amount of the structural unit (u1) is at least as large as the lower limit of the above-mentioned range, the surface of the brush layer becomes more stable, and the layer containing a block copolymer to be formed on the brush layer can be satisfactorily phase-separated.

The component (A1) has a hydroxy group on at least one main-chain terminal portion.

In terms of further enhancing the phase-separation performance of the layer containing a block copolymer to be formed on the brush layer, the main-chain terminal preferably has 1 to 3 hydroxy groups, more preferably 1 or 2 hydroxy groups, and most preferably 1 hydroxy group.

Specific examples of the main-chain terminal portion having a hydroxy group are shown below. In the chemical formulae, "*" represents a valence bond.

[Chemical Formula 7]

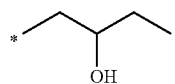
(mc-1)

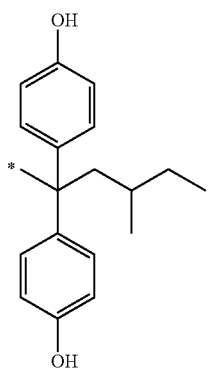
(mc-2)

Optional Structural Unit (Structural Unit (u2))

The component (A1) may have a structural unit other than structural unit (u1) (structural unit (u2)).

Examples of the structural unit (u2) include a structural unit derived from styrene; and a structural unit derived from acrylic acid or an ester thereof which may have the hydrogen atom bonded to the carbon atom on the α-position substituted with a substituent and may have a hydroxy group (preferably 1 to 3 hydroxy groups) on the side-chain terminal portion.

Examples of the substituent which substitutes the hydrogen atom bonded to the carbon atom on the α-position include an alkyl group of 1 to 5 carbon atoms, and a halogenated alkyl group of 1 to 5 carbon atoms.

Specific examples of the structural unit (u2) are shown below. In the formula, $R^\alpha$ represents a hydrogen atom or a methyl group.

[Chemical Formula 8]

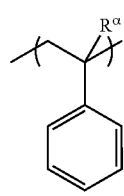
(u2-1)

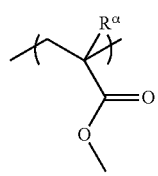
(u2-2)

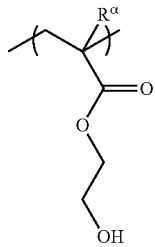
(u2-3)

Among the above examples, as the component (A1), in terms of further enhancing the phase-separation performance of the layer containing a block copolymer to be formed on the brush layer, a polymeric compound having a structural unit (u1) and a hydroxy group on just one terminal portion of the main chain thereof is preferable, and a polymeric compound having a structural unit (u1) and a hydroxy group bonded to the main chain thereof is most preferable.

Preferable examples of the component (A1) include a polymeric compound represented by general formula (A1-1) shown below. In the chemical formula, "x" represents the repeating number of the structural unit (the same applies hereafter).

[Chemical Formula 9]

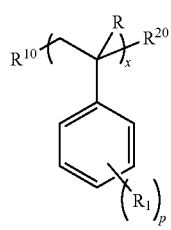
(A1-1)

In the formula, R represents a hydrogen atom, an alkyl group of 1 to 5 carbon atoms or a halogenated alkyl group of 1 to 5 carbon atoms; $R^{10}$ and $R^{20}$ each independently represents a hydrogen atom, a hydrocarbon group of 1 to 5 carbon atoms, or a hydrocarbon group of 1 to 5 carbon atoms having a hydroxy group; provided that at least one of $R^{10}$ and $R^{20}$ represents a hydrocarbon group of 1 to 5 carbon atoms having a hydroxy group; $R^1$ and p are the same as defined for $R^1$ and p in formula (u1-1) above.

In formula (A1-1), R represents a hydrogen atom, an alkyl group of 1 to 5 carbon atoms or a halogenated alkyl group of 1 to 5 carbon atoms. In formula (A1-1), R is the same as defined for R in formula (u1-1) above.

In formula (A1-1), the hydrocarbon group for $R^{10}$ and $R^{20}$ may be either an aliphatic hydrocarbon group or an aromatic hydrocarbon group.

The aliphatic hydrocarbon group as the hydrocarbon group for $R^{10}$ and $R^{20}$ may be either saturated or unsaturated, and preferably saturated. Examples of the aliphatic hydrocarbon group include a linear or branched aliphatic hydrocarbon group, and an aliphatic hydrocarbon group containing a ring in the structure thereof. Among these examples, a linear or branched aliphatic hydrocarbon group is preferable. Among these, a linear or branched alkyl group is preferable, and a linear or branched alkyl group of 1 to 5 carbon atoms is more preferable.

The aromatic hydrocarbon group for $R^{10}$ and $R^{20}$ is a hydrocarbon group having an aromatic ring. The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20, still more preferably 6 to 15, and most preferably 6 to 12. Examples of the aromatic ring include benzene and naphthalene. Examples of the aromatic hydrocarbon group for $R^{10}$ and $R^{20}$ include a group in which 1 or more hydrogen atoms have been removed from the above aromatic ring; a group in which 1 or more hydrogen atoms have been removed from an aromatic group containing 2 or more aromatic rings (such as biphenyl or fluorene); a group in which 1 hydrogen atom of the above aromatic ring or the above aromatic compound has been substituted with an alkylene group (an arylalkyl group such as a benzyl group, a phenethyl group, a 1-naphthylmethyl group, a 2-naphthylmethyl group a 1-naphthylethyl group, or a 2-naphthylethyl group); and a group in which 1 or more hydrogen atoms of the aforementioned linear or branched alkyl group have been substituted with an aromatic ring. The alkylene group which is bonded to the aforementioned aromatic ring or aromatic compound preferably has 1 to 4 carbon atoms, more preferably 1 or 2 carbon atoms, and most preferably 1 carbon atom.

In terms of further enhancing the phase-separation performance of the layer containing a block copolymer to be formed on the brush layer, in formula (A1-1), the hydrocarbon group for at least one of $R^{10}$ and $R^{20}$ preferably has 1 to 3 hydroxy groups, more preferably 1 or 2 hydroxy groups, and most preferably 1 hydroxy group.

Specific examples of the component (A1) are shown below. In the formula, $R^\alpha$ represents a hydrogen atom or a methyl group.

In chemical formula (A1-0-1), the plurality of $R^\alpha$ may be the same or different from each other. In chemical formula (A1-1-2), $R^{21}$ represents a hydrogen atom or a hydrocarbon group of 1 to 5 carbon atoms.

[Chemical Formula 10]

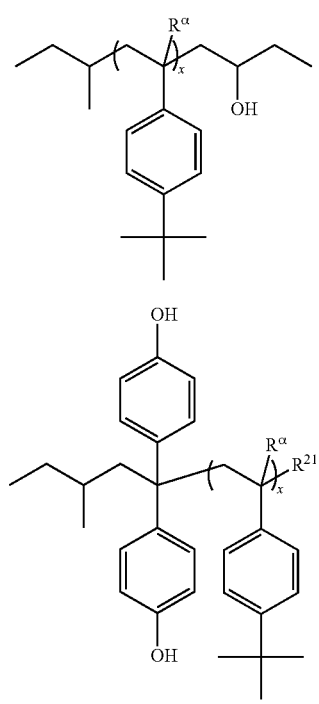

[Chemical Formula 11]

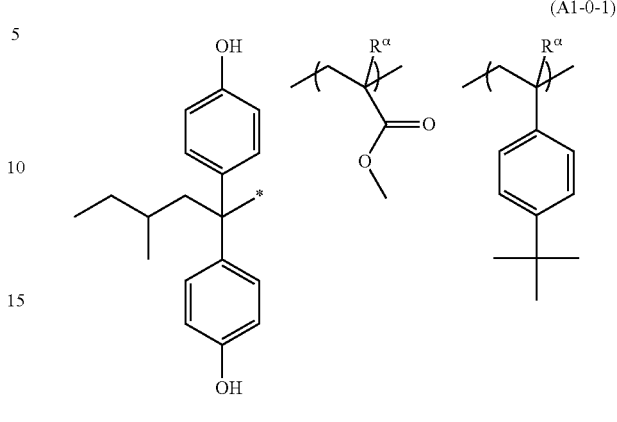

Among the above examples, as the component (A1), at least one member selected from polymeric compounds represented by chemical formulae (A1-1-1), (A1-1-2) and (A1-0-1) is preferable, at least one member selected from the group consisting of polymeric compounds represented by chemical formulae (A1-1-1) and (A1-1-2) is more preferable, and a polymeric compounds represented by chemical formula (A1-1-1) is still more preferable.

In the brush composition of the present invention, as the component (A), 1 kind of polymeric compound may be used, or 2 or more kinds of polymeric compounds may be used in combination.

In terms of further enhancing the phase-separation performance of the layer containing a block copolymer to be formed on the brush layer, the component (A) preferably contains the aforementioned component (A1).

In the component (A), the amount of the component (A1) is preferably 15% by weight or more, more preferably 50% by weight or more, and may be even 100% by weight. When the amount of the component (A1) is at least as large as the lower limit of the above range, the layer containing a block copolymer can be satisfactorily phase-separated, regardless of the kind of the substrate.

The component (A) may contain a polymeric compound other than the component (A1) (hereafter, referred to as "component (A2)"), as long as the component (A) has a structural unit (u1) and a hydroxy group on at least one terminal portion of the main chain thereof.

Specific examples of the component (A2) are shown below. In the formula, $R^\alpha$ represents a hydrogen atom or a methyl group.

In chemical formula (A2-3), the plurality of $R^\alpha$ may be the same or different from each other.

In chemical formula (A2-4), the plurality of $R^\alpha$ may be the same or different from each other.

In chemical formula (A2-5), the plurality of $R^\alpha$ may be the same or different from each other.

In chemical formula (A2-2), $R^{22}$ represents a hydrogen atom or a hydrocarbon group of 1 to 5 carbon atoms.

[Chemical Formula 12]

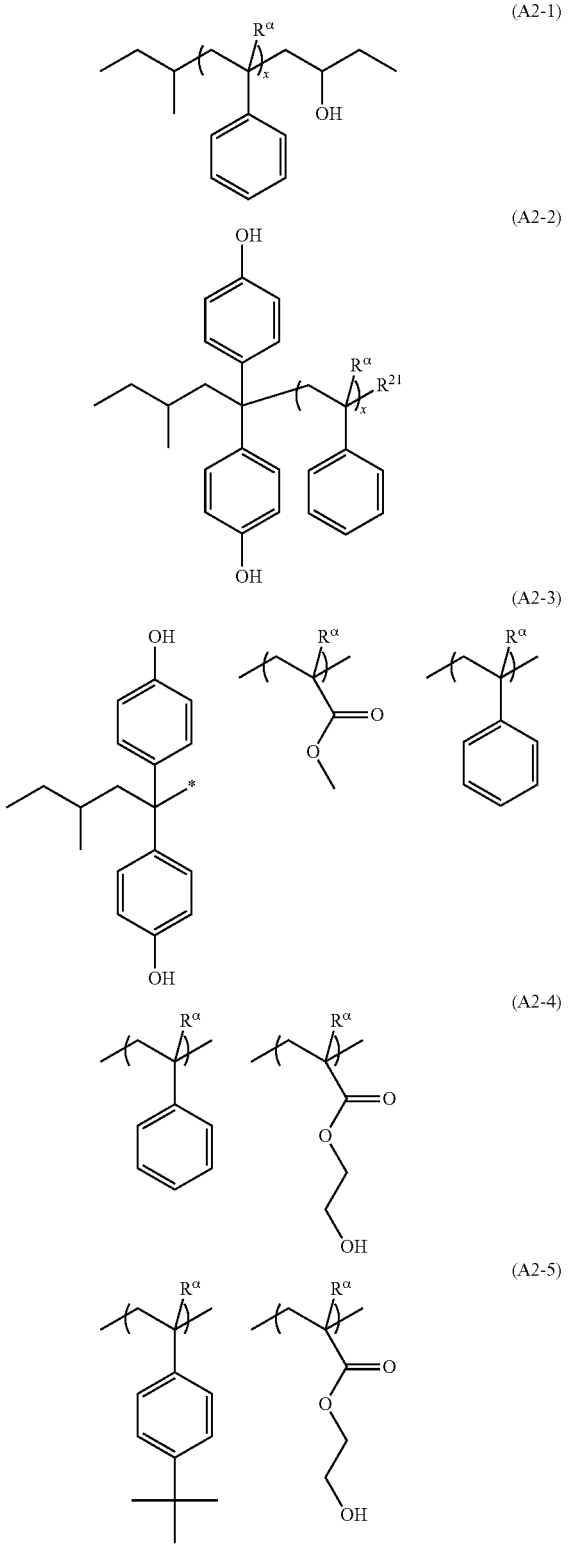

Among the above examples, as the component (A2), at least one member selected from polymeric compounds represented by chemical formulae (A2-1) to (A2-5) is preferable, at least one member selected from the group consisting of polymeric compounds represented by chemical formulae (A2-1) and (A2-2) is more preferable, and a polymeric compounds represented by chemical formula (A2-1) is still more preferable.

In terms of further enhancing the phase-separation performance of the layer containing a block copolymer to be formed on the brush layer, it is also preferable to use the component (A1) in combination with the component (A2).

When the component (A1) is used in combination with the component (A2), the weight ratio component (A1)/component (A2) is preferably 10/90 to 90/10, and more preferably 15/85 to 85/15. When the ratio (weight ratio) is within the above range, the surface of the brush layer becomes more stable, and the layer containing a block copolymer to be formed on the brush layer can be satisfactorily phase-separated.

The weight average molecular weight (Mw) (the polystyrene equivalent value determined by gel permeation chromatography (GPC)) of the component (A) is not particularly limited, but is preferably 1,000 to 200,000, more preferably 1,500 to 200,000, and still more preferably 2,000 to 150,000. When the weight average molecular weight is no more than the upper limit of the above preferable range, as described later, the component (A) satisfactorily dissolves in an organic solvent, and the coatability on a substrate becomes excellent. On the other hand, when the weight average molecular weight is at least as large as the lower limit of the above preferable range, the production stability of the polymeric compound becomes excellent, and the brush composition exhibits excellent coatability on a substrate.

The molecular weight dispersity (Mw/Mn) of the component (A) is not particularly limited, but is preferably 1.0 to 5.0, more preferably 1.0 to 3.0, and most preferably 1.0 to 2.5. Here, Mn is the number average molecular weight.

The component (A) can be obtained, for example, by a conventional radical polymerization or the like of the monomers corresponding with each of the structural units, using a radical polymerization initiator such as azobisisobutyronitrile (AIBN). Further, in the polymerization of the component (A), for example, an initiator such as $CH_3$—$CH_2$—CH($CH_3$)—Li may be used.

Furthermore, in the polymerization of the component (A), for example, terminal modifier such as butyleneoxide may be used.

As the monomers for deriving the corresponding structural units, commercially available monomers may be used, or the monomers may be synthesized by a conventional method.

In the brush composition of the present invention, the amount of the component (A) can be appropriately adjusted depending on the thickness of the brush layer, and the like.

In the brush composition of the present invention, the amount of the component (A) based on the whole solid content is preferably 70% by weight or more, more preferably 90% by weight or more, and still more preferably 95% by weight or more.

<Optional Components>

The brush composition of the present invention may contain, in addition to the component (A), a component (optional component) other than the component (A).

Acid-Generator Component (B)

The brush composition of the present invention may further contain an acid-generator component (B) (hereafter, referred to as "component (B)"). The component (B) generates acid by heat or exposure. The component (B) itself does not need to exhibit acidity, may be any compound which is decomposed by heat or light and functions as an acid.

As the component (B), there is no particular limitation, and any of the known acid generator components used in chemically amplified resist compositions conventionally used in photolithography can be used.

Examples of the acid-generator component include a thermal acid generator that generates acid by heating, and a photoacid generator that generates acid upon exposure. Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

A "thermal acid generator which generates acid by heating" refers to a component which generates acid upon heating preferably at 200° C. or lower. When the heating temperature is 200° C. or lower, generation of acid may be reliably controlled. Preferably, a component that generates acid by heating at 50 to 150° C. is used. When the preferable heating temperature is 50° C. or higher, the stability of the acid-generator component in the brush composition becomes satisfactory.

As the onium salt acid generator for the component (B), those in which have at least one anion group selected from a sulfonate anion, a carboxylate anion, a sulfonylimide anion, a bis(alkylsulfonyl)imide anion, a tris(alkylsulfonyl) methide anion and a fluoroantimonic acid ion as the anion moiety is preferable.

Further, as the cation moiety of an onium salt acid generator for the component (B), a cation moiety represented by general formula (b-c1) or (b-c2) shown below is preferable.

[Chemical Formula 13]

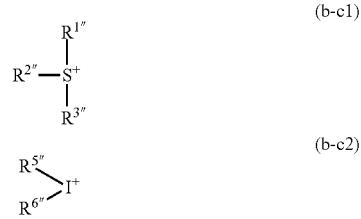

In the formulae, $R^{1\prime\prime}$ to $R^{3\prime\prime}$, $R^{5\prime\prime}$ and $R^{6\prime\prime}$ each independently represents an aryl group which may have a substituent, an alkyl group which may have a substituent or an alkenyl group which may have a substituent, provided that, in formula (b-c1), two of $R^{1\prime\prime}$ to $R^{3\prime\prime}$ may be mutually bonded to form a ring with the sulfur atom; and In formula (b-c1), $R^{1\prime\prime}$ to $R^{3\prime\prime}$ each independently represents an aryl group which may have a substituent or an alkyl group which may have a substituent. Two of $R^{1\prime\prime}$ to $R^{3\prime\prime}$ may be mutually bonded to form a ring with the sulfur atom.

Examples of the aryl group for $R^{1\prime\prime}$ to $R^{3\prime\prime}$ include an unsubstituted aryl group of 6 to 20 carbon atoms; a substituted aryl group in which part or all of the hydrogen atoms of the aforementioned unsubstituted aryl group has been substituted with an alkyl group, an alkoxy group, a halogen atom, a hydroxy group, an oxo group (=O), an aryl group, an alkoxyalkyloxy group, an alkoxycarbonylalkyloxy group, —C(=O)—O—$R^{6\prime}$, —O—C(=O)— $R^{7\prime}$ or —O—$R^{8\prime}$. Each of $R^{6\prime}$, $R^{7\prime}$ and $R^{8\prime}$ independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The unsubstituted aryl group for $R^{1\prime\prime}$ to $R^{3\prime\prime}$ is preferably an aryl group having 6 to 10 carbon atoms because it can be synthesized at a low cost. Specific examples thereof include a phenyl group and a naphthyl group.

The alkyl group as the substituent for the substituted aryl group represented by $R^{1\prime\prime}$ to $R^{3\prime\prime}$ is preferably an alkyl group having 1 to 5 carbon atoms, and more preferably a methyl group, an ethyl group, a propyl group, an n-butyl group, or a tert-butyl group.

The alkoxy group as the substituent for the substituted aryl group is preferably an alkoxy group having 1 to 5 carbon atoms, and more preferably a methoxy group, an ethoxy group, an n-propoxy group, an iso-propoxy group, an n-butoxy group or a tert-butoxy group.

The halogen atom as the substituent for the substituted aryl group is preferably a fluorine atom.

As the aryl group as the substituent for the substituted aryl group, the same aryl groups as those described for $R^{1\prime\prime}$ to $R^{3\prime\prime}$ can be mentioned.

Examples of alkoxyalkyloxy groups as the substituent for the substituted aryl group include groups represented by a general formula shown below:

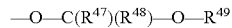

In the formula, $R^{47}$ and $R^{48}$ each independently represents a hydrogen atom or a linear or branched alkyl group; and $R^{49}$ represents an alkyl group.

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ be a hydrogen atom. It is particularly desirable that at least one of $R^{47}$ and $R^{48}$ be a hydrogen atom, and the other be a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms. Examples thereof include a methyl group, an ethyl group, a propyl group, an n-butyl group and a tert-butyl group.

The cyclic alkyl group for $R^{49}$ preferably has 4 to 15 carbon atoms, more preferably 4 to 12, and most preferably 5 to 10. Specific examples thereof include groups in which one or more hydrogen atoms have been removed from a monocycloalkane or a polycycloalkane such as a bicycloalkane, tricycloalkane or tetracycloalkane, and which may or may not be substituted with an alkyl group of 1 to 5 carbon atoms, a fluorine atom or a fluorinated alkyl group. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below:

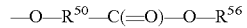

In the formula, $R^{50}$ represents a linear or branched alkylene group, and $R^{56}$ represents a tertiary alkyl group.

The linear or branched alkylene group for $R^{50}$ preferably has 1 to 5 carbon atoms, and examples thereof include a methylene group, an ethylene group, a trimethylene group, a tetramethylene group and a 1,1-dimethylethylene group.

Examples of the tertiary alkyl group for $R^{56}$ include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, a 1-ethyl-1-cyclohexyl group, a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, a 1-(1-cyclohexyl)-1-methylpentyl group, a tert-butyl group, a tert-pentyl group and a tert-hexyl group.

Further, a group in which $R^{56}$ in the group represented by the aforementioned general formula: $-O-R^{50}-C(=O)-O-R^{56}$ has been substituted with $R^{56'}$ can also be mentioned. $R^{56'}$ represents a hydrogen atom, an alkyl group, a fluorinated alkyl group or an aliphatic cyclic group which may contain a hetero atom.

The alkyl group for $R^{56'}$ is the same as defined for the alkyl group for the aforementioned $R^{49}$.

Examples of the fluorinated alkyl group for $R^{56'}$ include groups in which part or all of the hydrogen atoms within the alkyl group for $R^{49}$ has been substituted with a fluorine atom.

Examples of the aliphatic cyclic group for $R^{56'}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

As an aliphatic cyclic group for $R^{56'}$ which does not contain a hetero atom, a group in which one or more hydrogen atoms have been removed from a monocycloalkane or a polycycloalkane such as a bicycloalkane, a tricycloalkane or a tetracycloalkane can be mentioned. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include aliphatic cyclic groups represented by formulae (L1) to (L6) and (S1) to (S4) below.

[Chemical Formula 14]

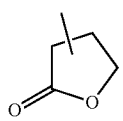
(L1)

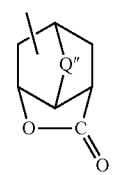
(L2)

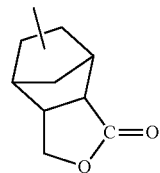
(L3)

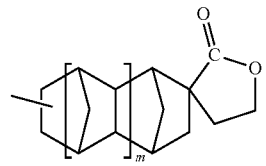
(L4)

(L5)

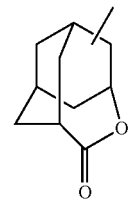
(L6)

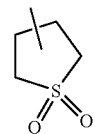
(S1)

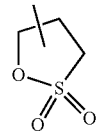
(S2)

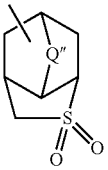
(S3)

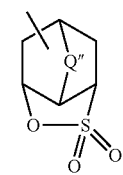
(S4)

In the formula, Q″ represents an alkylene group of 1 to 5 carbon atoms, $-O-$, $-S-$, $-O-R^{94}-$ or $-S-R^{95}-$ (wherein each of $R^{94}$ and $R^{95}$ independently represents an alkylene group of 1 to 5 carbon atoms); and m represents 0 or 1.

In the above formulae, the linear or branched alkylene group for Q″, $R^{94}$ and $R^{95}$ preferably has 1 to 5 carbon atoms, and examples thereof include a methylene group, an ethylene group, a trimethylene group, a tetramethylene group and a 1,1-dimethylethylene group.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

As the aliphatic cyclic group for $R^{56'}$ in which a hydrogen atom has been substituted with a hetero atom, an aliphatic cyclic group in which a hydrogen atom has been substituted with an oxygen atom (=O) can be mentioned.

In formulae —C(=O)—O—$R^{6'}$, —O—C(=O)—$R^{7'}$ and —O—$R^{8'}$, $R^{6'}$, $R^{7'}$, and $R^{8'}$ each independently represents a linear or branched saturated hydrocarbon group of 1 to 25 atoms, a cyclic saturated hydrocarbon group of 3 to 20 carbon atoms or a linear or branched, aliphatic unsaturated hydrocarbon group of 2 to 5 carbon atoms.

The linear or branched, saturated hydrocarbon group preferably has 1 to 25 carbon atoms, more preferably 1 to 15, and still more preferably 4 to 10.

Examples of the linear, saturated hydrocarbon group include a methyl group, an ethyl group, a propyl group, a butyl group, a pentyl group, a hexyl group, a heptyl group, an octyl group, a nonyl group and a decyl group.

Examples of the branched, saturated hydrocarbon group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group, but excluding tertiary alkyl groups.

The linear or branched, saturated hydrocarbon group may have a substituent. Examples of the substituent include an alkoxy group, a halogen atom, a halogenated alkyl group, a hydroxyl group, an oxygen atom (=O), a cyano group and a carboxy group.

The alkoxy group as the substituent for the linear or branched saturated hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the linear or branched saturated alkyl group include a fluorine atom, a chlorine atom, a bromine atom and an iodine atom, and a fluorine atom is preferable.

Example of the halogenated alkyl group as the substituent for the linear or branched, saturated hydrocarbon group includes a group in which part or all of the hydrogen atoms within the aforementioned linear or branched, saturated hydrocarbon group have been substituted with the aforementioned halogen atoms.

The cyclic saturated hydrocarbon group of 3 to 20 carbon atoms for $R^{6'}$, $R^{7'}$ and $R^{8'}$ may be either a polycyclic group or a monocyclic group, and examples thereof include groups in which one hydrogen atom has been removed from a monocycloalkane, and groups in which one hydrogen atom has been removed from a polycycloalkane (e.g., a bicycloalkane, a tricycloalkane or a tetracycloalkane). More specific examples include groups in which one hydrogen atom has been removed from a monocycloalkane such as cyclopentane, cyclohexane, cycloheptane or cyclooctane; and groups in which one or more hydrogen atoms have been removed from a polycycloalkane such as adamantane, norbornane, isobornane, tricyclodecane or tetracyclododecane.

The cyclic, saturated hydrocarbon group may have a substituent. For example, part of the carbon atoms constituting the ring within the cyclic alkyl group may be substituted with a hetero atom, or a hydrogen atom bonded to the ring within the cyclic alkyl group may be substituted with a substituent.

In the former example, a heterocycloalkane in which part of the carbon atoms constituting the ring within the aforementioned monocycloalkane or polycycloalkane has been substituted with a hetero atom such as an oxygen atom, a sulfur atom or a nitrogen atom, and one hydrogen atom has been removed therefrom, can be used. Further, the ring may contain an ester bond (—C(=O)—O—). More specific examples include a lactone-containing monocyclic group, such as a group in which one hydrogen atom has been removed from γ-butyrolactone; and a lactone-containing polycyclic group, such as a group in which one hydrogen atom has been removed from a bicycloalkane, tricycloalkane or tetracycloalkane containing a lactone ring.

In the latter example, as the substituent, the same substituent groups as those for the aforementioned linear or branched alkyl group, or an alkyl group of 1 to 5 carbon atoms can be used.

Alternatively, $R^{6'}$, $R^{7'}$ and $R^{8'}$ may be a combination of a linear or branched alkyl group and a cyclic group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of the linear aliphatic unsaturated hydrocarbon group for $R^{6'}$, $R^{7'}$ and $R^{8'}$ include a vinyl group, a propenyl group (an allyl group) and a butynyl group.

Examples of the branched aliphatic unsaturated hydrocarbon group for $R^{6'}$, $R^{7'}$ and $R^{8'}$ include a 1-methylpropenyl group and a 2-methylpropenyl group.

The aforementioned linear or branched, aliphatic unsaturated hydrocarbon group may have a substituent.

Examples of substituents include the same substituents as those which the aforementioned linear or branched alkyl group may have.

Among the aforementioned examples, as $R^{6'}$, $R^{7'}$ and $R^{8'}$ a linear or branched, saturated hydrocarbon group of 1 to 15 carbon atoms or a cyclic saturated hydrocarbon group of 3 to 20 carbon atoms is preferable.

Examples of the alkyl group for $R^{1'''}$ to $R^{3'''}$ include linear, branched or cyclic alkyl groups of 1 to 10 carbon atoms. Among these, alkyl groups of 1 to 5 carbon atoms are preferable as the resolution becomes excellent. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

The alkyl group for R¹″ to R³″ may have part or all of the hydrogen atoms substituted with an alkoxy group, a halogen atom, a hydroxy group, an oxo group (=O), an aryl group, an alkoxyalkyloxy group, alkoxycarbonylalkyloxy group, —C(=O)—O—R⁶′, —O—C(=O)—R⁷′ and —O—R⁸′. The alkoxy group, the halogen atom, the aryl group, the alkoxyalkyloxy group, the alkoxycarbonylalkyloxy group, —C(=O)—O—R⁶′, —O—C(=O)—R⁷′ and —O—R⁸′ are the same as defined for the substituent for the aryl group represented by R¹″ to R³″.

The alkenyl group for R¹″ to R³″ preferably has 2 to 10 carbon atoms, more preferably 2 to 5, and still more preferably 2 to 4. Specific examples thereof include a vinyl group, a propenyl group (an allyl group), a butynyl group, a 1-methylpropenyl group and a 2-methylpropenyl group.

When two of R¹″ to R³″ are bonded to each other to form a ring with the sulfur atom, it is preferable that the two of R¹″ to R³″ form a 3 to 10-membered ring including the sulfur atom, and it is particularly desirable that the two of R¹″ to R³″ form a 5 to 7-membered ring including the sulfur atom.

Preferable examples of the cation moiety of the compound represented by the aforementioned formula (b-c1) are shown below.

[Chemical Formula 15]

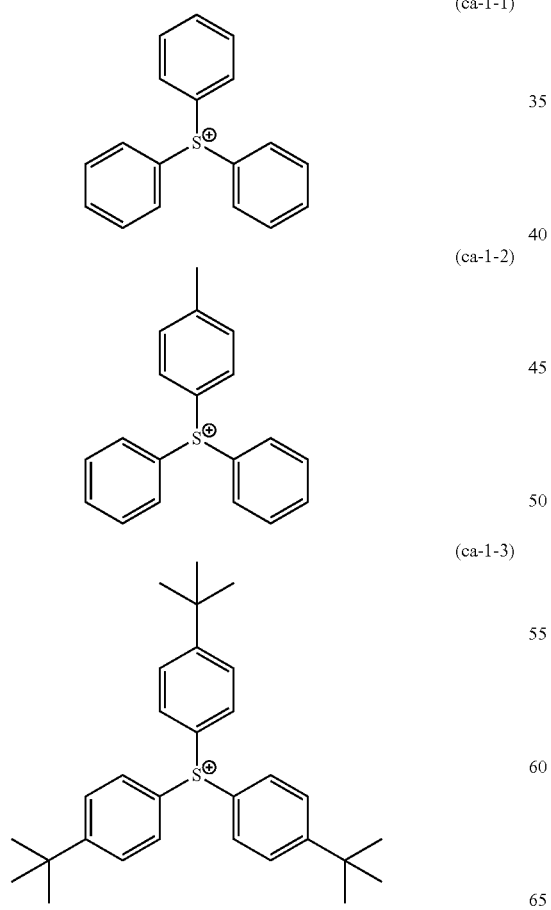
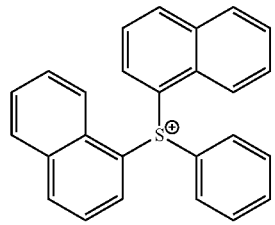
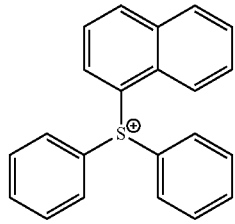
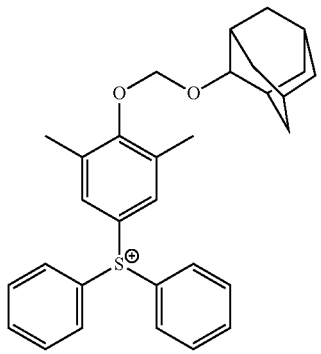
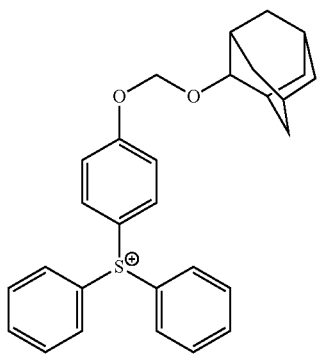
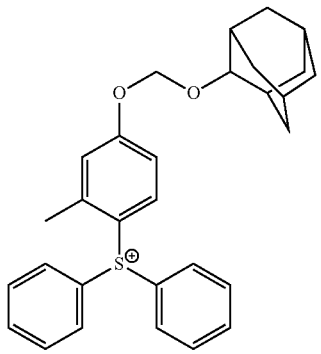

(ca-1-9)
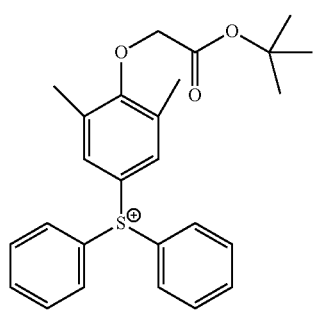
(ca-1-10)
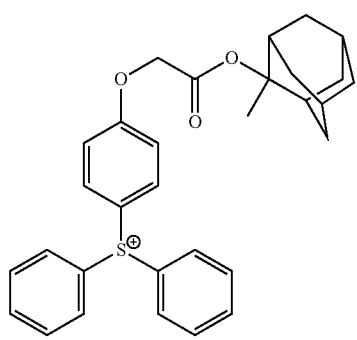
(ca-1-11)
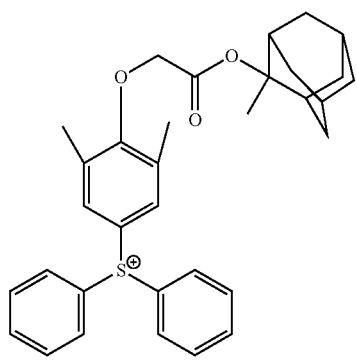
(ca-1-12)
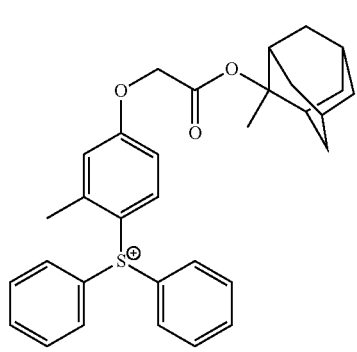
(ca-1-13)
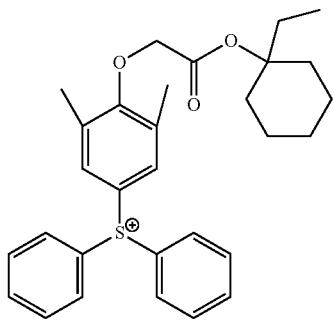
(ca-1-14)
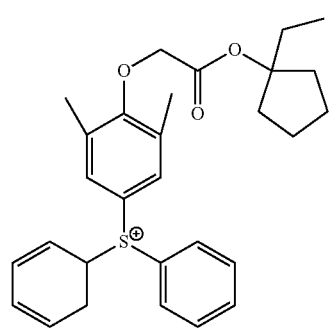
(ca-1-15)
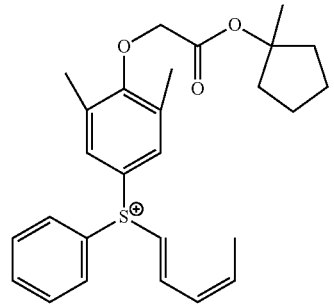
(ca-1-16)
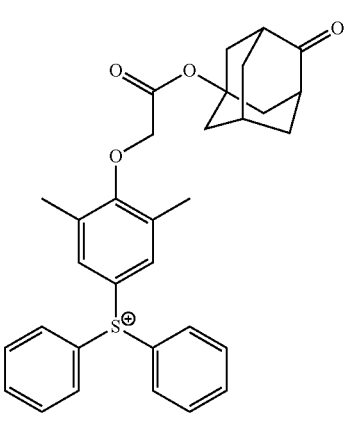

[Chemical Formula 16]
(ca-1-17)
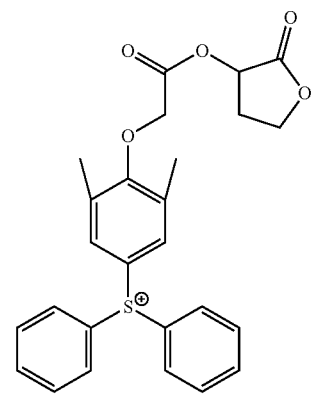
(ca-1-18)
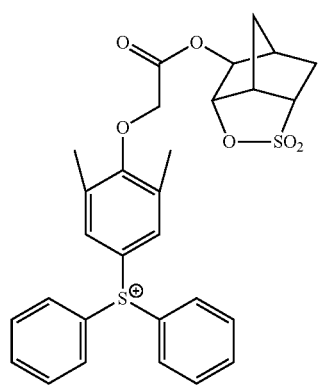
(ca-1-19)
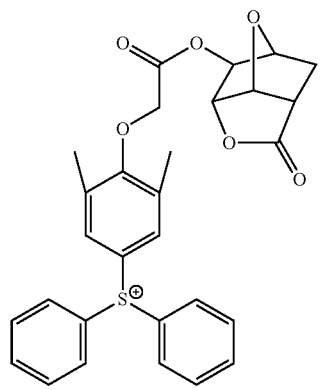
(ca-1-20)
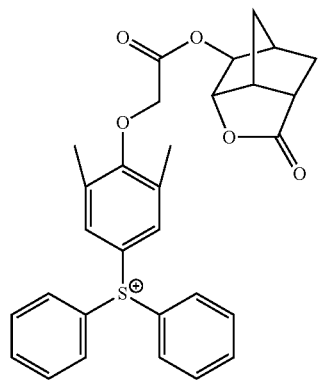
(ca-1-21)
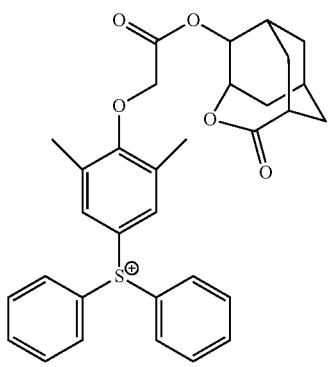
(ca-1-22)
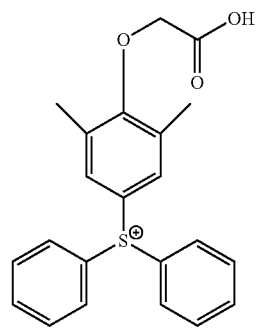
(ca-1-23)
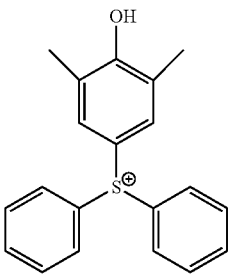
(ca-1-24)
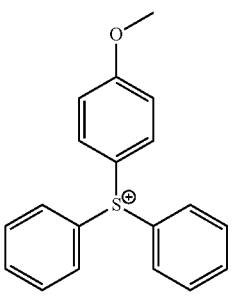
(ca-1-25)
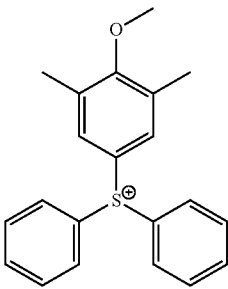

(ca-1-26)
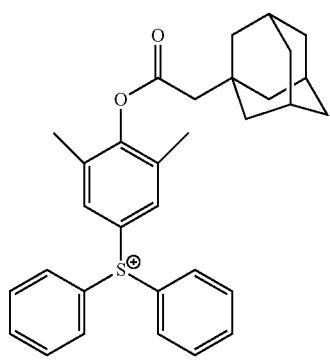
(ca-1-27)
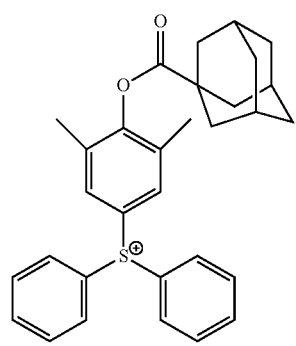
(ca-1-28)
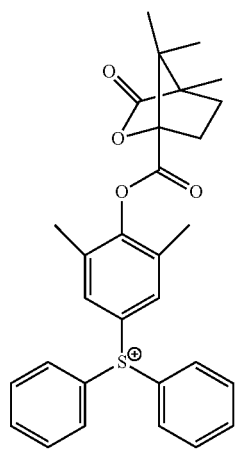
[Chemical Formula 17]
(ca-1-29)
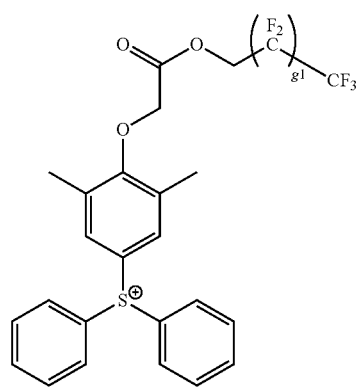
(ca-1-30)
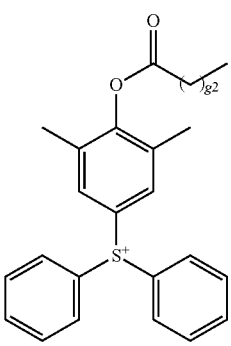
(ca-1-31)
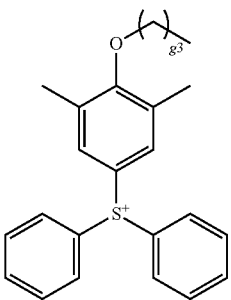
(ca-1-32)
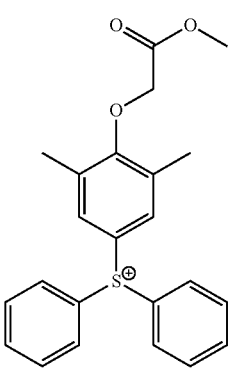
(ca-1-33)
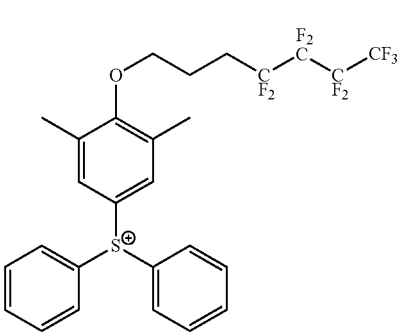

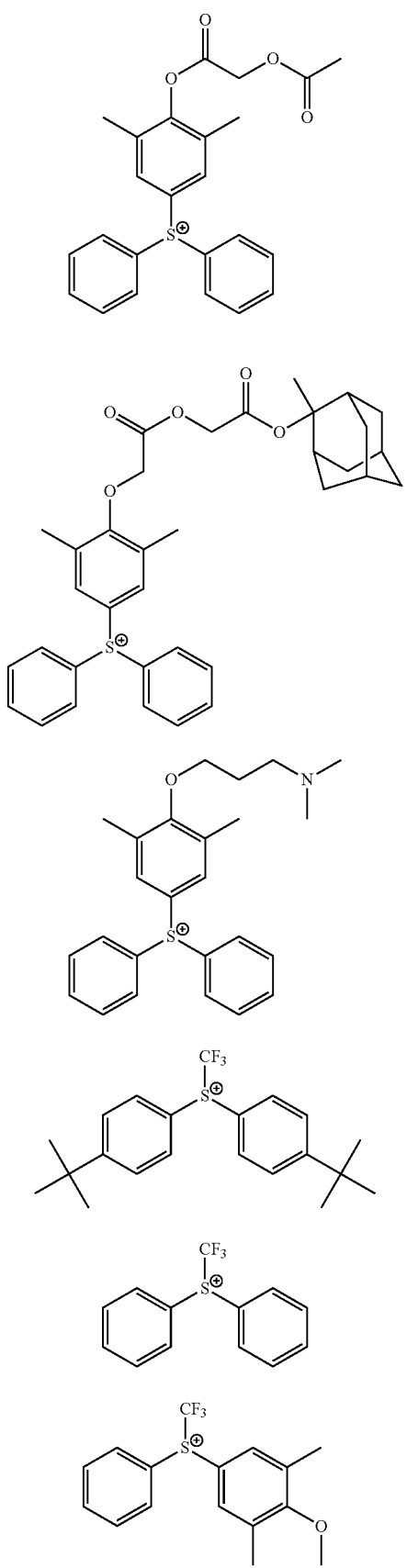
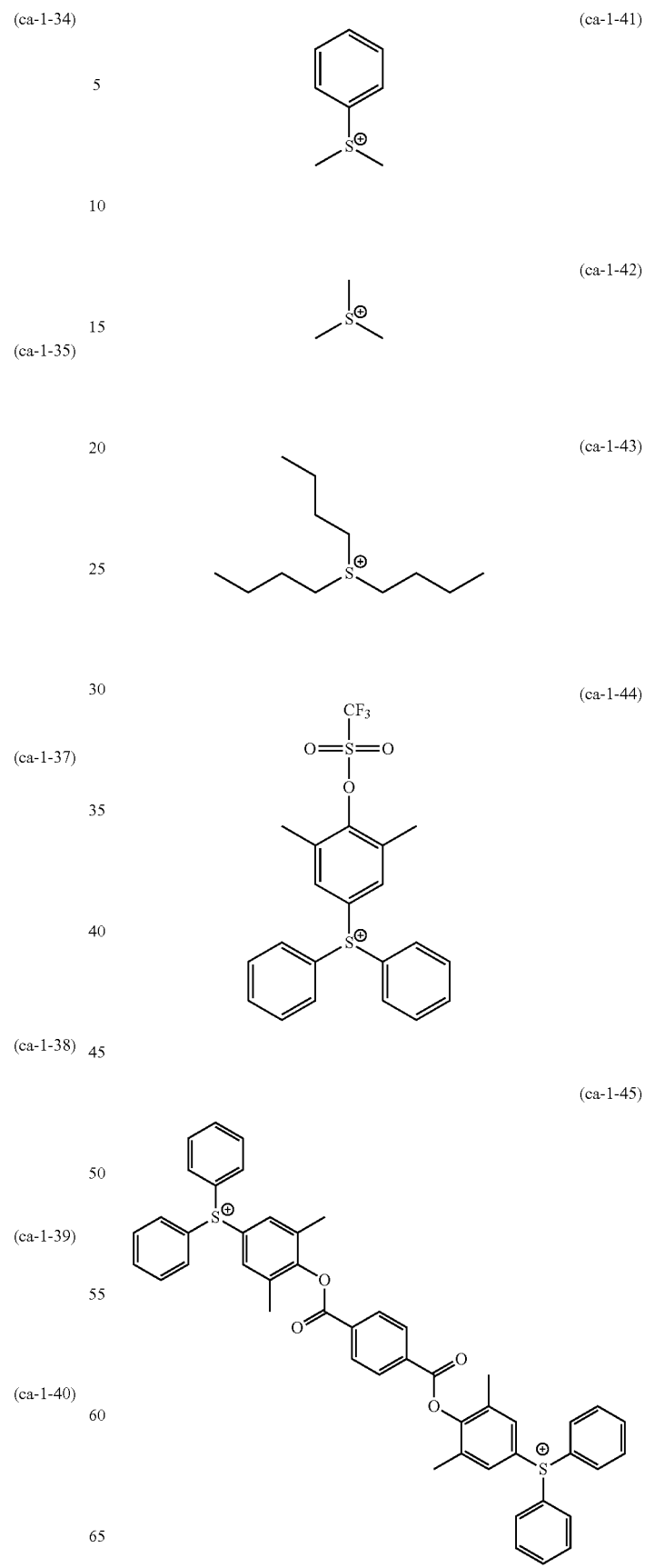

(ca-1-46)
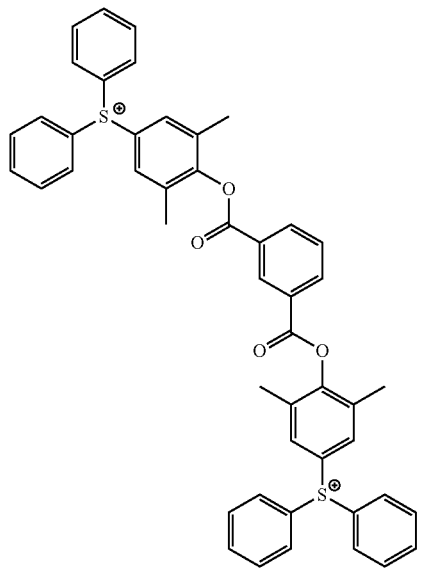
(ca-1-49)
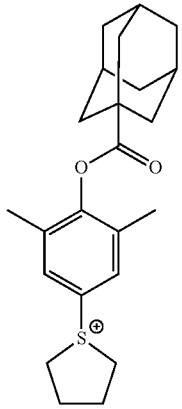
In the formulae, g1, g2 and g3 represent recurring numbers, wherein g1 is an integer of 1 to 5, g2 is an integer of 0 to 20, and g3 is an integer of 0 to 20.
(ca-1-50)
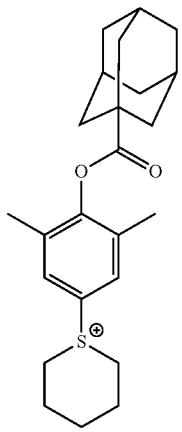
[Chemical Formula 18]
(ca-1-47)
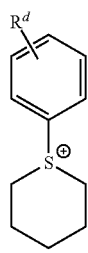
(ca-1-51)
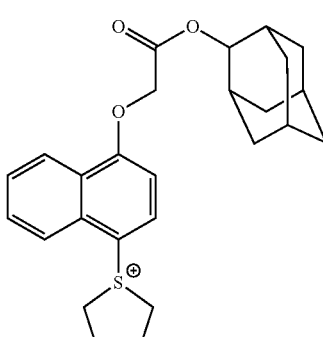
(ca-1-48)
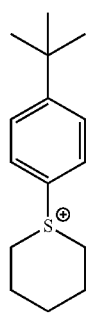
(ca-1-52)
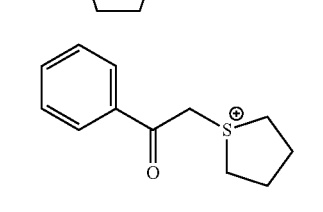
(ca-1-53)
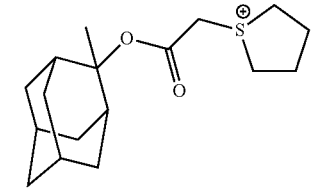
In formula (ca-1-47), $R^d$ represents a substituent. Examples of the substituent include those described above in the explanation of the aforementioned substituted aryl group (an alkyl group, an alkoxy group, an alkoxyalkyloxy group, an alkoxycarbonylalkyloxy group, a halogen atom, a hydroxy group, an oxo group (=O), an aryl group, —C(=O)—O—R$^{6\prime\prime\prime}$, —O—C(=O)—R$^{7\prime\prime\prime}$, and —O—R$^{8\prime\prime\prime}$).

In formula (b-c2), R$^{5\prime\prime\prime}$ and R$^{6\prime\prime\prime}$ each independently represents an aryl group which may have a substituent or an alkyl group which may have a substituent.

As the aryl group for R$^{5\prime\prime\prime}$ and R$^{6\prime\prime\prime}$, the same aryl groups as those described above for R$^{1\prime\prime\prime}$ to R$^{3\prime\prime\prime}$ can be used. The alkyl group for R$^{5\prime\prime\prime}$ and R$^{6\prime\prime\prime}$ is the same as defined for the alkyl group for R$^{1\prime\prime\prime}$ to R$^{3\prime\prime\prime}$. The alkenyl group for R$^{5\prime\prime\prime}$ and R$^{6\prime\prime\prime}$ is the same as defined for the alkenyl group for R$^{1\prime\prime\prime}$ to R$^{3\prime\prime\prime}$.

Specific examples of the cation moiety of the compound represented by general formula (b-c2) include diphenyliodonium and bis(4-tert-butylphenyl)iodonium.

In the present description, an oximesulfonate acid generator is a compound having at least one group represented by general formula (B-1) shown below, and has a feature of generating acid by irradiation. In general, such oximesulfonate acid generators are widely used for a chemically amplified resist composition, and can be appropriately selected.

[Chemical Formula 19]

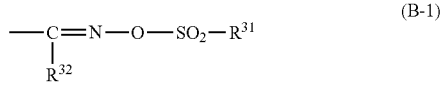

(B-1)

In formula (B-1), each of R$^{31}$ and R$^{32}$ independently represents an organic group.

The organic group for R$^{31}$ and R$^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for R$^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As R$^{31}$, an alkyl group of 1 to 4 carbon atoms which has no substituent or a fluorinated alkyl group of 1 to 4 carbon atoms s is particularly desirable.

As the organic group for R$^{32}$, a linear, branched, or cyclic alkyl group, aryl group, or cyano group is preferable. Examples of the alkyl group and the aryl group for R$^{32}$ include the same alkyl groups and aryl groups as those described above for R$^{31}$.

As R$^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 20]

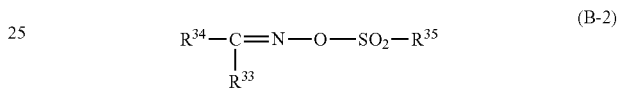

(B-2)

In the formula, R$^{33}$ represents a cyano group, an alkyl group having no substituent or a halogenated alkyl group; R$^{34}$ represents a group containing an aryl group; provided that the alkyl group or the halogenated alkyl group for R$^{34}$ may be bonded with R$^{35}$ to form a ring; R$^{35}$ represents an alkyl group having no substituent or a halogenated alkyl group.

[Chemical Formula 21]

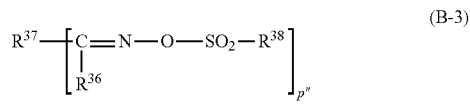

(B-3)

In the formula, R$^{36}$ represents a cyano group, an alkyl group having no substituent or a halogenated alkyl group; R$^{37}$ represents a divalent or trivalent aromatic hydrocarbon group; R$^{38}$ represents an alkyl group having no substituent or a halogenated alkyl group; and p" represents 2 or 3.

In general formula (B-2), the alkyl group having no substituent or the halogenated alkyl group for R$^{33}$ preferably has 1 to 10 carbon atoms, more preferably 1 to 8 carbon atoms, and most preferably 1 to 6 carbon atoms.

As R$^{33}$, a halogenated alkyl group is preferable, and a fluorinated alkyl group is more preferable.

The fluorinated alkyl group for R$^{33}$ preferably has 50% or more of the hydrogen atoms thereof fluorinated, more preferably 70% or more, and most preferably 90% or more.

Examples of the group containing an aryl group for R$^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The group containing an aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p'' is preferably 2.

Specific examples of suitable oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 22]

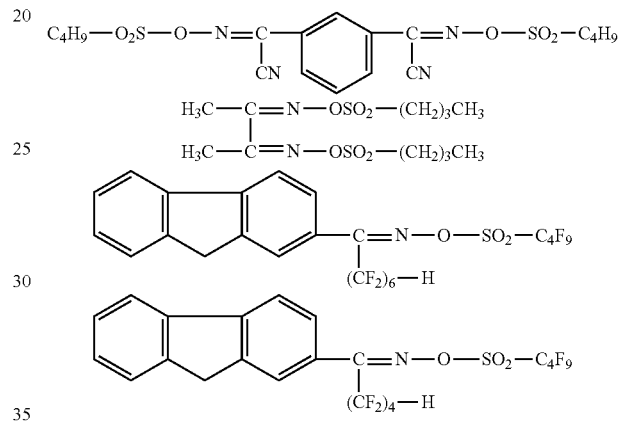

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

In the brush composition according to a first aspect of the present invention, as the component (B), 1 kind of acid generator may be used, or 2 or more kinds of acid generators may be used in combination.

When the brush composition contains the component (B), the amount of the component (B) relative to 100 parts by weight of the component (A) is preferably within a range from 0.5 to 30 parts by weight, and more preferably from 1 to 20 parts by weight.

When the amount of the component (B) is within the above range, the effects of the present invention can be satisfactorily achieved.

If desired, other miscible additives can also be added to the brush composition according to the first aspect of the present invention, as long as the effects of the present invention are not impaired. Examples of such miscible additives include additive resins for improving the performance of the brush layer, surfactants for improving the applicability, dissolution inhibitors, plasticizers, stabilizers, colorants, halation prevention agents, dyes, sensitizers, base amplifiers and basic compounds (e.g., nitrogen-containing compounds, such as imidazole).

Organic Solvent (S)

The brush composition according to the first aspect of the present invention can be produced by dissolving the raw materials including the component (A) and the component (B) and the like if desired, in an organic solvent (hereafter, referred to as "component (S)").

The component (S) may be any organic solvent which can dissolve the respective components to give a uniform solution, and one or more kinds of any organic solvent can be appropriately selected from those which have been conventionally known as solvents for a film composition containing a resin as a main component.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenyl ether, dibenzylether, phenetole, butylphenylether, ethylbenzene, diethylbenzene, pentylbenzene, isopropylbenzene, toluene, xylene, cymene and mesitylene.

The component (S) can be used individually, or in combination as a mixed solvent.

Among these examples, as the component (S), propylene glycol monomethyl ether acetate (PGMEA), propylene glycol monomethyl ether (PGME), cyclohexanone and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the component (S), a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the organic solvent is used in an amount such that the solid content of the brush composition becomes within the range from 0.1 to 200% by weight, and preferably from 0.2 to 15% by weight.

(Water Contact Angle on the Surface of the Brush Layer Formed on the Substrate)

A brush layer formed on a substrate using the brush composition according to the first aspect of the present invention preferably has a water contact angle of 90° or more. The larger the value of the contact angle, the higher the hydrophobicity of the surface of the brush layer, meaning that the water repellency becomes high, and a result, the adhesion of the substrate to the layer containing a block copolymer via the brush layer becomes strong. As a result, the phase-separation performance of the layer containing a block copolymer formed on the brush layer is improved.

With respect to the brush composition of the present invention, the water contact angle is preferably 90° or more, and more preferably 93° or more.

The water contact angle is measured by the following steps.

Step (1): A PGMEA solution of component (A) is applied to a substrate, so as to form a brush layer having a film thickness of less than 10 nm.

Step (2): 2 μL of water is dropped onto the surface of the brush layer, and the contact angle (static contact angle) is measured by a contact angle meter.

The contact angle (static contact angle) is an angle formed at a place where a free surface of a static liquid (water) comes into contact with a solid wall (brush layer), and is an angle formed between the liquid surface and the solid surface.

The brush composition according to the first aspect of the present invention described heretofore contains a resin component (A) having a structural unit (u1) represented by general formula (u1-1), and having a hydroxy group on at least one terminal portion of the main chain thereof.

When the brush composition is used as a surface modifier for a substrate which is used for phase-separation of a layer containing a block copolymer formed on the substrate, the block copolymer having a plurality of blocks bonded, the surface of the brush layer can be controlled to a highly hydrophobic state. As a result, the adhesion of the substrate to the layer containing a block copolymer via the brush layer is enhanced. It is presumed that, in this manner, the phase-separation performance of the block copolymer can be improved.

Further, with respect to the brush composition, since the surface state of the brush layer is stable, there is no need to select a neutral layer material which can obtain a brush layer having a surface free energy of a predetermined value each time, depending on the kind of the block copolymer used. Therefore, the brush composition can be conveniently used.

Second Embodiment: Method of Producing a Structure Containing a Phase-Separated Structure A second aspect of the present invention is a method of producing a structure containing a phase-separated structure, the method including: a step of applying the brush composition of the first aspect to form a brush layer (hereafter, referred to as "step (i)"); a step of forming a layer containing a block copolymer on the brush layer, the block copolymer having a plural kinds of block bonded together (hereafter, referred to as "step (ii)"); and a step of phase-separating the layer containing the block copolymer (hereafter, referred to as "step (iii)").

Hereinafter, the method of producing a structure containing a phase-separated structure will be specifically described with reference to FIG. 1. However, the present invention is not limited to these embodiments.

FIG. 1 shows an example of one embodiment of the method of forming a structure containing a phase-separated structure according to the present invention.

Firstly; the brush composition of the present invention is applied to a substrate 1, so as to form a brush layer 2 (FIG. 1 (I); step (i)).

Subsequently, to the brush layer 2 is applied a composition containing a block copolymer having a plurality of blocks bonded (hereafter, sometimes referred to as "BCP composition"), so as to form a layer 3 containing the block copolymer (FIG. 1 (II); step (ii)).

Next, heating is conducted to perform an annealing treatment, so as to phase-separate the layer 3 containing the block copolymer into a phase 3a and a phase 3b (FIG. 1 (III); step (iii)).

According to the production method of the present embodiment, that is, the production method including the steps (i) to (iii), a structure 3' containing a phase-separated structure is formed on the substrate 1 having the brush layer 2 formed thereon.

[Step (i)]

In step (i), the brush composition is applied to a substrate 1, so as to form a brush layer 2.

By forming a brush layer 2 on the substrate 1, the surface of the substrate 1 becomes hydrophobic. By the formation of such brush layer, when a layer 3 containing a block copolymer is formed on the brush layer 2, a phase constituted of a block having a high affinity for the hydrophobic substrate 1 exhibits enhanced adhesion to the substrate 1. As a result, by phase-separation of the layer 3 containing a block copolymer, a cylinder structure oriented perpendicular to the surface of the substrate 1 can be reliably formed.

The kind of the substrate 1 is not particularly limited, as long as a BCP composition can be coated thereon. Examples thereof a substrate constituted of an organic substance, such as a metal (silicon, copper, chromium, iron, aluminum or the like), glass, titanium oxide, silicon dioxide ($SiO_2$), silica or mica; a substrate constituted of a nitride such as SiN; a substrate constituted of an oxynitride such as SiON; and a substrate constituted of an organic substance such as an acrylic resin, polystyrene, cellulose, cellulose acetate or phenol resin. Among these examples, a metal is preferable as the substrate 1. For example, on a silicon substrate (Si substrate), a silicon dioxide substrate ($SiO_2$ substrate) or a copper substrate (Cu substrate), a cylinder structure is formed. Among these, an Si substrate or an $SiO_2$ substrate is particularly desirable.

The size and the shape of the substrate 1 is not particularly limited. The substrate 1 does not necessarily need to have a smooth surface, and a substrate having various shapes can be appropriately selected for use. For example, substrates having various shapes can be used, such as a substrate having a curved surface, a plate having an uneven surface, and a thin sheet.

On the surface of the substrate 1, an inorganic and/or organic film may be provided.

As the inorganic film, an inorganic antireflection film (inorganic BARC) can be used. As the organic film, an organic antireflection film (organic BARC) can be used.

An inorganic film can be formed, for example, by coating an in organic anti-reflection film composition such as a silicon-based material on a substrate, followed by baking.

An organic film can be formed, for example, by dissolving a resin component and the like for forming the film in an organic solvent to obtain an organic film-forming material, coating the organic film-forming material on a substrate using a spinner or the like, and baking under heating conditions preferably in the range of 200 to 300° C. for 30 to 300 seconds, more preferably for 60 to 180 seconds. The organic film-forming material does not need to have susceptibility to light or electron beam like a resist film, and the organic film-forming material may or may not have such susceptibility. More specifically, a resist or a resin generally used in the production of a semiconductor device or a liquid crystal display device can be used.

Further, it is preferable that the organic film-forming material can be subjected to etching using a block copolymer pattern formed by processing the layer 3, particularly dry etching, so that, by etching the organic film using a pattern of a block copolymer, the pattern can be transferred to the organic film, and an organic film pattern can be formed. It is particularly desirable to use an organic film-forming material which can be subjected to oxygen plasma etching or the like. As such an organic film-forming material, a material conventionally used for forming an organic film such as an organic BARC can be used. Examples of such an organic film-forming material include the ARC series manufactured by NISSAN CHEMICAL INDUSTRIES, LTD., the AR series manufactured by Rohm and Haas Company, and the SWK series manufactured by Tokyo Ohka Kogyo Co., Ltd.

The method of applying the brush composition of the present invention to the substrate 1 to form a brush layer 2 is not particularly limited, and the brush layer 2 can be formed by a conventional method.

For example, the brush composition can be applied to the substrate 1 by a conventional method using a spinner or the like to form a coating film on the substrate 1, followed by drying, thereby forming a brush layer 2.

The drying method of the coating film is not particularly limited, provided it can volatilize the solvent contained in the brush composition, and a baking method and the like are exemplified. The baking temperature is preferably 80° C. to 300° C., more preferably 180° C. to 270° C., and still more preferably 220° C. to 250° C. The baking time is preferably 30 seconds to 500 seconds, and more preferably 60 seconds to 400 seconds.

The thickness of the brush layer 2 after drying of the coating film is preferably about 10 to 100 nm, and more preferably about 40 to 90 nm.

Before forming the brush layer 2 on the substrate 1, the surface of the substrate 1 may be cleaned in advance. By cleaning the surface of the substrate 1, the coatability of the brush composition is improved.

As the cleaning treatment, a conventional method may be used, and examples thereof include an oxygen plasma treatment, an ozone oxidation treatment, an acid alkali treatment, and a chemical modification treatment.

After forming the brush layer 2, if necessary, the brush layer 2 may be rinsed using a rinse liquid such as a solvent. By the rinsing, uncrosslinked portions within the brush layer 2 are removed, such that the affinity of the substrate for at least 1 polymer (block) constituting the block copolymer is improved, and a phase-separated structure having a cylinder structure oriented in a direction perpendicular to the surface of the substrate 1 can be reliably formed.

The rinse liquid may be any liquid capable of dissolving the uncrosslinked portions, and a solvent such as propylene glycol monomethylether acetate (PGMEA), propylene glycol monomethylether (PGME), or ethyl lactate (EL), or a commercially available thinner can be used.

After the rinsing, for volatilizing the rinse liquid, a post bake may be conducted. The temperature conditions for the post bake is preferably from 80 to 300° C., more preferably from 100 to 270° C., and still more preferably 120 to 250° C. The baking time is preferably 30 seconds to 500 seconds, and more preferably 60 seconds to 240 seconds. The thickness of the brush layer 2 after the post bake is preferably about 1 to 10 nm, and more preferably about 2 to 7 nm.

[Step (ii)]

In step (ii), on the brush layer 2, a layer 3 containing a block copolymer having a plurality of blocks bonded is formed.

The method of forming the layer 3 on the brush layer 2 is not particularly limited, and examples thereof include a method in which a BCP composition is applied to the brush layer 2 by a conventional method using spin coating or a spinner, followed by drying. The details of the BCP composition will be described later.

The layer 3 may have a thickness satisfactory for phase-separation to occur. In consideration of the kind of the substrate 1, the structure period size of the phase-separated structure to be formed, and the uniformity of the nanostructure, the thickness is preferably 20 to 100 nm, and more preferably 30 to 80 nm.

For example, in the case where the substrate 1 is an Si substrate or an $SiO_2$, the thickness of the layer 3 is preferably 20 to 100 nm, and more preferably 30 to 80 nm.

In the case where the substrate 1 is a Cu substrate, the thickness of the layer 3 is preferably 10 to 100 nm, and more preferably 30 to 80 nm.

[Step (iii)]

Step (iii), the layer 3 containing a block copolymer is phase-separated.

By heating the substrate 1 after step (ii) to conduct the anneal treatment, the block copolymer is selectively removed, such that a phase-separated structure in which at least part of the surface of the substrate 1 is exposed is formed. That is, on the substrate 1, a structure 3' containing a phase-separated structure in which phase 3a and phase 3b are phase separated is produced.

The anneal treatment is preferably conducted at a temperature at least as high as the glass transition temperature of the block copolymer used and lower than the heat decomposition temperature. For example, in the case where the block copolymer is a polystyrene-polymethacrylate (PS-PMMA) block copolymer (weight average molecular weight: 5,000 to 100,000), 180 to 270° C. is preferable. The heating time is preferably 30 to 3,600 seconds.

Further, the anneal treatment is preferably conducted in a low reactive gas such as nitrogen.

By the method of producing a structure containing a phase-separated structure according to the present invention described heretofore, the phase-separation performance of the block copolymer can be enhanced, and a fine structure with a good shape can be formed, as compared to conventional lithography techniques. In addition, on the surface of the substrate, a substrate provided with a nanostructure which has the position and the orientation designed more freely can be produced. For example, the formed structure has high adhesion to the substrate, and is likely to have a phase-separated structure with a cylinder structure oriented in a direction perpendicular to the surface of the substrate.

[Optional Step]

The method of forming a structure containing a phase-separated structure according to the present invention is not limited to the above embodiment, and may include a step (optional step) other than steps (i) to (iii).

Examples of the optional steps include a step of selectively removing a phase constituted of at least one block of the plurality of blocks constituting the block copolymer contained in the layer containing the block copolymer (hereafter, referred to as "step (iv)"), and a guide pattern formation step.

Step (iv)

In step (iv), from the layer containing a block copolymer formed on the brush layer, a phase constituted of at least one block of the plurality of blocks constituting the block copolymer is selectively removed. In this manner, a fine pattern (polymeric nanostructure) can be formed.

Examples of the method of selectively removing a phase constituted of a block include a method in which an oxygen plasma treatment or a hydrogen plasma treatment is conducted on the layer containing a block copolymer.

Hereafter, among the blocks constituting the block copolymer, a block which is not selectively removed is referred to as "block $P_A$", and a block to be selectively removed is referred to as "block $P_B$". For example, after the phase separation of a layer containing a PS-PMMA block copolymer, by subjecting the layer to an oxygen plasma treatment or a hydrogen plasma treatment, the phase of PMMA is selectively removed. In such a case, the PS portion is the block $P_A$, and the PMMA portion is the block $P_B$.

Figure 2:
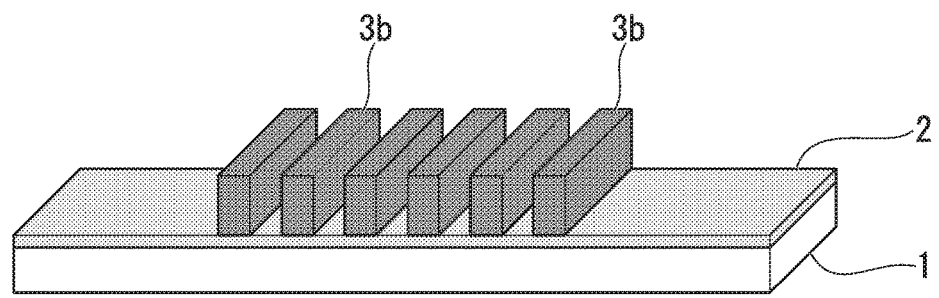
FIG. 2 is an explanatory diagram showing an example of one embodiment of an optional step.

FIG. 2 shows an example of one embodiment of step (iv).

In the embodiment shown in FIG. 2, by conducting oxygen plasma treatment on the structure 3' produced on the substrate 1 in step (iii), the phase 3a is selectively removed, and a pattern (polymeric nanostructure) constituted of phases 3b separated from each other is formed. In this case, the phase 3b is the phase constituted of the block $P_A$, and the phase 3a is the phase constituted of the block $P_B$.

The substrate 1 having a pattern formed by phase-separation of the layer 3 containing the block copolymer as described above may be used as it is, or may be further heated to modify the shape of the pattern (polymeric nanostructure) on the substrate 1.

The heat treatment is preferably conducted at a temperature at least as high as the glass transition temperature of the block copolymer used and lower than the heat decomposition temperature. Further, the heating is preferably conducted in a low reactive gas such as nitrogen.

Guide Pattern Forming Step

In the method of forming a structure containing a phase-separated structure according to the present invention, between step (i) and step (ii), a step of forming a guide pattern on the brush layer (guide pattern forming step) may be included. In this manner, it becomes possible to control the arrangement of the phase-separated structure.

For example, in the case of a block copolymer where a random fingerprint-patterned phase separation structure is formed without using a guide pattern, by providing a trench pattern of a resist film on the surface of the brush layer, a phase separation structure arranged along the trench can be obtained. The guide pattern can be provided on the brush layer 2 in accordance with the above-described principle. Further, when the surface of the guide pattern has affinity for any of the polymers constituting the block copolymer, a phase separation structure having a cylinder structure arranged in the perpendicular direction of the surface of the substrate can be more reliably formed.

The guide pattern can be formed, for example, using a resist composition.

The resist composition for forming the guide pattern can be appropriately selected from resist compositions or a modified product thereof typically used for forming a resist pattern which have affinity for any of the polymers constituting the block copolymer. The resist composition may be either a positive resist composition capable of forming a positive pattern in which exposed portions of the resist film are dissolved and removed, or a negative resist pattern capable of forming a negative pattern in which unexposed portions of the resist film are dissolved and removed, but a negative resist composition is preferable. As the negative resist composition, for example, a resist composition containing an acid generator and a base component which exhibits decreased solubility in an organic solvent-containing developing solution under action of acid, wherein the base component contains a resin component having a structural unit which is decomposed by action of acid to exhibit increased polarity, is preferable.

When the BCP composition is cast onto the brush layer having the guide pattern formed thereon, an anneal treatment is conducted to cause phase-separation. Therefore, the resist pattern for forming a guide pattern is preferably capable of forming a resist film which exhibits solvent resistance and heat resistance.

Composition Containing a Block Copolymer (BCP Composition)

As the BCP composition, a composition obtained by dissolving a block copolymer in an organic solvent can be mentioned.

Block Copolymer

A block copolymer is a polymeric compound in which a plurality of partial constitutional components (blocks) in which the same kind of structural unit is repeatedly bonded are bonded.

As the blocks constituting the block copolymer, 2 kinds of blocks may be used, or 3 or more kinds of blocks may be used.

In the present invention, the plurality of blocks constituting the block copolymer are not particularly limited, as long as they are combinations capable of causing phase separation.

Preferable examples of block copolymer include a polymeric compound (BCP-1) in which a hydrophobic polymer block (b11) and a hydrophilic polymer block (b21) are bonded.

The hydrophobic polymer block (b11) (hereafter, referred to simply as "block (b11)") refers to a block in which, when a plurality of monomers having different affinity relative to water are used, a monomer which exhibits relatively low affinity for water among the plurality of monomers is polymerized to form a polymer (hydrophobic polymer) as the block. The hydrophilic polymer block (b21) (hereafter, referred to simply as "block (b21)") refers to a block in which a monomer which exhibits relatively high affinity for water among the plurality of monomers is polymerized to form a polymer (hydrophilic polymer) as the block.

The block (b11) and the block (b21) are not particularly limited as long as long as they are combinations capable of causing phase separation. However, it is preferable to use a combination of blocks which are mutually incompatible.

Further, as the block (b11) and the block (b21), it is preferable to use a combination in which a phase of at least one block amongst the plurality of blocks constituting the block copolymer can be reliably removed as compared to the phases of other blocks.

The polymeric compound (BCP-1) may have a partial constitutional component (block) other than the block (b11) and the block (b21) bonded.

Examples of the block (b11) and the block (b21) include a block in which structural units derived from styrene or a styrene derivative are repeatedly bonded; a block in which structural units derived from an acrylate ester which may have the hydrogen atom bonded to the carbon atom on the α-position substituted with a substituent (structural units derived from (α-substituted) acrylate ester) are repeatedly bonded; a block in which structural units derived from acrylic acid which may have the hydrogen atom bonded to the carbon atom on the α-position substituted with a substituent (structural units derived from (α-substituted) acrylic acid) are repeatedly bonded; a block in which structural units derived from siloxane or a derivative thereof are repeatedly bonded; a block in which structural units derived from an alkyleneoxide are repeatedly bonded; and a block in which silsesquioxane structure-containing structural units are repeatedly bonded.

Examples of styrene or styrene derivatives include styrene, styrene in which the hydrogen atom on the α-position has been substituted with an alkyl group or a halogenated alkyl group, or derivatives thereof. Examples of such derivatives include styrene in which the hydrogen atom on the α-position may be substituted and has a substituent bonded to the benzene ring. Examples of the substituent include an alkyl group of 1 to 5 carbon atoms, a halogenated alkyl group of 1 to 5 carbon atoms and a hydroxyalkyl group.

Specific examples of the styrene or derivative thereof include α-methylstyrene, 2-methylstyrene, 3-methylstyrene, 4-methylstyrene, 4-t-butylstyrene, 4-n-octylstyrene, 2,4,6-trimethylstyrene, 4-methoxystyrene, 4-t-butoxystyrene, 4-hydroxystyrene, 4-nitrostyrene, 3-nitrostyrene, 4-chlorostyrene, 4-fluorostyrene, 4-acetoxyvinylstyrene, and 4-vinylbenzylchloride.

Examples of (α-substituted) acrylate ester include an acrylate ester in which the hydrogen atom bonded to the carbon atom on the α-position is substituted with a substituent. Examples of the substituent include an alkyl group of 1 to 5 carbon atoms, a halogenated alkyl group of 1 to 5 carbon atoms and a hydroxyalkyl group.

Specific examples of the (α-substituted) acrylate ester include acrylate esters such as methyl acrylate, ethyl acrylate, propyl acrylate, n-butyl acrylate, t-butyl acrylate, cyclohexyl acrylate, octyl acrylate, nonyl acrylate, hydroxyethyl acrylate, hydroxypropyl acrylate, benzyl acrylate, anthracene acrylate, glycidyl acrylate, 3,4-epoxycyclohexylmethane acrylate, and propyltrimethoxysilane acrylate; and methacrylate esters such as methyl methacrylate, ethyl methacrylate, propyl methacrylate n-butyl methacrylate, t-butyl methacrylate, cyclohexyl methacrylate, octyl methacrylate, nonyl methacrylate, hydroxyethyl methacrylate, hydroxypropyl methacrylate, benzyl methacrylate, anthracene methacrylate, glycidyl methacrylate, 3,4-epoxycyclohexylmethane methacrylate, and propyltrimethoxysilane methacrylate.

Examples of (α-substituted) acrylic acid include acrylic acid in which the hydrogen atom bonded to the carbon atom on the α-position is substituted with a substituent. Examples of the substituent include an alkyl group of 1 to 5 carbon atoms, a halogenated alkyl group of 1 to 5 carbon atoms and a hydroxyalkyl group.

Examples of (α-substituted) acrylic acid include acrylic acid and methacrylic acid.

Examples of siloxane and siloxane derivatives include dimethylsiloxane, diethylsiloxane, diphenylsiloxane, and methylphenylsiloxane.

Examples of the alkylene oxide include ethylene oxide, propylene oxide, isopropylene oxide and butylene oxide.

As the silsesquioxane structure-containing structural unit, polyhedral oligomeric silsesquioxane structure-containing structural unit is preferable. As a monomer which provides a polyhedral oligomeric silsesquioxane structure-containing structural unit, a compound having a polyhedral oligomeric silsesquioxane structure and a polymerizable group can be mentioned.

Examples of the polymeric compound (BCP-1) include a polymeric compound in which a block having structural units derived from styrene or a styrene derivative repeatedly bonded, and a block having structural units derived from an (α-substituted) acrylate ester repeatedly bonded, are bonded together; a polymeric compound in which a block having structural units derived from styrene or a styrene derivative repeatedly bonded, and a block having structural units derived from an (α-substituted) acrylic acid repeatedly bonded, are bonded together; a polymeric compound in which a block having structural units derived from styrene or a styrene derivative repeatedly bonded, and a block having structural units derived from siloxane or a derivative thereof repeatedly bonded, are bonded together; a polymeric compound in which a block having structural units derived from alkyleneoxide repeatedly bonded, and a block having structural units derived from an (α-substituted) acrylate ester repeatedly bonded, are bonded together; a polymeric compound in which a block having structural units derived from alkyleneoxide repeatedly bonded, and a block having structural units derived from an (α-substituted) acrylic acid repeatedly bonded, are bonded together; a polymeric compound in which a block having structural units derived from having a polyhedral oligomeric silsesquioxane structure repeatedly bonded, and a block having structural units derived from an (α-substituted) acrylate ester repeatedly bonded, are bonded together; a polymeric compound in which a block having structural units derived from having a polyhedral oligomeric silsesquioxane structure repeatedly bonded, and a block having structural units derived from (α-substituted) acrylic acid repeatedly bonded, are bonded together; and a polymeric compound in which a block having structural units derived from structural units derived from having a polyhedral oligomeric silsesquioxane structure repeatedly bonded, and a block having structural units derived from siloxane or a derivative thereof repeatedly bonded, are bonded together.

Among these examples, as the polymeric compound (BCP-1), a polymeric compound in which a block having structural units derived from styrene or a styrene derivative repeatedly bonded, and a block having structural units derived from an (α-substituted) acrylate ester repeatedly bonded, are bonded together; or a polymeric compound in which a block having structural units derived from styrene or a styrene derivative repeatedly bonded, and a block having structural units derived from an (α-substituted) acrylic acid repeatedly bonded, are bonded together is preferable; a polymeric compound in which a block having structural units derived from styrene or a styrene derivative repeatedly bonded, and a block having structural units derived from an (α-substituted) acrylate ester repeatedly bonded, are bonded together is more preferable; and a polymeric compound in which a block having structural units derived from styrene or a styrene derivative repeatedly bonded, and a block having structural units derived from a (meth)acrylate ester repeatedly bonded, are bonded together is still more preferable.

Specific examples thereof include a polystyrene-polymethyl methacrylate (PS-PMMA) block copolymer, a polystyrene-polyethyl methacrylate block copolymer, a polystyrene-(poly-t-butyl methacrylate) block copolymer, a polystyrene-polymethacrylic acid block copolymer a polystyrene-polymethyl acrylate block copolymer, a polystyrene-polyethyl acrylate block copolymer, a polystyrene-(poly-t-butyl acrylate) block copolymer, and a polystyrene-polyacrylic acid block copolymer. Among these, a PS-PMMA block copolymer is most preferable.

The weight average molecular weight (Mw) (the polystyrene equivalent value determined by gel permeation chromatography) of each polymer constituting the block copolymer is not particularly limited as long as it is large enough to cause phase separation. The weight average molecular weight is preferably 5,000 to 500,000, more preferably 5,000 to 400,000, and still more preferably 5,000 to 300,000.

The weight average molecular weight (Mw) of the block copolymer is not particularly limited as long as it is large enough to cause phase separation. The weight average molecular weight is preferably 5,000 to 100,000, more preferably 20,000~60,000, and still more preferably 30,000 to 50,000.

The polydispersity (Mw/Mn) of the block copolymer is preferably 1.0 to 3.0, more preferably 1.0 to 1.5, and still more preferably 1.0 to 1.2. Here, Mn is the number average molecular weight.

The period of the block copolymer (the length of 1 molecule of the block copolymer) is preferably 5 to 50 nm, more preferably 10 to 40 nm, and still more preferably 20 to 30 nm.

Organic Solvent

A BCP composition can be prepared by dissolving the above block copolymer in an organic development. The organic solvent is the same as defined for the organic solvent usable for the brush composition.

The amount of the organic solvent in the BCP composition is not particularly limited, and is adjusted appropriately to a concentration that enables application of a coating solution depending on the thickness of the coating film. In general, the organic solvent is used in an amount that yields a solid content for the block copolymer that is within a range from 0.2 to 70% by weight, and preferably from 0.2 to 50% by weight.

If desired, in addition to the block copolymer and the organic solvent, other miscible additives can also be added to the BCP composition. Examples of such miscible additives include additive resins for improving the performance of the layer of the brush layer, surfactants for improving the applicability, dissolution inhibitors, plasticizers, stabilizers, colorants, halation prevention agents, dyes, sensitizers, base amplifiers and basic compounds.

Third Aspect: Brush Composition

A third aspect of the present invention is a brush composition used for phase-separation of a layer containing a block copolymer formed on a substrate, the block copolymer having a hydrophobic polymer block (b11) and a hydrophilic polymer block (b21) bonded together.

The brush composition is useful as a surface modifier for a substrate in the formation of a fine structure by directed self-assembly (DSA) of a block copolymer. By applying the brush composition on the substrate to form a brush layer, the substrate surface exhibits a high affinity for the hydrophobic polymer block (b11) or the hydrophilic polymer block (b21) constituting block copolymer.

(Block Copolymer)

A block copolymer is a polymeric compound in which plurality of partial constitutional components (blocks) in which the same kind of structural unit is repeatedly bonded are bonded. In the third aspect of the present invention, the block copolymer is a polymeric compound in which a hydrophobic polymer block (b11) and a hydrophilic polymer block (b21) bonded together. The block copolymer is the same as defined for the block copolymer in the first aspect.

<<Resin Component (A')>>

The brush composition according to the third aspect of the present invention contains a resin component (hereafter, referred to as "resin component (A')" or "component (A')").

The resin component (A') has a structural unit of a hydrophobic polymer block (b12) or a structural unit of a hydrophilic polymer (b22), and has a carboxy group on at least one terminal portion of the main chain thereof.

The hydrophobic polymer block (b12) (hereafter referred to simply as "block (b12)") is a block constituted of a polymer (hydrophobic polymer) obtained by polymerizing a monomer which exhibits relatively low affinity for water as compared to a monomer which provides a structural unit of the hydrophilic polymer block (b21) constituting the block copolymer. The structural unit of the block (b12) and the structural unit of the block (b11) may have the same structure, or different structures. Since the adhesion of the substrate to the layer containing a block copolymer via the brush layer becomes strong, the structural unit of the block (b12) and the structural unit of the block (b11) preferably have the same structure.

The hydrophilic polymer block (b22) (hereafter, referred to simply as "block (b22)") is a block constituted of a polymer (hydrophilic polymer) obtained by polymerizing a monomer which exhibits relatively low affinity for water as compared to a monomer which provides a structural unit of the hydrophobic polymer block (b11) constituting the block copolymer. The structural unit of the block (b22) and the structural unit of the block (b21) may have the same structure, or different structures. Since the adhesion of the substrate to the layer containing a block copolymer via the brush layer becomes strong, the structural unit of the block (b22) and the structural unit of the block (b21) preferably have the same structure.

Examples of the block (b12) and the block (b22) include a block in which structural units derived from styrene or a styrene derivative are repeatedly bonded; a block in which structural units derived from an (α-substituted) acrylate ester are repeatedly bonded; a block in which structural units derived from an (α-substituted) acrylic acid are repeatedly bonded; a block in which structural units derived from siloxane or a derivative thereof are repeatedly bonded; a block in which structural units derived from an alkyleneoxide are repeatedly bonded; and a block in which silsesquioxane structure-containing structural units are repeatedly bonded.

Styrene or styrene derivative, the (α-substituted) acrylate ester, the (α-substituted) acrylic acid, siloxane or derivative thereof, the alkyleneoxide and the monomer which provides a silsesquioxane structure-containing structural unit for the block (b12) and the block (b22) are the same as defined for the examples of compounds described for the block (b11) and the block (b21).

The carboxy group contained in the component (A') is bonded to at least one terminal portion of a main chain of at least one polymeric compound contained in the component (A').

Preferable examples of the component (A') include a polymeric compound having a structural unit of a hydrophobic polymer block (b12) and having a carboxy group on at least one terminal portion of the main chain thereof (hereafter, referred to as "component (A1')"), and a polymeric compound having a structural unit of a hydrophilic polymer block (b22) and having a carboxy group on at least one terminal portion of the main chain thereof (hereafter, referred to as "component (A2')").

In the present invention, the effects of the present invention is obtainable by either the component (A1) or the component (A2'); however, in terms of availability, the component (A1') can be preferably used.

[Component (A1')]

The component (A1') is a polymeric compound having a structural unit of a hydrophobic polymer block (b12) and a carboxy group on at least one terminal portion of the main chain thereof (main-chain terminal portion).

As the structural unit of the block (b12), in terms of reliably stabilizing the surface of the brush layer, a structural unit derived from styrene or a styrene derivative is preferable. Specifically, a structural unit (u1') containing a styrene skeleton which may have a substituent is more preferable.

Structural Unit (u1')

The structural unit (u1') is a structural unit containing a styrene skeleton which may have a substituent is more preferable.

A styrene skeleton having a substituent refers to styrene in which the hydrogen atom on the α-position is substituted and/or part or all of the hydrogen atoms on the benzene ring are substituted with a substituent.

Examples of the substituent for the structural unit (u1') include a halogen atom, or a linear, branched or cyclic hydrocarbon group of 1 to 20 carbon atoms optionally containing an oxygen atom, a halogen atom or a silicon atom, or a combination of the linear, branched or cyclic hydrocarbon group.

The halogen atom as the substituent for the structural unit (u1') is the same as defined for the halogen atom for $R^1$ in the aforementioned general formula (u1-1).

The hydrocarbon group as the substituent for the structural unit (u1') has 1 to 20 carbon atoms, and is the same as defined for the hydrocarbon group for $R^1$ in the aforementioned general formula (u1-1).

Preferable examples of the structural unit (u1') include a structural unit represented by general formula (u1'-1) shown below.

[Chemical Formula 23]

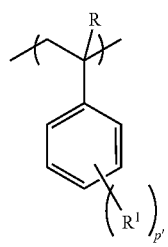

(u1'-1)

In the formula, R represents a hydrogen atom, an alkyl group of 1 to 5 carbon atoms or a halogenated alkyl group of 1 to 5 carbon atoms; $R^1$ represents a halogen atom, or a linear, branched or cyclic hydrocarbon group of 1 to 20 carbon atoms optionally containing an oxygen atom, a halogen atom or a silicon atom, or a combination of the linear, branched or cyclic hydrocarbon group; and p' represents an integer of 0 to 5.

In formula (u1'-1), R and $R^1$ are the same as defined for R and $R^1$ in the aforementioned general formula (u1-1).

In formula (u1'-1), p' represents an integer of 0 to 5, preferably an integer of 0 to 3, more preferably an integer of 0 to 2, still more preferably 0 or 1, and most preferably 1.

In formula (u1'-1) the bonding position of $R^1$ on the benzene ring is preferably the para position in that the phase-separation performance of the layer containing a block copolymer is further enhanced.

Specific examples of structural units of the block (b12) are shown below. In the formula, $R^\alpha$ represents a hydrogen atom or a methyl group.

[Chemical Formula 24]

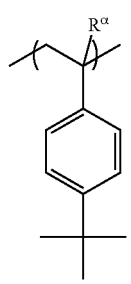

(u1'-1-1)

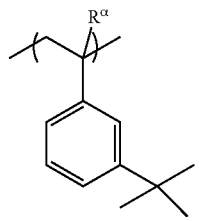

(u1'-1-2)

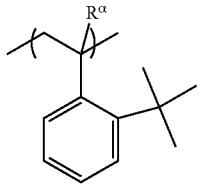

(u1'-1-3)

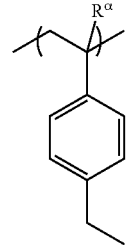

(u1'-1-4)

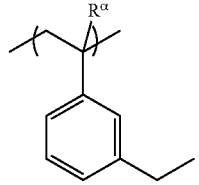

(u1'-1-5)

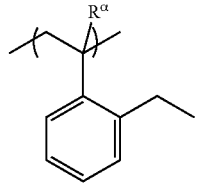

(u1'-1-6)

[Chemical Formula 25]

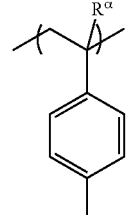

(u1'-1-7)

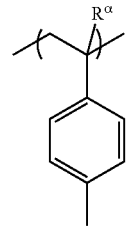

(u1'-1-8)

-continued
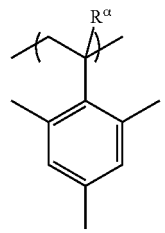 (u1'-1-9)
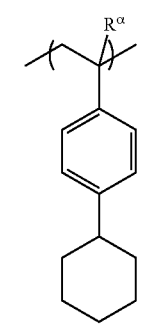 (u1'-1-10)
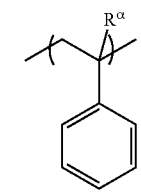 (u1'-1-11)
[Chemical Formula 26]
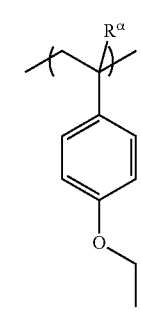 (u1'-1-12)
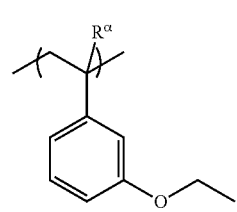 (u1'-1-13)
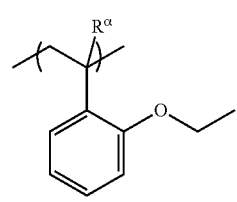 (u1'-1-14)
-continued
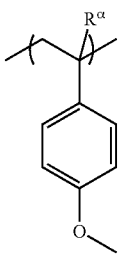 (u1'-1-15)
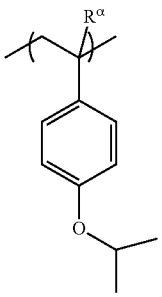 (u1'-1-16)
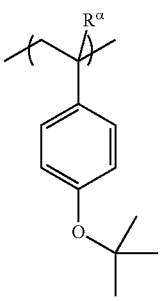 (u1'-1-17)
[Chemical Formula 27]
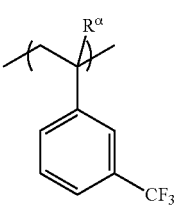 (u1'-1-18)
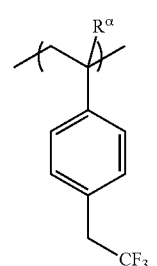 (u1'-1-19)
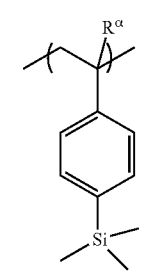 (u1'-1-20)

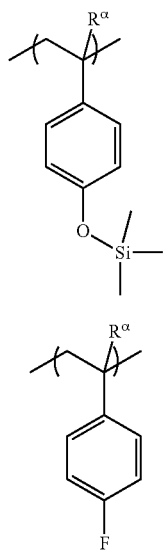

(u1'-1-21)

(u1'-1-22)

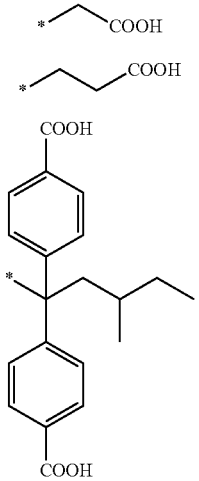

[Chemical Formula 28]

(mc'-1)

(mc'-2)

(mc'-3)

As the structural unit of the block (b12) contained in the component (A1'), 1 kind of structural unit may be used, or 2 or more kinds of structural units may be used in combination.

The structural unit of the block (b12) preferably includes the structural unit (u1').

As the structural unit (u1'), at least one member selected from the group consisting of structural units represented by chemical formulae (u'-1-1) to (u1'-1-22) is preferable, at least one member selected from the group consisting of structural units represented by chemical formulae (u1'-1-1) to (u1'-1-14) is more preferable, at least one member selected from the group consisting of structural units represented by chemical formulae (u1'-1-1) to (u1'-1-11) is still more preferable, at least one member selected from the group consisting of structural units represented by chemical formulae (u1'-1-1) to (u1'-1-6) and (u1'-1-11) is still more preferable, and at least one member selected from the group consisting of structural units represented by chemical formulae (u1'-1-1) to (u1'-1-3) and (u1'-1-11) is most preferable.

In the component (A1'), the amount of the structural unit of the block (b12) based on the combined total of all structural units constituting the component (A1') is preferably 25 mol % or more, more preferably 50 mol % or more, and still more preferably 75 to 100 mol %.

When the amount of the structural unit of the block (b12) is at least as large as the lower limit of the above-mentioned range, the surface of the brush layer becomes more stable, and the layer containing a block copolymer to be formed on the brush layer can be satisfactorily phase-separated.

The component (A1') has a carboxy group on at least one main-chain terminal portion.

In terms of further enhancing the phase-separation performance of the layer containing a block copolymer to be formed on the brush layer, the main-chain terminal preferably has 1 to 3 carboxy groups, more preferably 1 or 2 carboxy groups, and most preferably 1 carboxy group.

Specific examples of the main-chain terminal portion having a carboxy group are shown below. In the chemical formulae, "*" represents a valence bond.

Optional Structural Unit (Structural Unit (u3))

The component (A1') may include, in addition to the structural unit of the block (b12), an optional structural unit (structural unit (u3)), as long as the effects of the present invention are not impaired. Examples of the structural unit (u3) include structural units copolymerizable with the monomer which provides the structural unit (u1').

When the component (A1') includes the structural unit (u3), in the component (A1'), the amount of the structural unit (u3) based on the combined total of all structural units constituting the component (A1') is preferably from more than 0 mol % to 25 mol %.

Among the above examples, as the component (A1'), in terms of further enhancing the phase-separation performance of the layer containing a block copolymer to be formed on the brush layer, a polymeric compound having a structural unit (u1') and a carboxy group on just one terminal portion of the main chain thereof is preferable, and a polymeric compound having a structural unit (u1') and a carboxy group bonded to the main chain thereof is most preferable.

Preferable examples of the component (A1') include a polymeric compound represented by general formula (A1'-1) shown below. In the chemical formula, "x" represents the repeating number of the structural unit (the same applies hereafter).

[Chemical Formula 29]

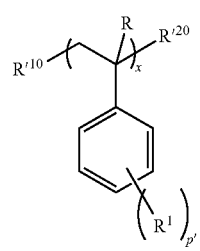

(A1'-1)

In the formula, R represents a hydrogen atom, an alkyl group of 1 to 5 carbon atoms or a halogenated alkyl group of 1 to 5 carbon atoms; $R'^{10}$ and $R'^{20}$ each independently represents a hydrogen atom, a hydrocarbon group of 1 to 5 carbon atoms, or a hydrocarbon group of 1 to 5 carbon atoms having a carboxy group; provided that at least one of $R'^{10}$ and $R'^{20}$ represents a hydrocarbon group of 1 to 5 carbon atoms having a carboxy group; $R^1$ and p' are the same as defined for $R^1$ and p' in formula (u1'-1) above.

In formula (A1'-1), R represents a hydrogen atom, an alkyl group of 1 to 5 carbon atoms or a halogenated alkyl group of 1 to 5 carbon atoms. In formula (A1'-1), R is the same as defined for R in formula (u1'-1) above.

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable, a hydrogen atom or a methyl group is still more preferable, and a hydrogen atom is most preferable.

In formula (A1'-1), the hydrocarbon group for $R'^{10}$ and $R'^{20}$ may be either an aliphatic hydrocarbon group or an aromatic hydrocarbon group.

The aliphatic hydrocarbon group as the hydrocarbon group for $R'^{10}$ and $R'^{20}$ may be either saturated or unsaturated, and preferably saturated. Examples of the aliphatic hydrocarbon group include a linear or branched aliphatic hydrocarbon group, and an aliphatic hydrocarbon group containing a ring in the structure thereof. Among these examples, a linear or branched aliphatic hydrocarbon group is preferable. Among these, a linear or branched alkyl group is preferable, and a linear or branched alkyl group of 1 to 5 carbon atoms is more preferable.

The aromatic hydrocarbon group for $R'^{10}$ and $R'^{20}$ is a hydrocarbon group having an aromatic ring. The aromatic ring is not particularly limited, as long as it is a cyclic conjugated compound having $(4n+2)\pi$ electrons, and may be either monocyclic or polycyclic. The aromatic ring preferably has 5 to 30 carbon atoms, more preferably 5 to 20, still more preferably 6 to 15, and most preferably 6 to 12. Examples of the aromatic ring include benzene and naphthalene. Examples of the aromatic hydrocarbon group for $R^{10}$ and $R^{20}$ include a group in which 1 or more hydrogen atoms have been removed from the above aromatic ring; a group in which 1 or more hydrogen atoms have been removed from an aromatic group containing 2 or more aromatic rings (such as biphenyl or fluorene); a group in which 1 hydrogen atom of the above aromatic ring or the above aromatic compound has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group); and a group in which 1 or more hydrogen atoms of the aforementioned linear or branched alkyl group have been substituted with an aromatic ring. The alkylene group which is bonded to the aforementioned aromatic ring or aromatic compound preferably has 1 to 4 carbon atoms, more preferably 1 or 2 carbon atoms, and most preferably 1 carbon atom.

In terms of further enhancing the phase-separation performance of the layer containing a block copolymer to be formed on the brush layer, in formula (A1'-1), the hydrocarbon group for at least one of $R'^{10}$ and $R'^{20}$ preferably has 1 to 3 carboxy groups, more preferably 1 or 2 carboxy groups, and most preferably 1 carboxy group.

Specific examples of the component (A1') are shown below. In the formula, $R^\alpha$ represents a hydrogen atom or a methyl group.

$R'^{21}$ in chemical formula (A1'-1-5) represents a hydrogen atom or a hydrocarbon group of 1 to 5 carbon atoms.

$R'^{22}$ in chemical formula (A1'-1-6) represents a hydrogen atom or a hydrocarbon group of 1 to 5 carbon atoms.

[Chemical Formula 30]

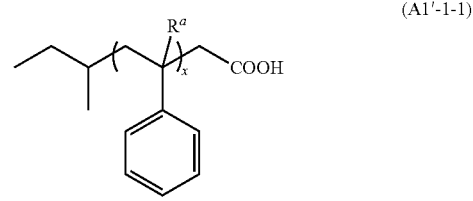
(A1'-1-1)

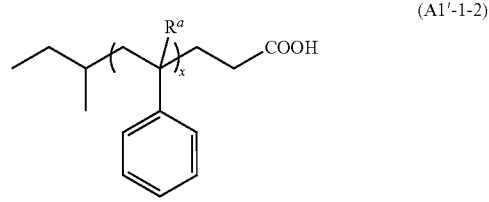
(A1'-1-2)

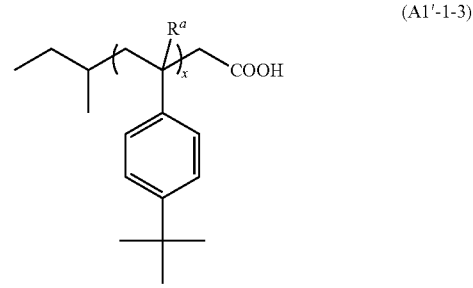
(A1'-1-3)

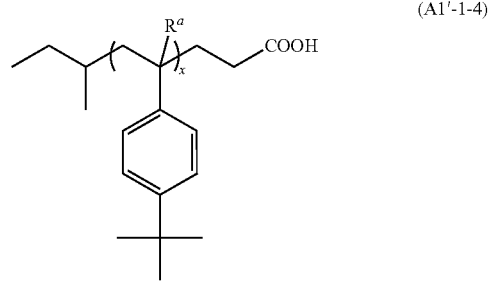
(A1'-1-4)

[Chemical Formula 31]

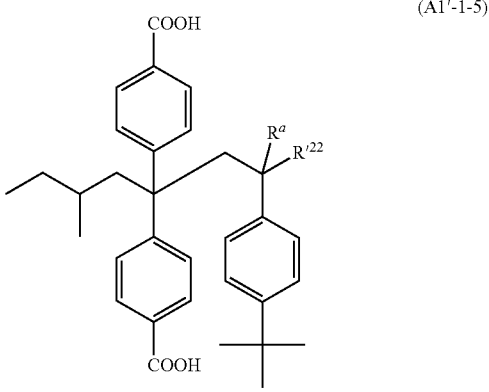
(A1'-1-5)

-continued

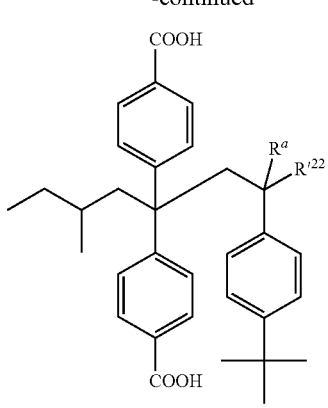

(A1'-1-6)

Among these example, as the component (A1'), at least one member selected from the group consisting of polymeric compounds represented by chemical formulae (A1'-1-1) to (A1'-1-6) is preferable, and at least one member selected from the group consisting of polymeric compounds represented by chemical formulae (A1'-1-1) to (A1'-1-4) is more preferable.

In terms of further enhancing the phase-separation performance of the layer containing a block copolymer to be formed on the brush layer, it is also preferable to use a polymeric compound represented by chemical formula (A1'-1-1) above (hereafter, referred to as "component (A1'-1-1)") in combination with a polymeric compound represented by chemical formula (A1'-1-3) above (hereafter, referred to as "component (A1'-1-3)").

When the component (A1'-1-1) is used in combination with the component (A1'-1-3), the weight ratio component (A1')/component (A2') is preferably 10/90 to 90/10, and more preferably 15/85 to 85/15. When the ratio (weight ratio) is within the above range, the surface of the brush layer becomes more stable, and the layer containing a block copolymer to be formed on the brush layer can be satisfactorily phase-separated.

In the component (A'), the amount of the component (A1') is preferably 15% by weight or more, more preferably 50% by weight or more, and may be even 100% by weight.

When the amount of the component (A1') is at least as large as the lower limit of the above range, the surface of the brush layer can be reliably stabilized, and the layer containing a block copolymer can be satisfactorily phase-separated.

[Component (A2')]

The component (A2') is a polymeric compound having a structural unit of a hydrophilic polymer block (b22) and a carboxy group (—COOH) on at least one terminal portion of the main chain thereof.

As the structural unit of the block (b22), in terms of reliably stabilizing the surface of the brush layer, a structural unit derived from an (α-substituted) acrylate ester or a structural unit derived from an (α-substituted) acrylic acid (i.e., structural unit (u2') derived from acrylic acid or an ester thereof which may have the hydrogen atom bonded to the carbon atom on the α-position substituted with a substituent) is preferable.

Structural Unit (u2)

The structural unit (u2') is a structural derived from acrylic acid or an ester thereof which may have the hydrogen atom bonded to the carbon atom on the α-position substituted with a substituent.

Preferable examples of the structural unit (u2') include a structural unit represented by general formula (u2'-1) shown below.

[Chemical Formula 32]

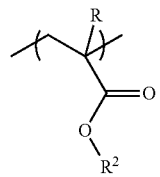

(u2'-1)

In the formula, R represents a hydrogen atom, an alkyl group of 1 to 5 carbon atoms or a halogenated alkyl group of 1 to 5 carbon atoms; and $R^2$ represents a linear or branched hydroxyalkyl group having 1 to 20 carbon atoms.

In formula (u2'-1), R represents a hydrogen atom, an alkyl group of 1 to 5 carbon atoms or a halogenated alkyl group of 1 to 5 carbon atoms. In formula (u2'-1), R is the same as defined for R in formula (u1'-1) above.

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable, a hydrogen atom or a methyl group is still more preferable, and a hydrogen atom is most preferable.

In formula (u2'-1), $R^2$ represents a linear or branched alkyl group of 1 to 20 carbon atoms or a linear or branched hydroxyalkyl group of 1 to 20 carbon atoms.

The hydroxyalkl group for $R^2$ is an alkyl group having 1 to 20 carbon atoms, preferably 1 to 10 carbon atoms, more preferably 1 to 8 carbon atoms, still more preferably 1 to 6 carbon atoms, and most preferably 1 to 4 carbon atoms, in which part or all of the hydrogen atoms of the alkyl group has been substituted with a hydroxy group. The number of the hydroxy group(s) is preferably 1 to 3, and more preferably 1 or 2.

The hydroxyalkyl group for $R^2$ may be linear or branched.

Specific examples of structural units of the block (b22) are shown below. In the formula, $R^\alpha$ represents a hydrogen atom or a methyl group.

[Chemical Formula 33]

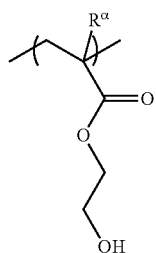

(u2'-1-1)

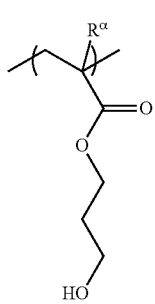

(u2'-1-2)

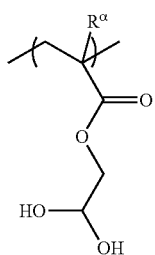

(u2'-1-3)

As the structural unit of the block (b22) contained in the component (A2'), 1 kind of structural unit may be used, or 2 or more kinds of structural units may be used in combination.

The structural unit of the block (b22) preferably includes the structural unit (u2').

As the structural unit (u2'), at least one member selected from the group consisting of structural units represented by chemical formulae (u2'-1-1) to (u2'-1-3) is preferable, and a structural unit represented by chemical formula (u2'-1-1) is most preferable.

In the component (A2'), the amount of the structural unit of the block (b22) based on the combined total of all structural units constituting the component (A2') is preferably 25 mol % or more, more preferably 50 mol % or more, and still more preferably 75 to 100 mol %.

When the amount of the structural unit of the block (b22) is at least as large as the lower limit of the above-mentioned range, the surface of the brush layer becomes more stable, and the layer containing a block copolymer to be formed on the brush layer can be satisfactorily phase-separated.

The component (A2') has a carboxy group on at least one main-chain terminal portion.

In terms of further enhancing the phase-separation performance of the layer containing a block copolymer to be formed on the brush layer, the main-chain terminal preferably has 1 to 3 carboxy groups, more preferably 1 or 2 carboxy groups, and most preferably 1 carboxy group.

Examples of the main-chain terminal portion having a carboxy group include groups represented by the aforementioned chemical formulae (mc'-1), (mc'-2) and (mc'-3).

Optional Structural Unit (Structural Unit (u4'))

The component (A2') may include, in addition to the structural unit of the block (b22), an optional structural unit (structural unit (u4')), as long as the effects of the present invention are not impaired. Examples of the structural unit (u4') include structural units copolymerizable with the monomer which provides the structural unit (u2').

When the component (A2') includes the structural unit (u4'), in the component (A2'), the amount of the structural unit (u4') based on the combined total of all structural units constituting the component (A2') is preferably from more than 0 mol % to 25 mol %.

Among the above examples, as the component (A2'), in terms of further enhancing the phase-separation performance of the layer containing a block copolymer to be formed on the brush layer, a polymeric compound having a structural unit (u2') and a carboxy group on just one terminal portion of the main chain thereof is preferable, and a polymeric compound having a structural unit (u2') and a carboxy group bonded to the main chain thereof is most preferable.

Preferable examples of the component (A2') include a polymeric compound represented by general formula (A2'-1) shown below.

[Chemical Formula 34]

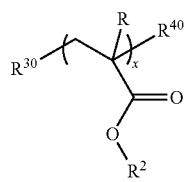

(A2'-1)

In the formula, R represents a hydrogen atom, an alkyl group of 1 to 5 carbon atoms or a halogenated alkyl group of 1 to 5 carbon atoms; $R^{30}$ and $R^{40}$ each independently represents a hydrogen atom, a hydrocarbon group of 1 to 5 carbon atoms, or a hydrocarbon group of 1 to 5 carbon atoms having a carboxy group; provided that at least one of $R^{30}$ and $R^{40}$ represents a hydrocarbon group of 1 to 5 carbon atoms having a carboxy group; $R^2$ is the same as defined for $R^2$ in the aforementioned formula (u2'-1).

In formula (A2'-1), R represents a hydrogen atom, an alkyl group of 1 to 5 carbon atoms or a halogenated alkyl group of 1 to 5 carbon atoms. In formula (A2'-1), R is the same as defined for R in formula (u2'-1) above.

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable, a hydrogen atom or a methyl group is still more preferable, and a hydrogen atom is most preferable.

In formula (A2'-1), $R^{30}$ and $R^{40}$ are the same as defined for $R^{'10}$ and $R^{'20}$ in the aforementioned formula (A1'-1), respectively.

Specific examples of the component (A2') are shown below. In the formula, $R^\alpha$ represents a hydrogen atom or a methyl group.

In chemical formula (A2'-0-1), $R^{41}$ represents a hydrogen atom or a hydrocarbon group of 1 to 5 carbon atoms.

[Chemical Formula 35]

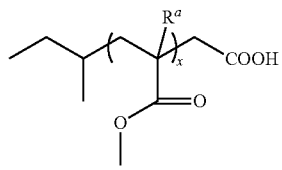

(A2'-1-1)

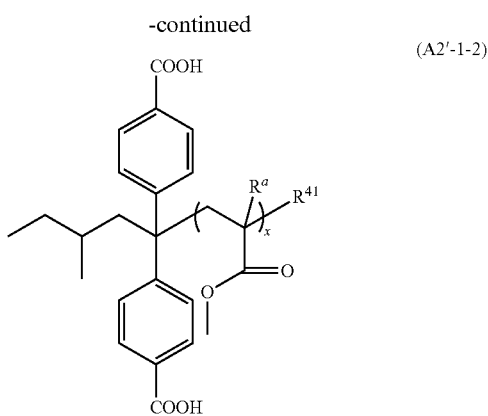

(A2'-1-2)

Among the above examples, as the component (A2'), at least one member selected from polymeric compounds represented by chemical formulae (A2'-1-1) and (A2'-1-2) is preferable, and a polymeric compounds represented by chemical formula (A2'-1-1) is more preferable.

In the component (A'), the amount of the component (A2') is preferably 15% by weight or more, more preferably 50% by weight or more, and may be even 100% by weight. When the amount of the component (A2') is at least as large as the lower limit of the above range, the surface of the brush layer can be reliably stabilized, and the layer containing a block copolymer can be satisfactorily phase-separated.

In the brush composition of the present invention, as the component (A'), 1 kind of polymeric compound may be used, or 2 or more kinds of polymeric compounds may be used in combination.

The component (A') preferably contains at least one polymeric compound selected from the group consisting of the (A1') and the component (A2').

The component (A') may contain a polymeric compound other than the component (A1') or the component (A2') as long as the component (A') has a structural unit of a hydrophobic polymer block (b12) or a structural unit of a hydrophilic polymer block (b22), and has a carboxy group on at least one terminal portion of the main chain thereof.

The weight average molecular weight (Mw) (the polystyrene equivalent value determined by gel permeation chromatography (GPC)) of the component (A') is not particularly limited, but is preferably 1,000 to 200,000, more preferably 1,500 to 200,000, and still more preferably 2,000 to 150,000.

When the weight average molecular weight is no more than the upper limit of the above preferable range, the component (A) satisfactorily dissolves in an organic solvent described later, and the coatability on a substrate becomes excellent. On the other hand, when the weight average molecular weight is at least as large as the lower limit of the above preferable range, the production stability of the polymeric compound becomes excellent, and the brush composition exhibits excellent coatability on a substrate.

The molecular weight dispersity (Mw/Mn) of the component (A') is not particularly limited, but is preferably 1.0 to 5.0, more preferably 1.0 to 3.0, and most preferably 1.0 to 2.5. Here, Mn is the number average molecular weight.

The component (A') can be obtained, for example, by a conventional radical polymerization or the like of the monomers corresponding with each of the structural units, using a radical polymerization initiator such as azobisisobutyronitrile (AIBN). Further, in the polymerization of the component (A), for example, an initiator such as $CH_3$—$CH_2$—$CH$($CH_3$)—Li may be used.

Furthermore, in the polymerization of the component (A), for example, terminal modifier such as isobutylene sulfide may be used.

As the monomers for deriving the corresponding structural units, commercially available monomers may be used, or the monomers may be synthesized by a conventional method.

In the brush composition of the present invention, the amount of the component (A') can be appropriately adjusted depending on the thickness of the brush layer, and the like.

In the brush composition of the present invention, the amount of the component (A') based on the whole solid content is preferably 70% by weight or more, more preferably 90% by weight or more, and still more preferably 95% by weight or more.

<Optional Components>

The brush composition according to the third aspect of the present invention may contain, in addition to the component (A'), a component (optional component) other than the component (A').

Examples of the optional component include the acid-generator component (B) in the first aspect, and miscible additives in the first aspect.

Organic Solvent (S)

The brush composition according to the first aspect of the present invention can be produced by dissolving the raw materials including the component (A') and the component (B) and the like if desired, in an organic solvent (hereafter, referred to as "component (S)").

The component (S) is the same as defined for the component (S) described in the first aspect.

(Water Contact Angle on the Surface of the Brush Layer Formed on the Substrate)

In the case where the brush composition according to the third aspect of the present invention contains a resin component having a structural unit of a hydrophobic polymer block (b12), a brush layer formed on a substrate using the brush composition preferably has a water contact angle of 80° or more, more preferably 90° or more.

Alternatively, in the case where the brush composition according to the third aspect of the present invention contains a resin component having a structural unit of a hydrophilic polymer block (b22), a brush layer formed on a substrate using the brush composition preferably has a water contact angle of from 30 to 80'.

When the value of the contact angle is within the above preferable range, the adhesion of the substrate to the layer containing a block copolymer via the brush layer becomes strong. As a result, the phase-separation performance of the layer containing a block copolymer formed on the brush layer is improved.

The water contact angle is measured in the same manner as in the first aspect.

The brush composition according to the third aspect of the present invention described heretofore contains a resin component having a structural unit of a hydrophobic polymer block (b12) or a structural unit of a hydrophilic polymer block (b22), and having a carboxy group on at least one terminal portion of the main chain thereof.

When the brush composition is used as a surface modifier for a substrate which is used for phase-separation of a layer containing a block copolymer formed on the substrate, the adhesion of the substrate to the layer containing a block copolymer via the brush layer formed of the brush composition becomes strong. It is presumed that, in this manner, the phase-separation performance of the block copolymer can be improved.

Further, with respect to the brush composition, since the surface state of the brush layer is stable, there is no need to select a neutral layer material which can obtain a brush layer having a surface free energy of a predetermined value each time, depending on the kind of the block copolymer used. Therefore, the brush composition can be conveniently used.

Fourth Embodiment: Method of Producing a Structure Containing a Phase-Separated Structure A fourth aspect of the present invention is a method of producing a structure containing a phase-separated structure, the method including: a step of applying the brush composition of the third aspect to form a brush layer (hereafter, referred to as "step (i')"); a step of forming a layer containing a block copolymer on the brush layer, the block copolymer having a hydrophobic polymer block (b11) and a hydrophilic polymer block (b21) bonded together (hereafter, referred to as "step (ii')"); and a step of phase-separating the layer containing the block copolymer (hereafter, referred to as "step (iii')").

Step (i'), step (ii') and step (iii') are the same as defined for step (i), step (ii) and step (iii), respectively. Further, BCP composition can be prepared in the same manner as in the second aspect.

Fifth Aspect: Brush Composition

A fifth aspect of the present invention is a brush composition used for phase-separation of a layer containing a block copolymer formed on a substrate, the block copolymer having a hydrophobic polymer block (b11) and a hydrophilic polymer block (b21) bonded together.

The brush composition is useful as a surface modifier for a substrate in the formation of a fine structure by directed self-assembly (DSA) of a block copolymer. By applying the brush composition on the substrate to form a brush layer, the substrate surface exhibits a high affinity for the hydrophobic polymer block (b11) or the hydrophilic polymer block (b21) constituting block copolymer.

(Block Copolymer)

A block copolymer is a polymeric compound in which plurality of partial constitutional components (blocks) in which the same kind of structural unit is repeatedly bonded are bonded. In the present invention, the block copolymer is a polymeric compound in which a hydrophobic polymer block (b11) and a hydrophilic polymer block (b21) bonded together. The block copolymer is the same as defined for the block copolymer in the first aspect.

<<Resin Component (A")>>

The brush composition according to the fifth aspect of the present invention contains a resin component (hereafter, referred to as "resin component (A")" or "component (A")").

The resin component has a structural unit of a hydrophobic polymer block (b12) or a structural unit of a hydrophilic polymer (b22), and has at least 2 hydroxy groups on at least one terminal portion of the main chain thereof.

The hydrophobic polymer block (b12) and the hydrophilic polymer (b22) are the same as defined for the hydrophobic polymer block (b12) and the hydrophilic polymer (b22) in the third aspect.

[Component (A")]

The component (A") is a polymeric compound having a structural unit of a hydrophobic polymer block (b12) and at least 2 hydroxy groups on at least one terminal portion of the main chain thereof (main-chain terminal portion).

As the structural unit of the block (b12), in terms of reliably stabilizing the surface of the brush layer, a structural unit derived from styrene or a styrene derivative is preferable. Specifically, a structural unit (u1') containing a styrene skeleton which may have a substituent is more preferable.

The structural unit (u1') is the same as defined for the structural unit (u1') in the third aspect.

The component (A") has at least 2 hydroxy groups on at least one main-chain terminal portion.

In terms of further enhancing the phase-separation performance of the layer containing a block copolymer to be formed on the brush layer, the main-chain terminal preferably has 2 or 3 hydroxy groups, and more preferably 2 hydroxy groups.

Further, it is preferable that 500 or more of the hydroxy groups on the main-chain terminal portion is a primary hydroxy group.

Specific examples of the main-chain terminal portion having at least 2 hydroxy groups are shown below. In the chemical formulae, "*" represents a valence bond.

[Chemical Formula 36]

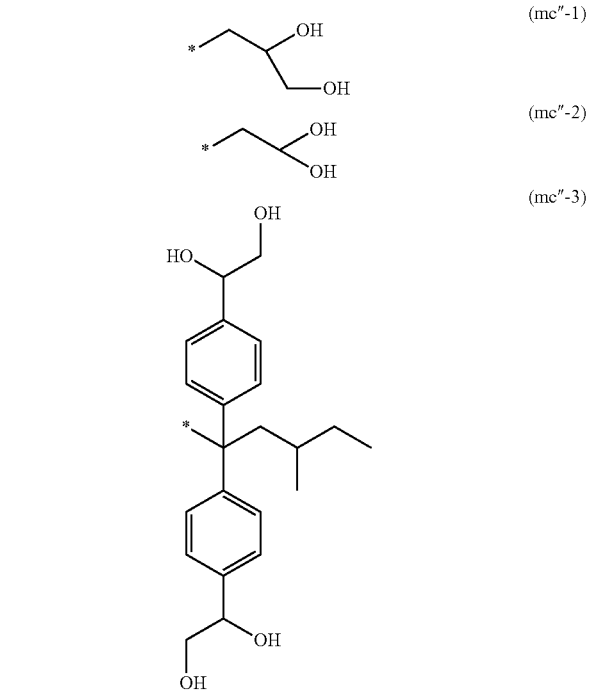

Optional Structural Unit (Structural Unit (u3))

The component (A") may include, in addition to the structural unit of the block (b12), an optional structural unit (structural unit (u3)), as long as the effects of the present invention are not impaired. Examples of the structural unit (u3) include structural units copolymerizable with the monomer which provides the structural unit (u1').

When the component (A1') includes the structural unit (u3), in the component (A1"), the amount of the structural unit (u3) based on the combined total of all structural units constituting the component (A1") is preferably from more than 0 mol % to 25 mol %.

Among the above examples, as the component (A1"), in terms of further enhancing the phase-separation performance of the layer containing a block copolymer to be formed on the brush layer, a polymeric compound having a structural unit (u1') and at least 2 hydroxy groups on just one terminal portion of the main chain thereof is preferable, and a polymeric compound having a structural unit (u1') and at least 2 hydroxy groups bonded to the main chain thereof is most preferable.

Preferable examples of the component (A1") include a polymeric compound represented by general formula (A1"-1) shown below. In the chemical formula, "x" represents the repeating number of the structural unit (the same applies hereafter).

[Chemical Formula 37]

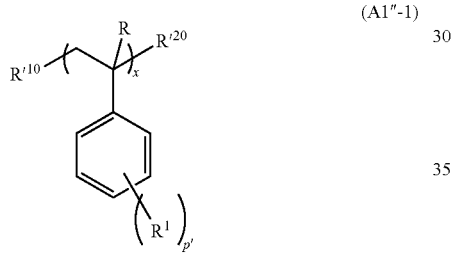

(A1"-1)

In the formula, R represents a hydrogen atom, an alkyl group of 1 to 5 carbon atoms or a halogenated alkyl group of 1 to 5 carbon atoms; $R''^{10}$ and $R''^{20}$ each independently represents a hydrogen atom, a hydrocarbon group of 1 to 5 carbon atoms, or a hydrocarbon group of 1 to 5 carbon atoms having at least 2 hydroxy groups; provided that at least one of $R''^{10}$ and $R''^{20}$ represents a hydrocarbon group of 1 to 5 carbon atoms having at least 2 hydroxy groups (—OH); $R^1$ and p' are the same as defined for $R^1$ and p' in formula (u1'-1) above.

In formula (A1"-1), R represents a hydrogen atom, an alkyl group of 1 to 5 carbon atoms or a halogenated alkyl group of 1 to 5 carbon atoms. In formula (A1"-1), R is the same as defined for R in formula (u1'-1) above.

In formula (A1"-1), the hydrocarbon group for $R''^{10}$ and $R''^{20}$ are the same as defined for $R'^{10}$ and $R'^{20}$ in the aforementioned formula (A1'-1), respectively.

In terms of further enhancing the phase-separation performance of the layer containing a block copolymer to be formed on the brush layer, in formula (A1"-1), the hydrocarbon group for at least one of $R''^{10}$ and $R''^{20}$ preferably has 2 or 3 hydroxy groups, and more preferably 2 hydroxy groups.

Specific examples of the component (A1") are shown below. In the formula, $R^\alpha$ represents a hydrogen atom or a methyl group.

$R''^{21}$ in chemical formula (A1"-1-5) represents a hydrogen atom or a hydrocarbon group of 1 to 5 carbon atoms.

$R''^{22}$ in chemical formula (A1"-1-6) represents a hydrogen atom or a hydrocarbon group of 1 to 5 carbon atoms.

[Chemical Formula 38]

(A1"-1-1)

(A1"-1-2)

(A1"-1-3)

(A1"-1-4)

[Chemical Formula 39]

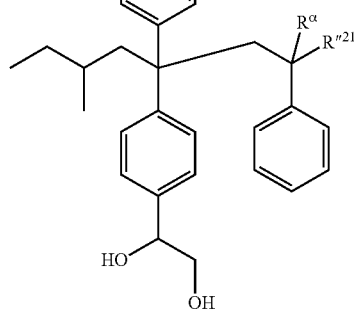

(A1"-1-5)

-continued

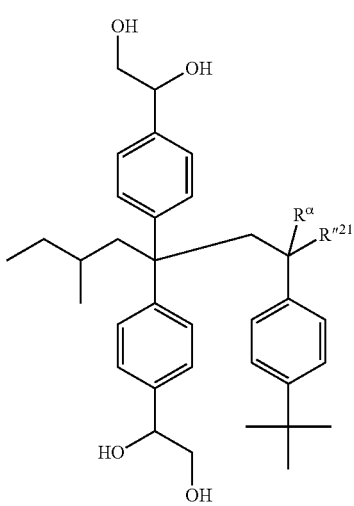

(A1″-1-6)

Among the above examples, as the component (A1″), at least one member selected from polymeric compounds represented by chemical formulae (A1″-1-1) to (A1″-1-6) is preferable, and at least one member selected from polymeric compounds represented by chemical formulae (A1″-1-1) to (A1″-1-4) is more preferable.

In terms of further enhancing the phase-separation performance of the layer containing a block copolymer to be formed on the brush layer, it is also preferable to use a polymeric compound represented by chemical formula (A1″-1-1) above (hereafter, referred to as "component (A1″-1-1)") in combination with a polymeric compound represented by chemical formula (A1″-1-3) above (hereafter, referred to as "component (A1″-1-3)").

When the component (A1″-1-1) is used in combination with the component (A1″-1-3), the weight ratio component (A1′)/component (A2″) is preferably 10/90 to 90/10, and more preferably 15/85 to 85/15. When the ratio (weight ratio) is within the above range, the surface of the brush layer becomes more stable, and the layer containing a block copolymer to be formed on the brush layer can be satisfactorily phase-separated.

In the component (A″), the amount of the component (A1″) is preferably 15% by weight or more, more preferably 50% by weight or more, and may be even 100% by weight.

When the amount of the component (A1″) is at least as large as the lower limit of the above range, the surface of the brush layer can be reliably stabilized, and the layer containing a block copolymer can be satisfactorily phase-separated.

[Component (A2″)]

The component (A2″) is a polymeric compound having a structural unit of a hydrophilic polymer block (b22) and at least 2 hydroxy groups on at least one terminal portion of the main chain thereof (main-chain terminal portion).

As the structural unit of the block (b22), in terms of reliably stabilizing the surface of the brush layer, a structural unit derived from an (α-substituted) acrylate ester or a structural unit derived from an (α-substituted) acrylic acid (i.e., structural unit (u2′) derived from acrylic acid or an ester thereof which may have the hydrogen atom bonded to the carbon atom on the α-position substituted with a substituent) is preferable.

The structural unit (u2′) is the same as defined for the structural unit (u2′) in the third aspect.

As the structural unit of the block (b22) contained in the component (A2″), 1 kind of structural unit may be used, or 2 or more kinds of structural units may be used in combination.

The structural unit of the block (b22) preferably includes the structural unit (u2′).

As the structural unit (u2′), at least one member selected from the group consisting of structural units represented by chemical formulae (u2′-1-1) to (u2′-1-3) is preferable, and a structural unit represented by chemical formula (u2′-1-1) is most preferable.

In the component (A2″), the amount of the structural unit of the block (b22) based on the combined total of all structural units constituting the component (A2′) is preferably 25 mol % or more, more preferably 50 mol % or more, and still more preferably 75 to 100 mol %.

When the amount of the structural unit of the block (b22) is at least as large as the lower limit of the above-mentioned range, the surface of the brush layer becomes more stable, and the layer containing a block copolymer to be formed on the brush layer can be satisfactorily phase-separated.

The component (A2″) has at least 2 hydroxy groups on at least one main-chain terminal portion.

In terms of further enhancing the phase-separation performance of the layer containing a block copolymer to be formed on the brush layer, the main-chain terminal preferably has 2 or 3 hydroxy groups, and more preferably 2 hydroxy groups.

Examples of the main-chain terminal portion having hydroxy groups include groups represented by the aforementioned chemical formulae (mc″-1), (mc″-2) and (mc″-3).

Optional Structural Unit (Structural Unit (u4″))

The component (A2″) may include, in addition to the structural unit of the block (b22), an optional structural unit (structural unit (u4″)), as long as the effects of the present invention are not impaired. Examples of the structural unit (u4) include structural units copolymerizable with the monomer which provides the structural unit (u2′).

When the component (A2″) includes the structural unit (u4″), in the component (A2″), the amount of the structural unit (u4″) based on the combined total of all structural units constituting the component (A2″) is preferably from more than 0 mol % to 25 mol %.

Among the above examples, as the component (A2″), in terms of further enhancing the phase-separation performance of the layer containing a block copolymer to be formed on the brush layer, a polymeric compound having a structural unit (u2′) and a carboxy group on just one terminal portion of the main chain thereof is preferable, and a polymeric compound having a structural unit (u2) and a carboxy group bonded to the main chain thereof is most preferable.

Preferable examples of the component (A2″) include a polymeric compound represented by general formula (A2″-1) shown below.

[Chemical Formula 40]

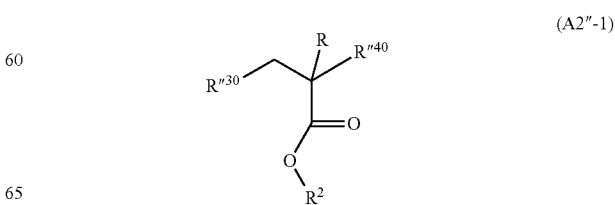

(A2″-1)

In the formula, R represents a hydrogen atom, an alkyl group of 1 to 5 carbon atoms or a halogenated alkyl group of 1 to 5 carbon atoms; $R''^{30}$ and $R''^{40}$ each independently represents a hydrogen atom, a hydrocarbon group of 1 to 5 carbon atoms, or a hydrocarbon group of 1 to 5 carbon atoms having at least 2 hydroxy groups (—OH); provided that at least one of $R''^{30}$ and $R''^{40}$ represents a hydrocarbon group of 1 to 5 carbon atoms having at least 2 hydroxy groups (—OH); $R^2$ is the same as defined for $R^2$ in the aforementioned formula (u2'-1).

In formula (A2"-1), R represents a hydrogen atom, an alkyl group of 1 to 5 carbon atoms or a halogenated alkyl group of 1 to 5 carbon atoms. In formula (A2"-1), R is the same as defined for R in formula (u2'-1) above.

As R, a hydrogen atom, an alkyl group of 1 to 5 carbon atoms or a fluorinated alkyl group of 1 to 5 carbon atoms is preferable, a hydrogen atom or an alkyl group of 1 to 5 carbon atoms is more preferable, a hydrogen atom or a methyl group is still more preferable, and a hydrogen atom is most preferable.

In formula (A2"-1), $R''^{30}$ and $R''^{40}$ are the same as defined for $R''^{10}$ and $R''^{20}$ in the aforementioned formula (A1"-1), respectively.

Specific examples of the component (A2") are shown below. In the formula, $R^\alpha$ represents a hydrogen atom or a methyl group.

In chemical formula (A2"-1-2), $R''^{41}$ represents a hydrogen atom or a hydrocarbon group of 1 to 5 carbon atoms.

[Chemical Formula 41]

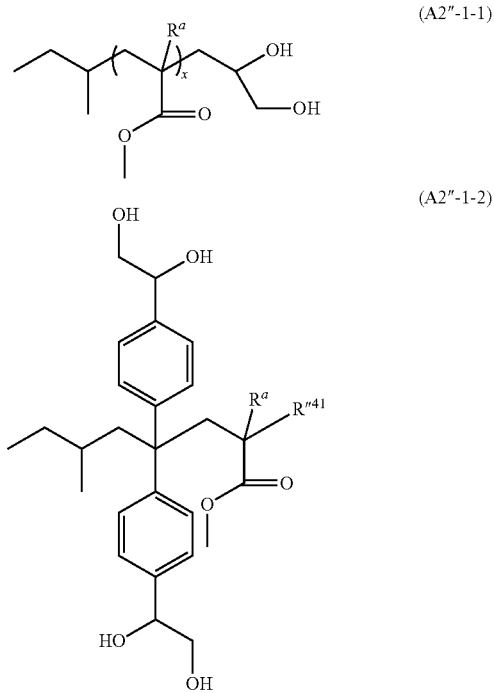

Among these examples, as the component (A2"), at least one member selected from polymeric compounds represented by chemical formulae (A2"-1-1) and (A2"-1-2) is preferable, and a polymeric compounds represented by chemical formula (A2"-1-1) is more preferable.

In the component (A"), the amount of the component (A2") is preferably 15% by weight or more, more preferably 50% by weight or more, and may be even 100% by weight. When the amount of the component (A2") is at least as large as the lower limit of the above range, the surface of the brush layer can be reliably stabilized, and the layer containing a block copolymer can be satisfactorily phase-separated.

In the brush composition according to the fifth aspect of the present invention, as the component (A"), 1 kind of polymeric compound may be used, or 2 or more kinds of polymeric compounds may be used in combination.

The component (A") preferably contains at least one polymeric compound selected from the group consisting of the (A1") and the component (A2").

The component (A") may contain a polymeric compound other than the component (A1") or the component (A2") as long as the component (A") has a structural unit of a hydrophobic polymer block (b12) or a structural unit of a hydrophilic polymer block (b22), and has at least 2 hydroxy groups (—OH) on at least one terminal portion of the main chain thereof.

The weight average molecular weight (Mw) (the polystyrene equivalent value determined by gel permeation chromatography (GPC)) of the component (A") is not particularly limited, but is preferably 1,000 to 200,000, more preferably 1,500 to 200,000, and still more preferably 2,000 to 150,000.

When the weight average molecular weight is no more than the upper limit of the above preferable range, the component (A) satisfactorily dissolves in an organic solvent described later, and the coatability on a substrate becomes excellent. On the other hand, when the weight average molecular weight is at least as large as the lower limit of the above preferable range, the production stability of the polymeric compound becomes excellent, and the brush composition exhibits excellent coatability on a substrate.

The molecular weight dispersity (Mw/Mn) of the component (A") is not particularly limited, but is preferably 1.0 to 5.0, more preferably 1.0 to 3.0, and most preferably 1.0 to 2.5. Here, Mn is the number average molecular weight.

The component (A") can be obtained, for example, by a conventional radical polymerization or the like of the monomers corresponding with each of the structural units, using a radical polymerization initiator such as azobisisobutyronitrile (AIBN). Further, in the polymerization of the component (A), for example, an initiator such as $CH_3$—$CH_2$—CH($CH_3$)—Li may be used.

Furthermore, in the polymerization of the component (A"), for example, terminal modifier such as isobutylene sulfide may be used.

As the monomers for deriving the corresponding structural units, commercially available monomers may be used, or the monomers may be synthesized by a conventional method.

In the brush composition of the present invention, the amount of the component (A") can be appropriately adjusted depending on the thickness of the brush layer, and the like.

In the brush composition of the present invention, the amount of the component (A") based on the whole solid content is preferably 70% by weight or more, more preferably 90% by weight or more, and still more preferably 95% by weight or more.

<Optional Components>

The brush composition of the present invention may contain, in addition to the component (A"), a component (optional component) other than the component (A").

Examples of the optional component include the acid-generator component (B) in the first aspect, and miscible additives in the first aspect.

Organic Solvent (S)

The brush composition according to the fifth aspect of the present invention can be produced by dissolving the raw materials including the component (A") and the component (B) and the like if desired, in an organic solvent (hereafter, referred to as "component (S)").

The component (S) is the same as defined for the component (S) described in the first aspect.

(Water Contact Angle on the Surface of the Brush Layer Formed on the Substrate)

In the case where the brush composition according to the fifth aspect of the present invention contains a resin component having a structural unit of a hydrophobic polymer block (b12), a brush layer formed on a substrate using the brush composition preferably has a water contact angle of 80° or more, more preferably 90° or more.

Alternatively, in the case where the brush composition according to the fifth aspect of the present invention contains a resin component having a structural unit of a hydrophilic polymer block (b22), a brush layer formed on a substrate using the brush composition preferably has a water contact angle of from 30 to 80°.

When the value of the contact angle is within the above preferable range, the adhesion of the substrate to the layer containing a block copolymer via the brush layer becomes strong. As a result, the phase-separation performance of the layer containing a block copolymer formed on the brush layer is improved.

The water contact angle is measured in the same manner as in the first aspect.

The brush composition according to the fifth aspect of the present invention described heretofore contains a resin component having a structural unit of a hydrophobic polymer block (b12) or a structural unit of a hydrophilic polymer block (b22), and having at least 2 hydroxy groups on at least one terminal portion of the main chain thereof.

When the brush composition is used as a surface modifier for a substrate which is used for phase-separation of a layer containing a block copolymer formed on the substrate, the adhesion of the substrate to the layer containing a block copolymer via the brush layer formed of the brush composition becomes strong. It is presumed that, in this manner, the phase-separation performance of the block copolymer can be improved.

Further, with respect to the brush composition, since the surface state of the brush layer is stable, there is no need to select a neutral layer material which can obtain a brush layer having a surface free energy of a predetermined value each time, depending on the kind of the block copolymer used. Therefore, the brush composition can be conveniently used.

Sixth Embodiment: Method of Producing a Structure Containing a Phase-Separated Structure A sixth aspect of the present invention is a method of producing a structure containing a phase-separated structure, the method including: a step of applying the brush composition of the fifth aspect to form a brush layer (hereafter, referred to as "step (i")"); a step of forming a layer containing a block copolymer on the brush layer, the block copolymer having a hydrophobic polymer block (b11) and a hydrophilic polymer block (b21) bonded together (hereafter, referred to as "step (ii")"); and a step of phase-separating the layer containing the block copolymer (hereafter, referred to as "step (iii")").

Step (i"), step (ii") and step (iii") are the same as defined for step (i), step (ii) and step (iii), respectively. Further, BCP composition can be prepared in the same manner as in the second aspect.

EXAMPLES

As follows is a description of examples of the present invention, although the scope of the present invention is by no way limited by these examples.

<<First Aspect and Second Aspect>>
<Synthesis Example of Polymeric Compound>
<<Synthesis of Polymeric Compound 3>>

To a dried 50 mL-Schlenk flask was added 180 mg of lithium chloride, 39 g of a low oxygen/low water content grade tetrahydrofuran was added thereto in an argon atmosphere, and cooled to −78° C.

After the cooling, 0.34 g of a 1 M cyclohexane solution of sec-butyl lithium and 0.83 g of a dehydrated/degassed styrene were inserted by a syringe, and reacted for 30 minutes.

Subsequently, as a terminal modifier of the polymeric compound, 0.91 g of a degassed 1,2-butyreneoxide was inserted by a syringe, and reacted for 15 minutes to obtain a reaction liquid.

Then, the reaction liquid was raised to room temperature and concentrated, followed by diluting with 26 g of tert-butylmethylether. Then, the organic phase was washed 3 times with 17 g of a 1 wt % hydrochloric acid, and 4 times with 17 g of ultrapure water.

The organic phase after the washing was concentrated and solidified, so as to obtain 0.62 g of the objective polymeric compound (polymeric compound 3) with a yield of 75%.

The obtained polymeric compound 3 was analyzed by GPC. As a result, it was found that Mn was 1,900, Mw was 2,000, and Mw/Mn was 1.15. As a result of $^{13}$C-NMR analysis, it was found that a peak of quaternary carbon atom having an OH group bonded was observed at 69 to 70 ppm. From the ratio of integration values of the OH groups to the terminals of the initiator (CH$_3$ at 18-20 ppm), the OH introduction ratio to the main polymer terminal portion was found to be 93.8% (0.061/0.065×100=93.8).

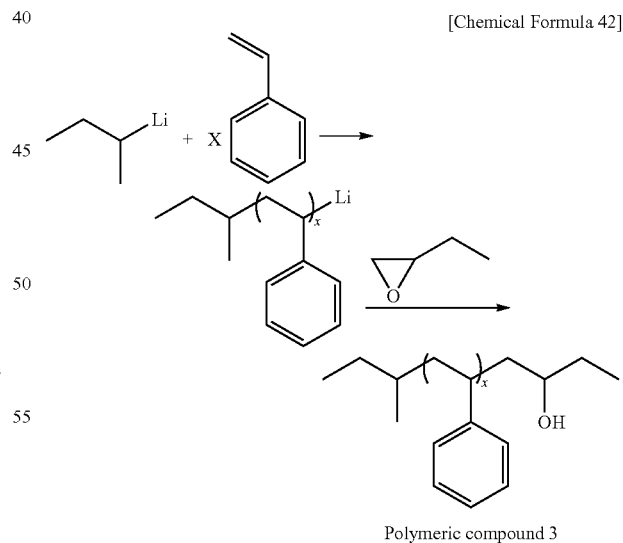

[Chemical Formula 42]

Polymeric compound 3

<<Synthesis of Polymeric Compound 4>>

The same procedure as in Synthesis Example 3 was conducted, except that 0.83 g of styrene was changed to 1.28 g of tert-butylstyrene, so as to obtain 1.14 g of an objective polymeric compound (polymeric compound 4) with a yield of 89%.

The obtained polymer was analyzed by GPC. As a result, it was found that Mn was 2,300, Mw was 2,400, and Mw/Mn was 1.04. As a result of $^{13}$C-NMR analysis, it was found that a peak of quaternary carbon atom having an OH group bonded was observed at 69 to 70 ppm. From the ratio of integration values of the OH groups to the terminals of the initiator (CH$_3$ at 18-20 ppm), the OH introduction ratio to the main polymer terminal portion was found to be 90.8% (0.059/0.065×100=90.8%).

[Chemical Formula 43]

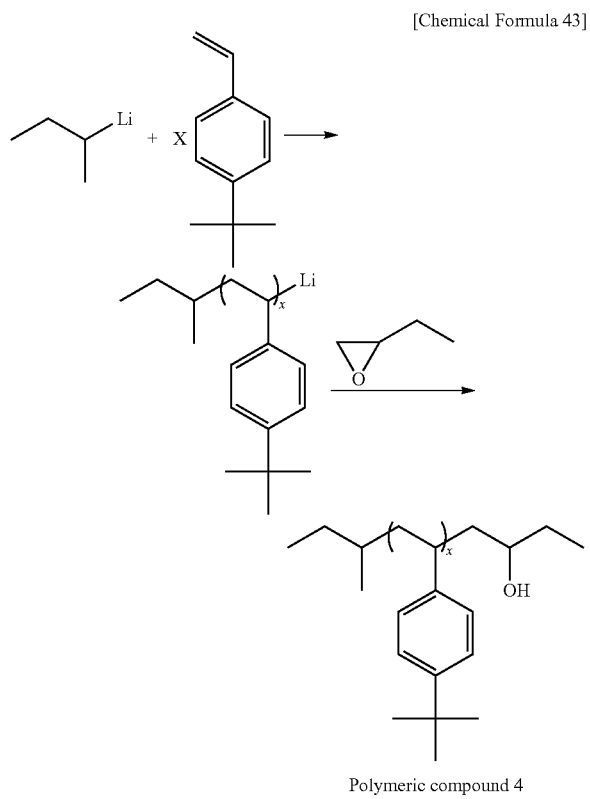

Polymeric compound 4

Preparation of Brush Composition

Examples 1 to 3, Comparative Examples 1 to 3

Polymeric compounds 3 and 4 were synthesized as described above. Further, polymeric compounds 1 and 2 were synthesized by conventional radical polymerization.

Then, each of the polymeric compounds 1 to 4 were dissolved in propylene glycol monomethyl ether acetate (PGMEA), so as to prepare the brush compositions (solid content: 1.20 wt %) of the following examples.

TABLE 1

|  | Resin component (A) |  | Organic solvent (S) |
|---|---|---|---|
| Comparative Example 1 | (A)-1 [100] |  | (S)-1 [8230] |
| Comparative Example 2 | (A)-2 [100] |  | (S)-1 [8230] |
| Comparative Example 3 | (A)-3 [100] |  | (S)-1 [8230] |
| Example 1 | (A)-4 [100] |  | (S)-1 [8230] |

TABLE 1-continued

|  | Resin component (A) |  | Organic solvent (S) |
|---|---|---|---|
| Example 2 | (A)-3 [50] | (A)-4 [50] | (S)-1 [8230] |
| Example 3 | (A)-3 [85] | (A)-4 [15] | (S)-1 [8230] |

In Table 1, the reference characters indicate the following. The values in brackets [ ] indicate the amount (in terms of parts by weight) of the component added.

(A)-1: Polymeric compound 1 shown below. The compositional ratio of the copolymer (the molar ratio of the respective structural units in the polymeric compound) as determined by $^{13}$C-NMR was x/y=93/7; the weight average molecular weight (Mw) determined by the polystyrene equivalent value as measured by GPC was 5,000; and the polydispersity (Mw/Mn) was 1.05.

(A)-2: Polymeric compound 2 shown below. The compositional ratio of the copolymer (the molar ratio of the respective structural units in the polymeric compound) as determined by $^{13}$C-NMR was x/y/z=80/14/6; the weight average molecular weight (Mw) determined by the polystyrene equivalent value as measured by GPC was 5,000; and the polydispersity (Mw/Mn) was 1.05.

(A)-3: The aforementioned polymeric compound 3. The compositional ratio of the copolymer (the molar ratio of the respective structural units in the polymeric compound) as determined by $^{13}$C-NMR was x=100; the weight average molecular weight (Mw) determined by the polystyrene equivalent value as measured by GPC was 2,000; and the polydispersity (Mw/Mn) was 1.15.

(A)-4: The aforementioned polymeric compound 4. The compositional ratio of the copolymer (the molar ratio of the respective structural units in the polymeric compound) as determined by $^{13}$C-NMR was x=100; the weight average molecular weight (Mw) determined by the polystyrene equivalent value as measured by GPC was 2,400; and the polydispersity (Mw/Mn) was 1.04.

(S)-1: propyleneglycol monomethyletheracetate (PGMEA).

[Chemical Formula 44]

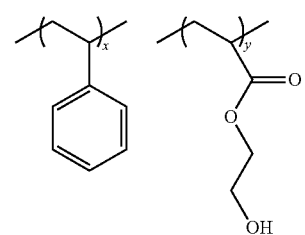

Polymeric compound 1

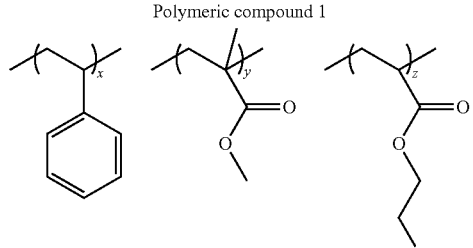

Polymeric compound 2

<Production of Structure Containing Phase-Separated Structure (1)>

[Step (i)]

Each of the brush compositions shown in Table 1 was applied to an 8-inch silicon (Si) wafer using a spinner, followed by baking and drying at a baking temperature and a baking time shown in Table 2, so as to form a brush layer having a film thickness of 40 nm.

The brush layer was rinsed with OK73 thinner (product name; manufactured by Tokyo Ohka Kogyo Co., Ltd.), so as to remove the uncrosslinked portions and the like of the random copolymer. Then, baking was conducted at 250° C. for 60 seconds. After the baking, the brush layer formed on the Si wafer had a film thickness of 2 nm.

[Water Contact Angle on the Surface of the Brush Layer]

A water droplet was dripped onto the surface of the brush layer, and DROP MASTER-700 apparatus (a product name, manufactured by Kyowa Interface Science Co. Ltd.) was used to measure the contact angle (static contact angle) (contact:angle measurement:water 2 μL). The measured value is indicated under "contact angle (°)" in Table 2.

[Step (ii)]

Subsequently, a PGMEA solution of a PS-PMMA block copolymer (PS/PMMA compositional ratio (molar ratio) =55/45; Mw=42,400; Mw/Mn=1.07; period=26 nm) (block copolymer concentration: 2 wt %) was spin-coated (number of rotation: 1,500 rpm; 60 seconds) to cover the brush layer formed on the Si wafer.

Then, the substrate having the PGMEA solution of the PS-PMMA block copolymer coated thereon was baked and dried at 90° C. for 60 seconds, so as to form a PS-PMMA block copolymer layer having a film thickness of 30 nm.

[Step (iii)]

Next, in a nitrogen gas stream, an anneal treatment was conducted by heating at 210° C. for 300 seconds, so as to phase-separate the PS-PMMA block copolymer layer into a phase constituted of PS and a phase constituted of PMMA, thereby forming a phase-separated structure.

As a result, in each of the examples, a structure containing a phase-separated structure was formed on the brush layer. In the case of using the brush compositions of Examples 1 to 3, a perpendicular vertical cylinder pattern was formed. In the case of using the brush compositions of Comparative Examples 1 to 3, a horizontal cylinder pattern was formed.

[Step (iv)]

An oxygen plasma treatment (200 mL/min, 40 Pa, 40° C., 200 W, 20 seconds) was conducted on the silicon (Si) wafer having the phase-separated structure formed thereon using TCA-3822 (manufactured by Tokyo Ohka Kogyo Co., Ltd.), so as to selectively remove the phase constituted of PMMA.

[Evaluation of Phase-Separation Performance]

The surface of the obtained substrate (phase-separation state) was observed with a scanning electron microscope (SEM) (SU8000 manufactured by Hitachi High-Technologies).

As a result of the observation, the case where a perpendicular vertical cylinder pattern was observed was evaluated "A", and the case where a horizontal cylinder pattern was observed was evaluated "C". The results are indicated under "phase-separation performance" in Table 2.

<Production of Structure Containing Phase-Separated Structure (2)>

[Steps (i) to (iii)]

Using the brush compositions of Examples 1 to 3 shown in Table 1, steps (i) to (iii) were conducted in the same manner as in the above <Production of structure containing phase-separated structure (1)>, except that silicon (Si) wafer was changed to a copper (Cu) substrate, and the film thickness of the PS-PMMA block copolymer was changed to 70 nm.

As a result, in each of the examples, a structure containing a phase-separated structure was formed on the brush layer.

In the case of using the brush composition of Example 2, a perpendicular vertical cylinder pattern was formed.

In the case of using the brush compositions of Examples 1 and 3, a pattern in which both a perpendicular vertical cylinder pattern and a horizontal cylinder pattern were present was formed.

[Step (iv)]

An oxygen plasma treatment (200 mL/min, 40 Pa, 40° C., 200 W, 20 seconds) was conducted on the Cu substrate having the phase-separated structure formed thereon using TCA-3822 (manufactured by Tokyo Ohka Kogyo Co., Ltd.), so as to selectively remove the phase constituted of PMMA.

[Evaluation of Phase-Separation Performance]

The surface of the obtained substrate (phase-separation state) was observed with a scanning electron microscope (SEM) (SU8000 manufactured by Hitachi High-Technologies).

As a result of the observation, the case where a perpendicular vertical cylinder pattern was observed was evaluated "A", and the case where both a perpendicular vertical cylinder pattern and a horizontal cylinder pattern were present was evaluated "B". The results are indicated under "phase-separation performance" in Table 2.

<Production of Structure Containing Phase-Separated Structure (3)>

[Steps (i) to (iii)]

Using the brush compositions of Examples 1 to 3 shown in Table 1, steps (i) to (iii) were conducted in the same manner as in the above <Production of structure containing phase-separated structure (1)>, except that silicon (Si) wafer was changed to a silicon dioxide ($SiO_2$) substrate, and the film thickness of the PS-PMMA block copolymer was changed to 30 nm.

As a result, in each of the examples, a structure containing a phase-separated structure was formed on the brush layer. In the case of using the brush compositions of Examples 1 to 3, a perpendicular vertical cylinder pattern was formed.

[Step (iv)]

An oxygen plasma treatment (200 mL/min, 40 Pa, 40° C., 200 W, 20 seconds) was conducted on the $SiO_2$ substrate having the phase-separated structure formed thereon using TCA-3822 (manufactured by Tokyo Ohka Kogyo Co., Ltd.), so as to selectively remove the phase constituted of PMMA.

[Evaluation of Phase-Separation Performance]

The surface of the obtained substrate (phase-separation state) was observed with a scanning electron microscope (SEM) (SU8000 manufactured by Hitachi High-Technologies).

As a result of the observation, the case where a perpendicular vertical cylinder pattern was observed was evaluated "A". The results are indicated under "phase-separation performance" in Table 2.

TABLE 2

| | Production of structure containing phase-separated structure | | | | |
|---|---|---|---|---|---|
| Brush composition | Substrate | Baking temperature (° C.) | Baking time (Seconds) | Contact angle (°) | Phase-separation performance |
| Comparative Example 1 | Si | 210 | 60 | 84.2 | C |
| Comparative Example 2 | | 210 | 60 | 82.5 | C |

TABLE 2-continued

Production of structure containing phase-separated structure

| Brush composition | Sub-strate | Baking temperature (° C.) | Baking time (Seconds) | Contact angle (°) | Phase-separation performance |
|---|---|---|---|---|---|
| Comparative Example 3 | | 230 | 300 | 88.6 | C |
| Example 1 | | 230 | 300 | 96.4 | A |
| Example 2 | | 230 | 300 | 94.5 | A |
| Example 3 | | 230 | 300 | 93.2 | A |
| Example 1 | Cu | 230 | 300 | 94.8 | B |
| Example 2 | | 230 | 300 | 97.0 | A |
| Example 3 | | 230 | 300 | 93.2 | B |
| Example 1 | SiO$_2$ | 230 | 300 | 95.8 | A |
| Example 2 | | 230 | 300 | 94.6 | A |
| Example 3 | | 230 | 300 | 93.9 | A |

From the results shown in Table 2, it was confirmed that, in the cases where the brush compositions of Examples 1 to 3 adopting the present invention were used, the phase-separation performance of the block copolymer can be improved, as compared to the cases where the brush compositions of Comparative Examples 1 to 3 outside the scope of the present invention were used.

In addition, it was confirmed that, the brush compositions of Examples 1 to 3 can be used conveniently, and a substrate provided with a nano structure on the substrate surface can be produced by using phase separation of a block copolymer, wherein the nanostructure is designed more freely with respect to the position and the orientation.

<<Third Aspect and Fourth Aspect>>
<Synthesis Example of Polymeric Compound>
<<Synthesis of Polymeric Compound 3'>>

To a dried 50 mL-Schlenk flask was added 180 mg of lithium chloride, 39 g of a low oxygen/low water content grade tetrahydrofuran was added thereto in an argon atmosphere, and cooled to −78° C.

After the cooling, 0.34 g of a 1 M cyclohexane solution of sec-butyl lithium and 0.83 g of a dehydrated/degassed styrene were inserted by a syringe, and reacted for 30 minutes.

Subsequently, as a terminal modifier of the polymeric compound, 0.25 g of a degassed tert-butyl chloroacetate was inserted by a syringe, and reacted for 15 minutes to obtain a reaction liquid.

Then, the reaction liquid was raised to room temperature and concentrated, followed by diluting with 26 g of tert-butylmethylether. Then, the organic phase was washed 3 times with 17 g of a 1 wt % hydrochloric acid, and 4 times with 17 g of ultrapure water.

The organic phase after the washing was concentrated and solidified, so as to obtain 0.66 g of a precursor of polymeric compound 3' with a yield of 80%.

0.66 g of the precursor of polymeric compound 3' was dissolved in 6 g propylene glycol monomethyl ether (PGME), and 0.52 g of p-toluenesulfonic acid monohydrate, followed by reacting at 40° C. for 10 hours to obtain a reaction liquid.

Subsequently, the reaction liquid was adjusted to room temperature, followed by concentration and diluting with 13 g of dichloromethane. Then, the organic phase was washed 3 times with 13 g of 1 wt % hydrochloric acid and 4 times with 13 g of ultrapure water.

The organic phase after the washing was concentrated and solidified, so as to obtain 0.53 g of the objective polymeric compound (polymeric compound 3') with a yield of 80%.

The obtained polymeric compound 3' was analyzed by GPC. As a result, it was found that Mn was 1.900, Mw was 2,000, and Mw/Mn was 1.05. As a result of $^{13}$C-NMR analysis, it was found that a peak of primary carbon atom having a COOH group bonded was observed at 170 to 172 ppm. From the ratio of integration values of the OH groups to the terminals of the initiator (CH$_3$ at 18-20 ppm), the OH introduction ratio to the main polymer terminal portion was 77.0% (0.035/0.046×100=77.0%).

[Chemical Formula 45]

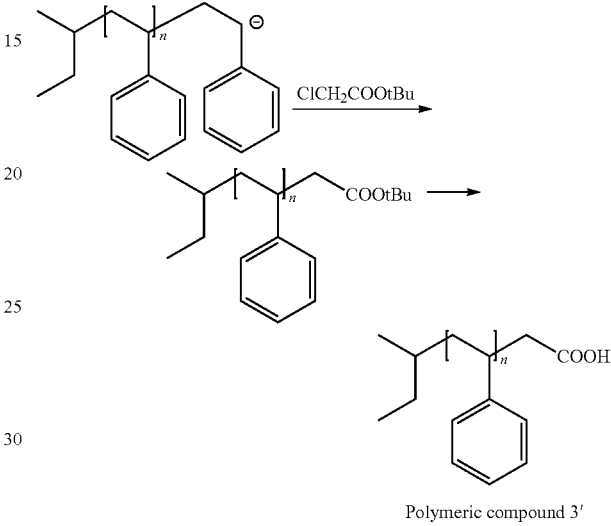

Polymeric compound 3'

<<Synthesis of Polymeric Compound 4'>>

To a dried 50 mL-Schlenk flask was added 180 mg of lithium chloride, 39 g of a low oxygen/low water content grade tetrahydrofuran was added thereto in an argon atmosphere, and cooled to −78° C.

After the cooling, 0.34 g of a 1M cyclohexane solution of sec-butyl lithium and 0.83 g of a dehydrated/degassed styrene were inserted by a syringe, and reacted for 30 minutes.

Subsequently, as a terminal modifier of the polymeric compound, 0.91 g of a degassed 1,2-butyreneoxide was inserted by a syringe, and reacted for 15 minutes to obtain a reaction liquid.

Then, the reaction liquid was raised to room temperature and concentrated, followed by diluting with 26 g of tert-butylmethylether. Then, the organic phase was washed 3 times with 17 g of a 1 wt % hydrochloric acid, and 4 times with 17 g of ultrapure water.

The organic phase after the washing was concentrated and solidified, so as to obtain 0.62 g of the objective polymeric compound (polymeric compound 4') with a yield of 75%.

The obtained polymeric compound 4' was analyzed by GPC. As a result, it was found that Mn was 1,900, Mw was 2,000, and Mw/Mn was 1.15. As a result of $^{13}$C-NMR analysis, it was found that a peak of quaternary carbon atom having an OH group bonded was observed at 69 to 70 ppm. From the ratio of integration values of the OH groups to the terminals of the initiator (CH$_3$ at 18-20 ppm), the OH introduction ratio to the main polymer terminal portion was 93.8% (0.061/0.065×100=93.8%).

[Chemical Formula 46]

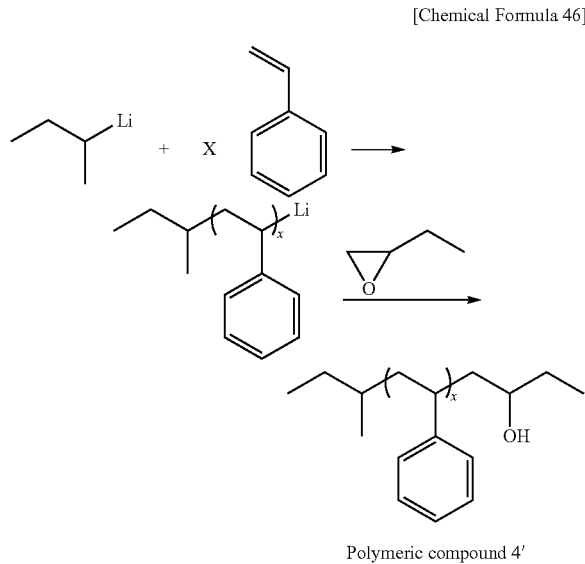

Polymeric compound 4'

Preparation of Brush Composition

Examples 4 to 10, Comparative Examples 4 to 6

Polymeric compounds 3' and 4' were synthesized as described above. Further, polymeric compounds 1' and 2' were synthesized by conventional radical polymerization.

Each of the polymeric compounds 1' to 4' were dissolved in propylene glycol monomethyl ether acetate (PGMEA), so as to prepare the brush compositions (solid content: 1.20 wt %) of the following examples.

TABLE 3

|  | Resin component (A') | Organic solvent (S) |
|---|---|---|
| Example 4 | (A')-3 [100] | (S)-1 [8230] |
| Example 5 | (A')-3 [100] | (S)-1 [8230] |
| Example 6 | (A')-3 [100] | (S)-1 [8230] |
| Example 7 | (A')-3 [100] | (S)-1 [8230] |
| Example 8 | (A')-3 [100] | (S)-1 [8230] |
| Example 9 | (A')-3 [100] | (S)-1 [8230] |
| Example 10 | (A')-3 [100] | (S)-1 [8230] |

TABLE 4

|  | Resin component (A') | Organic solvent (S) |
|---|---|---|
| Comparative Example 4 | (A')-1 [100] | (S)-1 [8230] |
| Comparative Example 5 | (A')-2 [100] | (S)-1 [8230] |
| Comparative Example 6 | (A')-4 [100] | (S)-1 [8230] |

In Tables 3 and 4, the reference characters indicate the following. The values in brackets [ ] indicate the amount (in terms of parts by weight) of the component added.

(A')-1: Polymeric compound 1' shown below. The compositional ratio of the copolymer (the molar ratio of the respective structural units in the polymeric compound) as determined by $^{13}$C-NMR was x/y=93/7; the weight average molecular weight (Mw) determined by the polystyrene equivalent value as measured by GPC was 5,000; and the polydispersity (Mw/Mn) was 1.05.

(A')-2: Polymeric compound 2' shown below. The compositional ratio of the copolymer (the molar ratio of the respective structural units in the polymeric compound) as determined by $^{13}$C-NMR was x/y/z=80/14/6; the weight average molecular weight (Mw) determined by the polystyrene equivalent value as measured by GPC was 5,000; and the polydispersity (Mw/Mn) was 1.05.

(A')-3: Polymeric compound 3' shown below. The compositional ratio of the copolymer (the molar ratio of the respective structural units in the polymeric compound) as determined by $^{13}$C-NMR was n=100; the weight average molecular weight (Mw) determined by the polystyrene equivalent value as measured by GPC was 2,000; and the polydispersity (Mw/Mn) was 1.05.

(A')-4: Polymeric compound 4' shown below. The compositional ratio of the copolymer (the molar ratio of the respective structural units in the polymeric compound) as determined by $^{13}$C-NMR was x=100, the weight average molecular weight (Mw) determined by the polystyrene equivalent value as measured by GPC was 2,000; and the polydispersity (Mw/Mn) was 1.05.

(S)-1: Propyleneglycol monomethyletheracetate (PGMEA).

[Chemical Formula 47]

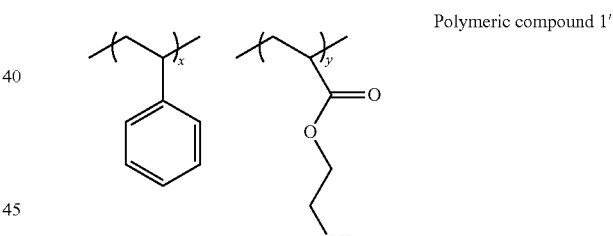

Polymeric compound 1'

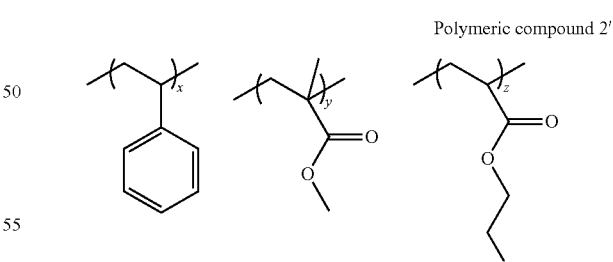

Polymeric compound 2'

[Chemical Formula 48]

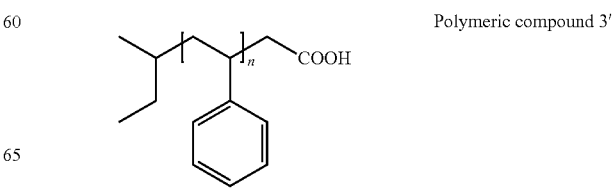

Polymeric compound 3'

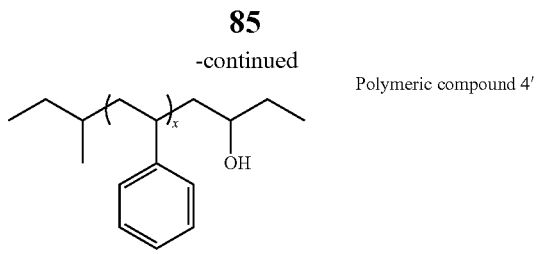

Polymeric compound 4'

<Production of Structure Containing Phase-Separated Structure (3)>

[Step (i')]

Subsequently, each of the brush compositions shown in Tables 3 and 4 was applied to an 8-inch silicon wafer using a spinner, followed by baking and drying at a baking temperature and a baking time shown in Tables 5 and 6, so as to form a brush layer having a film thickness shown in Tables 5 and 6.

The brush layer was rinsed with OK73 thinner (product name; manufactured by Tokyo Ohka Kogyo Co., Ltd.), so as to remove the uncrosslinked portions and the like of the random copolymer. Then, baking was conducted at 250° C. for 60 seconds. After the baking, the brush layer formed on the organic anti-reflection film had a film thickness of 2 nm.

[Water Contact Angle on the Surface of the Brush Layer]

A water droplet was dripped onto the surface of the brush layer, and DROP MASTER-700 apparatus (a product name, manufactured by Kyowa Interface Science Co. Ltd.) was used to measure the contact angle (static contact angle) (contact:angle measurement:water 2 μL). The measured value is indicated under "contact angle (°)" in Tables 5 and 6.

[Step (ii')]

Subsequently, a PGMEA solution of a PS-PMMA block copolymer (PS/PMMA compositional ratio (molar ratio)=55/45; Mw=42,400; Mw/Mn=1.07; period=26 nm) (block copolymer concentration: 2 wt %) was spin-coated (number of rotation: 1,500 rpm; 60 seconds) to cover the brush layer formed on the organic anti-reflection film.

Then, the substrate having the PGMEA solution of the PS-PMMA block copolymer coated thereon was baked and dried at 90° C. for 60 seconds, so as to form a PS-PMMA block copolymer layer having a film thickness of 30 nm.

[Step (iii')]

Next, in a nitrogen gas stream, an anneal treatment was conducted by heating at 210° C. for 300 seconds, so as to phase-separate the PS-PMMA block copolymer layer into a phase constituted of PS and a phase constituted of PMMA, thereby forming a phase-separated structure.

As a result, in each of the examples, a structure containing a phase-separated structure was formed on the brush layer. In the case of using the brush compositions of Examples 4 to 10, a pattern in which both a perpendicular vertical cylinder pattern and a horizontal cylinder pattern were present was formed. In the case of using the brush compositions of Comparative Examples 3 to 6, a perpendicular vertical cylinder pattern was formed.

[Step (iv')]

An oxygen plasma treatment (200 mL/min, 40 Pa, 40° C., 200 W, 20 seconds) was conducted on the silicon (Si) wafer having the phase-separated structure formed thereon using TCA-3822 (manufactured by Tokyo Ohka Kogyo Co., Ltd.), so as to selectively remove the phase constituted of PMMA.

[Evaluation of Phase-Separation Performance]

The surface of the obtained substrate (phase-separation state) was observed with a scanning electron microscope (SEM) (SU8000 manufactured by Hitachi High-Technologies).

As a result of the observation, the case where a pattern in which both a perpendicular vertical cylinder pattern and a horizontal cylinder pattern were present was observed was evaluated "A", and the case where a perpendicular vertical cylinder pattern was observed was evaluated "B". The results are indicated under "phase-separation performance" in Tables 5 and 6.

In the present specification, formation of a horizontal cylinder pattern indicates that the brush composition has a higher affinity for the hydrophobic polymer block.

TABLE 5

| | Baking temperature (° C.) | Baking time (Seconds) | Film thickness (nm) | Contact angle (°) | Phase-separation performance |
|---|---|---|---|---|---|
| Example 4 | 180 | 300 | 3.5 | 92.3 | A |
| Example 5 | 210 | 60 | 3.5 | 92.1 | A |
| Example 6 | 210 | 300 | 3.5 | 91.1 | A |
| Example 7 | 250 | 60 | 3.5 | 91.8 | A |
| Example 8 | 250 | 300 | 3.5 | 91.6 | A |
| Example 9 | 280 | 60 | 3.5 | 91.4 | A |
| Example 10 | 280 | 300 | 3.5 | 92.2 | A |

TABLE 6

| | Baking temperature (° C.) | Baking time (Seconds) | Film thickness (nm) | Contact angle (°) | Phase-separation performance |
|---|---|---|---|---|---|
| Comparative Example 4 | 210 | 60 | 2 | 84.2 | B |
| Comparative Example 5 | 210 | 60 | 2 | 82.5 | B |
| Comparative Example 6 | 230 | 300 | 2 | 88.6 | B |

From the results shown in Tables 5 and 6, it was confirmed that, in the cases where the brush compositions of Examples 4 to 10 adopting the present invention were used, the phase-separation performance of the block copolymer can be improved, as compared to the cases where the brush compositions of Comparative Examples 4 to 6 outside the scope of the present invention were used.

In addition, with respect to the brush compositions of Examples 4 to 10, it was confirmed that, in the production of a structure containing a phase-separated structure, the water contact angle is large, and horizontal cylinder pattern was formed. Therefore, it was confirmed that the brush compositions of Examples 4 to 10 has a higher affinity for the hydrophobic polymer block.

In the present examples, the phase-separation performance is tested in the case where the brush composition of the present invention is applied to a substrate, and a block copolymer is applied to the brush composition. The aim of the test is to test the affinity for the block copolymer, and by no means limit other applications of the brush composition. For example, even in the case where the brush composition of the present invention is applied to a substrate to form a brush layer, and a guide pattern is formed on the brush layer using a resist composition or the like, it is considered that the phase-separation performance can be improved as compared to the cases where the brush compositions of Comparative Examples 4 to 6 outside the scope of the present invention are used.

<<Fifth Aspect and Sixth Aspect>>
<Synthesis Example of Polymeric Compound>
<<Synthesis of Polymeric Compound 3">>

To a dried 300 mL-Schlenk flask was added 208 mg of lithium chloride, 196 g of a low oxygen/low water content grade tetrahydrofuran was added thereto in an argon atmosphere, and cooled to −78° C.

After the cooling, 1.77 g of a 1M cyclohexane solution of sec-butyl lithium and 4.00 g of a dehydrated/degassed styrene were inserted by a syringe, and reacted for 30 minutes.

Subsequently, as a terminal modifier of the polymeric compound, 1.11 g of a degassed 4-chloromethyl-2,2-dimethyl-1,3-dioxolane was inserted by a syringe, followed by heating to −20° C. and reacting for 1 hour to obtain a reaction liquid.

Then, the reaction liquid was raised to room temperature and concentrated, followed by diluting with 40 g of tert-butylmethylether, and washing the organic phase once with 60 g of ultrapure water. 800 g of methanol was dropwise added to the organic phase, followed by filtering the precipitated solid and drying, thereby obtaining a precursor of 3.20 g of polymeric compound 3" with a yield of 80%.

3.20 g of the precursor of polymeric compound 3" was dissolved in 30 g propylene glycol monomethyl ether (PGME), and 2.50 g of p-toluenesulfonic acid monohydrate, followed by reacting at 40° C. for 10 hours to obtain a reaction liquid.

Subsequently, the reaction liquid was adjusted to room temperature, followed by concentration and diluting with 62 g of dichloromethane. Then, the organic phase was washed 3 times with 70 g of 1 wt % hydrochloric acid and 4 times with 70 g of ultrapure water.

The organic phase after the washing was concentrated and solidified, so as to obtain 2.58 g of the objective polymeric compound (polymeric compound 3") with a yield of 81%.

The obtained polymeric compound 3" was analyzed by GPC. As a result, it was found that Mn was 2,500, Mw was 2,900, and Mw/Mn was 1.14. As a result of $^{13}$C-NMR analysis, it was found that peaks of primary and secondary carbon atoms having an OH group bonded was observed at 67 to 71 ppm. From the ratio of integration values of primary and secondary carbon atoms having an OH group bonded thereto to the terminals of the initiator ($CH_3$ at 18-20 ppm), the diol introduction ratio to the main polymer terminal portion was 74% (0.037/0.050×100=74%).

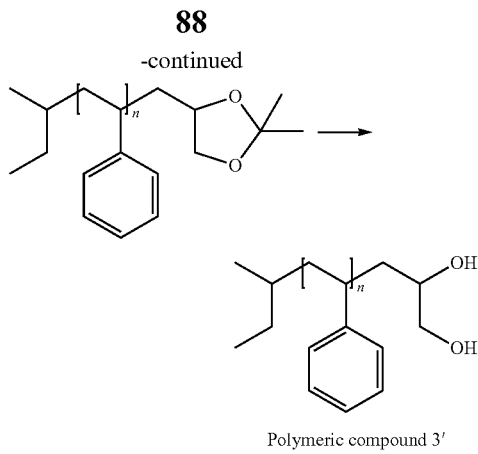

Polymeric compound 3'

<<Synthesis of Polymeric Compound 4">>

To a dried 50 mL-Schlenk flask was added 180 mg of lithium chloride, 39 g of a low oxygen/low water content grade tetrahydrofuran was added thereto in an argon atmosphere, and cooled to −78° C.

After the cooling, 0.34 g of a 1M cyclohexane solution of sec-butyl lithium and 0.83 g of a dehydrated/degassed styrene were inserted by a syringe, and reacted for 30 minutes.

Subsequently, as a terminal modifier of the polymeric compound, 0.91 g of a degassed 1,2-butyreneoxide was inserted by a syringe, and reacted for 15 minutes to obtain a reaction liquid.

Then, the reaction liquid was raised to room temperature and concentrated, followed by diluting with 26 g of tert-butylmethylether. Then, the organic phase was washed 3 times with 17 g of a 1 wt % hydrochloric acid, and 4 times with 17 g of ultrapure water.

The organic phase after the washing was concentrated and solidified, so as to obtain 0.62 g of the objective polymeric compound (polymeric compound 4") with a yield of 75%.

The obtained polymeric compound 4" was analyzed by GPC. As a result, it was found that Mn was 1,900, Mw was 2,000, and Mw/Mn was 1.15. As a result of $^{13}$C-NMR analysis, it was found that a peak of quaternary carbon atom having an OH group bonded was observed at 69 to 70 ppm. From the ratio of integration values of the OH groups to the terminals of the initiator ($CH_3$ at 18-20 ppm), the OH introduction ratio to the main polymer terminal portion was 93.8% (0.061/0.065×100=93.8%).

[Chemical Formula 49]

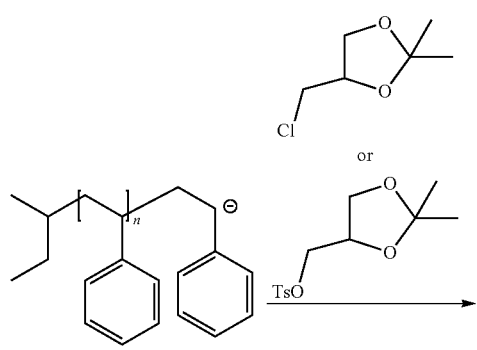

[Chemical Formula 50]

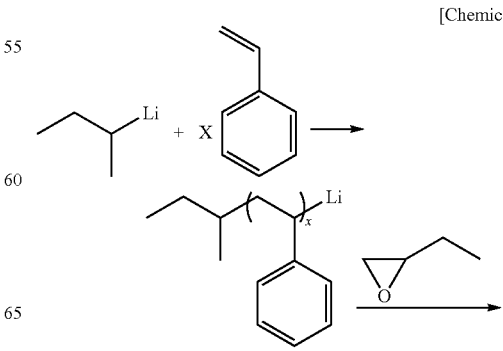

-continued

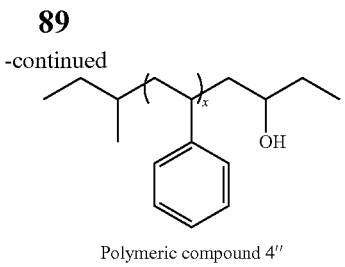

Polymeric compound 4″

Preparation of Brush Composition

Examples 11 to 19, Comparative Examples 7 to 9

Polymeric compounds 3″ and 4″ were synthesized as described above. Further, polymeric compounds 1″ and 2″ were synthesized by conventional radical polymerization.

Then, each of the polymeric compounds 1″ to 4″ were dissolved in propylene glycol monomethyl ether acetate (PGMEA), so as to prepare the brush compositions (solid content: 1.2 wt %) of the following examples.

TABLE 7

|  | Resin component (A″) | Organic solvent (S) |
|---|---|---|
| Example 11 | (A″)-3 [100] | (S)-1 [8230] |
| Example 12 | (A″)-3 [100] | (S)-1 [8230] |
| Example 13 | (A″)-3 [100] | (S)-1 [8230] |
| Example 14 | (A″)-3 [100] | (S)-1 [8230] |
| Example 15 | (A″)-3 [100] | (S)-1 [8230] |
| Example 16 | (A″)-3 [100] | (S)-1 [8230] |
| Example 17 | (A″)-3 [100] | (S)-1 [8230] |
| Example 18 | (A″)-3 [100] | (S)-1 [8230] |
| Example 19 | (A″)-3 [100] | (S)-1 [8230] |

TABLE 8

|  | Resin component (A″) | Organic solvent (S) |
|---|---|---|
| Comparative Example 7 | (A″)-1 [100] | (S)-1 [8230] |
| Comparative Example 8 | (A″)-2 [100] | (S)-1 [8230] |
| Comparative Example 9 | (A″)-4 [100] | (S)-1 [8230] |

In Tables 7 and 8, the reference characters indicate the following. The values in brackets [ ] indicate the amount (in terms of parts by weight) of the component added.

(A″)-1: Polymeric compound 1″ shown below. The compositional ratio of the copolymer (the molar ratio of the respective structural units in the polymeric compound) as determined by $^{13}$C-NMR was x/y=93/7; the weight average molecular weight (Mw) determined by the polystyrene equivalent value as measured by GPC was 5,000; and the polydispersity (Mw/Mn) was 1.05.

(A″)-2: Polymeric compound 2″ shown below. The compositional ratio of the copolymer (the molar ratio of the respective structural units in the polymeric compound) as determined by $^{13}$C-NMR was x/y/z=80/14/6 the weight average molecular weight (Mw) determined by the polystyrene equivalent value as measured by GPC was 5,000; and the polydispersity (Mw/Mn) was 1.05.

(A″)-3: Polymeric compound 3 shown below. The compositional ratio of the copolymer (the molar ratio of the respective structural units in the polymeric compound) as determined by $^{13}$C-NMR was n=100; the weight average molecular weight (Mw) determined by the polystyrene equivalent value as measured by GPC was 2.000; and the polydispersity (Mw/Mn) was 1.05.

(A″)-4: Polymeric compound 4 shown below. The compositional ratio of the copolymer (the molar ratio of the respective structural units in the polymeric compound) as determined by $^{13}$C-NMR was x=100; the weight average molecular weight (Mw) determined by the polystyrene equivalent value as measured by GPC was 2,000; and the polydispersity (Mw/Mn) was 1.05.

(S)-1: propyleneglycol monomethyletheracetate (PGMEA).

[Chemical Formula 51]

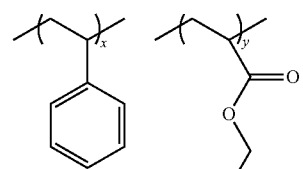

Polymeric compound 1″

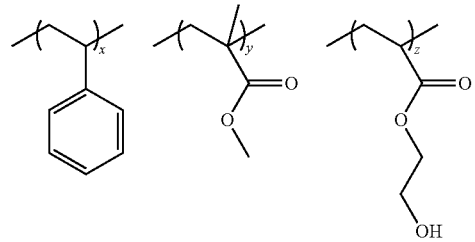

Polymeric compound 2″

[Chemical Formula 52]

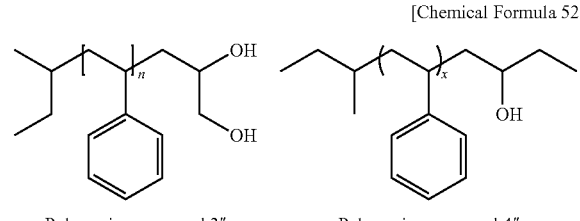

Polymeric compound 3″          Polymeric compound 4″

<Production of Structure Containing Phase-Separated Structure (4)>

[Step (i″)]

Subsequently, each of the brush compositions shown in Tables 7 and 8 was applied to an 8-inch silicon wafer using a spinner, followed by baking and drying at a baking temperature and a baking time shown in Tables 9 and 10, so as to form a brush layer having a film thickness shown in Tables 9 and 10.

The brush layer was rinsed with OK73 thinner (product name; manufactured by Tokyo Ohka Kogyo Co., Ltd.), so as to remove the uncrosslinked portions and the like of the random copolymer. Then, baking was conducted at 250° C.

for 60 seconds. After the baking, the brush layer formed on the organic anti-reflection film had a film thickness of 2 nm.

[Water Contact Angle on the Surface of the Brush Layer]

A water droplet was dripped onto the surface of the brush layer, and DROP MASTER-700 apparatus (a product name, manufactured by Kyowa Interface Science Co. Ltd.) was used to measure the contact angle (static contact angle) (contact:angle measurement:water 2 μL). The measured value is indicated under "contact angle (°)" in Tables 9 and 10.

[Step (ii")]

Subsequently, a PGMEA solution of a PS-PMMA block copolymer (PS/PMMA compositional ratio (molar ratio)=55/45; Mw=42,400; Mw/Mn=1.07; period=26 nm) (block copolymer concentration: 2 wt %) was spin-coated (number of rotation: 1,500 rpm; 60 seconds) to cover the brush layer formed on the organic anti-reflection film.

Then, the substrate having the PGMEA solution of the PS-PMMA block copolymer coated thereon was baked and dried at 90° C. for 60 seconds, so as to form a PS-PMMA block copolymer layer having a film thickness of 30 nm.

[Step (iii")]

Next, in a nitrogen gas stream, an anneal treatment was conducted by heating at 210° C. for 300 seconds, so as to phase-separate the PS-PMMA block copolymer layer into a phase constituted of PS and a phase constituted of PMMA, thereby forming a phase-separated structure.

As a result, in each of the examples, a structure containing a phase-separated structure was formed on the brush layer. In the case of using the brush compositions of Examples 11 to 19, a pattern in which both a perpendicular vertical cylinder pattern and a horizontal cylinder pattern were present was formed. In the case of using the brush compositions of Comparative Examples 7 to 9, a perpendicular vertical cylinder pattern was formed.

[Step (iv")]

An oxygen plasma treatment (200 mL/min, 40 Pa, 40° C., 200 W, 20 seconds) was conducted on the silicon (Si) wafer having the phase-separated structure formed thereon using TCA-3822 (manufactured by Tokyo Ohka Kogyo Co., Ltd.), so as to selectively remove the phase constituted of PMMA.

[Evaluation of Phase-Separation Performance]

The surface of the obtained substrate (phase-separation state) was observed with a scanning electron microscope (SEM) (SU8000 manufactured by Hitachi High-Technologies).

As a result of the observation, the case where a pattern in which both a perpendicular vertical cylinder pattern and a horizontal cylinder pattern were present was observed was evaluated "A", and the case where a perpendicular vertical cylinder pattern was observed was evaluated "B". The results are indicated under "phase-separation performance" in Tables 9 and 10.

In the present specification, formation of a horizontal cylinder pattern indicates that the brush composition has a higher affinity for the hydrophobic polymer block.

TABLE 9

| | Baking temperature (° C.) | Baking time (Seconds) | Film thickness (nm) | Contact angle (°) | Phase-separation performance |
|---|---|---|---|---|---|
| Example 11 | 150 | 300 | 3.5 | 91.8 | A |
| Example 12 | 180 | 60 | 3.5 | 92.3 | A |

TABLE 9-continued

| | Baking temperature (° C.) | Baking time (Seconds) | Film thickness (nm) | Contact angle (°) | Phase-separation performance |
|---|---|---|---|---|---|
| Example 13 | 180 | 300 | 3.5 | 91.6 | A |
| Example 14 | 210 | 60 | 3.5 | 91.9 | A |
| Example 15 | 210 | 300 | 3.5 | 92.1 | A |
| Example 16 | 250 | 60 | 3.5 | 91.6 | A |
| Example 17 | 250 | 300 | 3.5 | 91.0 | A |
| Example 18 | 280 | 60 | 3.5 | 91.5 | A |
| Example 19 | 280 | 300 | 3.5 | 92.3 | A |

TABLE 10

| | Baking temperature (° C.) | Baking time (Seconds) | Film thickness (nm) | Contact angle (°) | Phase-separation performance |
|---|---|---|---|---|---|
| Comparative Example 7 | 210 | 60 | 2 | 84.2 | B |
| Comparative Example 8 | 210 | 60 | 2 | 82.5 | B |
| Comparative Example 9 | 230 | 300 | 2 | 88.6 | B |

From the results shown in Tables 9 and 10, it was confirmed that, in the cases where the brush compositions of Examples 11 to 19 adopting the present invention were used, the phase-separation performance of the block copolymer can be improved, as compared to the cases where the brush compositions of Comparative Examples 7 to 9 outside the scope of the present invention were used.

In addition, with respect to the brush compositions of Examples 11 to 19, it was confirmed that, in the production of a structure containing a phase-separated structure, the water contact angle is large, and horizontal cylinder pattern was formed. Therefore, it was confirmed that the brush compositions of Examples 11 to 19 has a higher affinity for the hydrophobic polymer block.

In the present examples, the phase-separation performance is tested in the case where the brush composition of the present invention is applied to a substrate, and a block copolymer is applied to the brush composition. The aim of the test is to test the affinity for the block copolymer, and by no means limit other applications of the brush composition. For example, even in the case where the brush composition of the present invention is applied to a substrate to form a brush layer, and a guide pattern is formed on the brush layer using a resist composition or the like, it is considered that the phase-separation performance can be improved as compared to the cases where the brush compositions of Comparative Examples 7 to 9 outside the scope of the present invention are used.

While preferred embodiments of the invention have been described and illustrated above, it should be understood that these are exemplary of the invention and are not to be considered as limiting. Additions, omissions, substitutions,

What is claimed is:

1. A method of producing a structure containing a phase-separated structure, the method comprising:
applying a brush composition to a substrate to form a brush layer;
forming a layer containing a block copolymer on the brush layer; and
phase-separating the layer containing the block copolymer,
the brush composition comprising a resin component, the resin component having a structural unit (u1) represented by general formula (u1-1) shown below, and having a hydroxy group on at least one terminal portion of the main chain thereof:

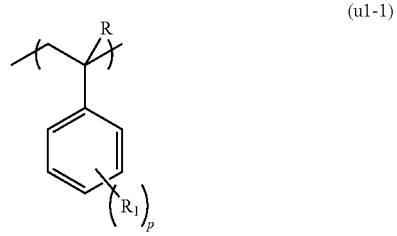

(u1-1)

wherein R represents a hydrogen atom, an alkyl group of 1 to 5 carbon atoms or a halogenated alkyl group of 1 to 5 carbon atoms; $R^1$ represents a halogen atom, or a linear, branched or cyclic hydrocarbon group of 1 to 20 carbon atoms optionally containing an oxygen atom, a halogen atom or a silicon atom, or a combination of the linear, branched or cyclic hydrocarbon group; and p represents an integer of 1 to 5.

2. The method according to claim 1, wherein, in general formula (u1-1), $R^1$ represents an alkyl group of 1 to 6 carbon atoms, a halogenated alkyl group of 1 to 6 carbon atoms or an alkoxy group of 1 to 6 carbon atoms.

3. The method according to claim 1, wherein the resin component comprises a polymeric compound having the structural unit (u1), and having a hydroxy group on at least one terminal portion of the main chain thereof.

4. A method of producing a structure containing a phase-separated structure, the method comprising:
applying a brush composition to a substrate to form a brush layer;
forming a layer containing a block copolymer on the brush layer, the block copolymer having a hydrophobic polymer block (b11) and a hydrophilic polymer block (b21) bonded together; and
phase-separating the layer containing the block copolymer,
the brush composition comprising a resin component, the resin component having a structural unit of a hydrophobic polymer block (b12) or a structural unit of a hydrophilic polymer block (b22), and having a carboxy group on at least one terminal portion of the main chain thereof.

5. The method according to claim 4, wherein the structural unit of the hydrophobic polymer block (b12) comprises a structural unit (u1') containing a styrene skeleton optionally having a substituent.

6. The method according to claim 5, wherein the resin component comprises a polymeric compound having the structural unit (u1'), and having a carboxy group on at least one terminal portion of the main chain thereof.

7. The method according to claim 4, wherein the structural unit of the hydrophilic polymer block (b22) comprises a structural unit (u2') derived from an acrylate ester optionally having the hydrogen atom bonded to the carbon atom on the α-position substituted with a substituent.

8. The method according to claim 7, wherein the resin component comprises a polymeric compound having the structural unit (u2'), and having a carboxy group on at least one terminal portion of the main chain thereof.

9. The method according to claim 4, wherein forming a brush layer comprises baking the substrate having the brush composition applied thereto at a temperature of 210° C. or higher for 60 seconds or more.

10. A method of producing a structure containing a phase-separated structure, the method comprising:
applying a brush composition to a substrate to form a brush layer;
forming a layer containing a block copolymer on the brush layer; and
phase-separating the layer containing the block copolymer,
the block copolymer having a hydrophobic polymer block (b11) and a hydrophilic polymer block (b21) bonded together,
the brush composition comprising a resin component, the resin component having a structural unit of a hydrophobic polymer block (b12) or a structural unit of a hydrophilic polymer block (b22), and having at least 2 hydroxy groups on at least one terminal portion of the main chain thereof.

11. The method according to claim 10, wherein the structural unit of the hydrophobic polymer block (b12) comprises a structural unit (u1') containing a styrene skeleton optionally having a substituent.

12. The method according to claim 11, wherein the structural unit of the hydrophilic polymer block (b22) comprises a structural unit (u2") derived from an acrylate ester optionally having the hydrogen atom bonded to the carbon atom on the α-position substituted with a substituent.

13. The method according to claim 12, wherein the resin component comprises a polymeric compound having the structural unit (u2'), and having at least 2 hydroxy groups on at least one terminal portion of the main chain thereof.

14. The method according to claim 10, wherein the resin component comprises a polymeric compound having the structural unit (u1'), and having at least 2 hydroxy groups on at least one terminal portion of the main chain thereof.

15. The method according to claim 10, wherein forming a brush layer comprises baking the substrate having the brush composition applied thereto at a temperature of 160° C. or higher for 60 seconds or more.

16. The method according to claim 10, wherein forming a brush layer comprises baking the substrate having the brush composition applied thereto at a temperature of 170° C. or higher.

* * * * *